(12) United States Patent
Wakamoto et al.

(10) Patent No.: US 6,277,533 B1
(45) Date of Patent: Aug. 21, 2001

(54) SCANNING EXPOSURE METHOD

(75) Inventors: Shinji Wakamoto, Tokyo; Yuji Imai, Saitama-ken; Kazuaki Suzuki, Kanagawa-ken, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/599,493

(22) Filed: Jun. 22, 2000

Related U.S. Application Data

(60) Division of application No. 08/647,325, filed on May 9, 1996, now Pat. No. 6,118,515, which is a continuation-in-part of application No. 08/350,619, filed on Dec. 7, 1994, now abandoned.

(30) Foreign Application Priority Data

| Dec. 8, 1993 | (JP) | 5-307750 |
| May 18, 1994 | (JP) | 6-103848 |
| Aug. 26, 1994 | (JP) | 6-201947 |
| May 12, 1995 | (JP) | 7-114196 |

(51) Int. Cl.[7] .................................................. G03F 9/00
(52) U.S. Cl. ............................................ 430/30; 355/77
(58) Field of Search ................................ 355/77; 430/30

(56) References Cited

U.S. PATENT DOCUMENTS

| 4,488,806 | 12/1984 | Takahashi et al. ............... 355/77 |
| 4,874,954 | 10/1989 | Takahashi et al. ............... 250/548 |
| 5,117,255 | 5/1992 | Shiraishi et al. ................. 355/53 |
| 5,194,893 | 3/1993 | Nishi ................................ 355/53 |
| 5,473,410 | 12/1995 | Nishi ................................ 355/53 |

FOREIGN PATENT DOCUMENTS

| 56-111218 | 9/1981 | (JP) . |
| 4-196513 | 7/1992 | (JP) . |

OTHER PUBLICATIONS

SPIE vol. 922, Optical/Laser Microlithography, 1988, "The Paths to Subhalf–Micrometer Optical Lithography", B. J. Lin, pp. 256–269.

*Primary Examiner*—Christopher G. Young
(74) *Attorney, Agent, or Firm*—Oliff & Berridge PLC

(57) ABSTRACT

In exposure by a scanning exposure system, when the pattern of a reticle is exposed onto shot areas on a wafer while reading ahead to detect the focus positions at read-ahead regions before an exposure region 16, 116 with respect to the scanning direction, (1) for each of shot areas S10, S1–S4, S5, S23, S28, S29–S32 on the peripheral region of the wafer 15, the exposure is performed by scanning the wafer 15 so that a slit-like exposure region 16 moves relatively from the inside to the outside of the wafer 15; or, (2) when the absolute value of the difference between the focus position at the read-ahead region 135 and the focus position of an imaging plane 139 in the exposure region exceeds an allowable value, the height of the wafer 15 is fixed at the height set until then while ignoring the read-ahead data.

83 Claims, 19 Drawing Sheets

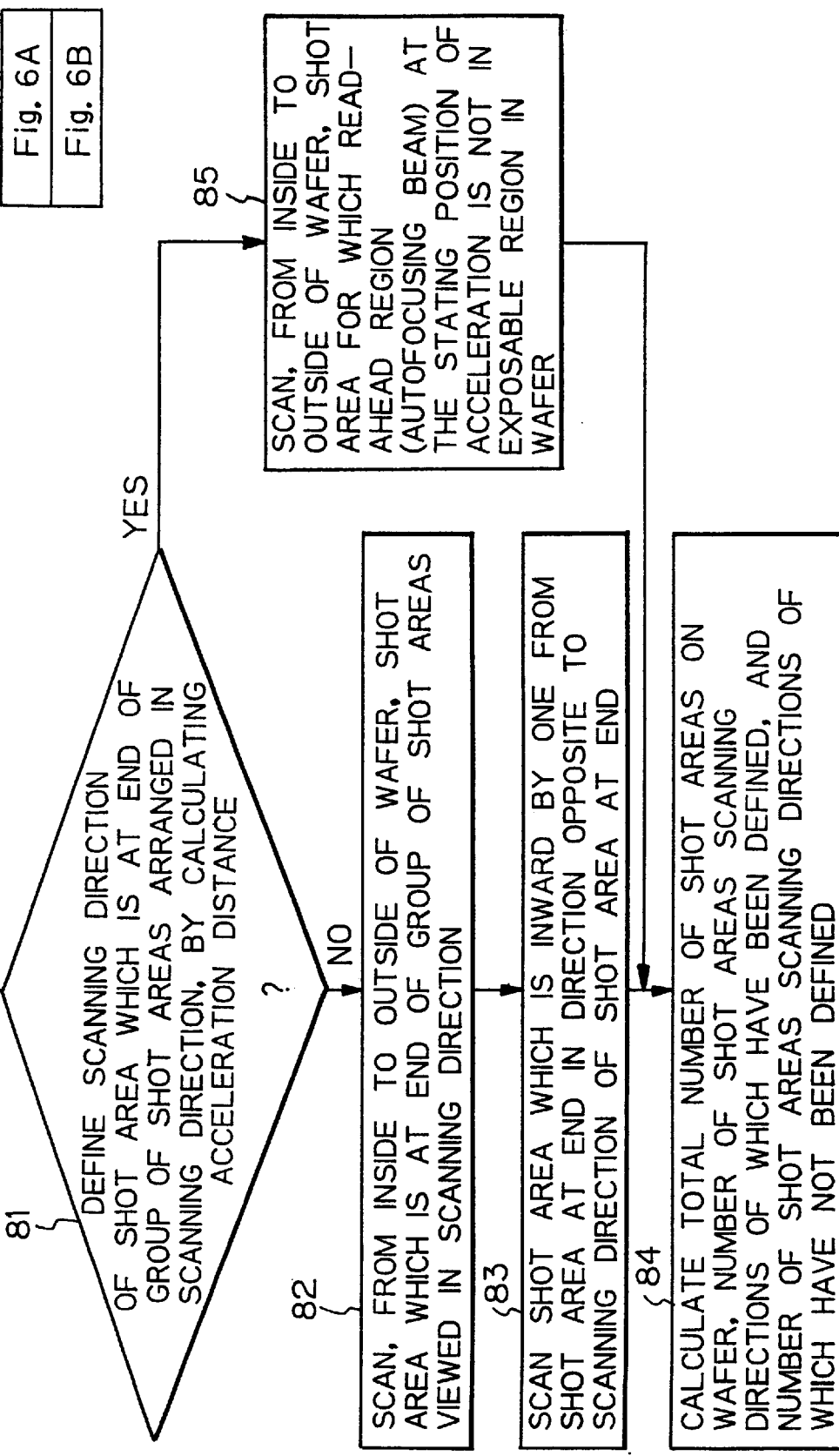

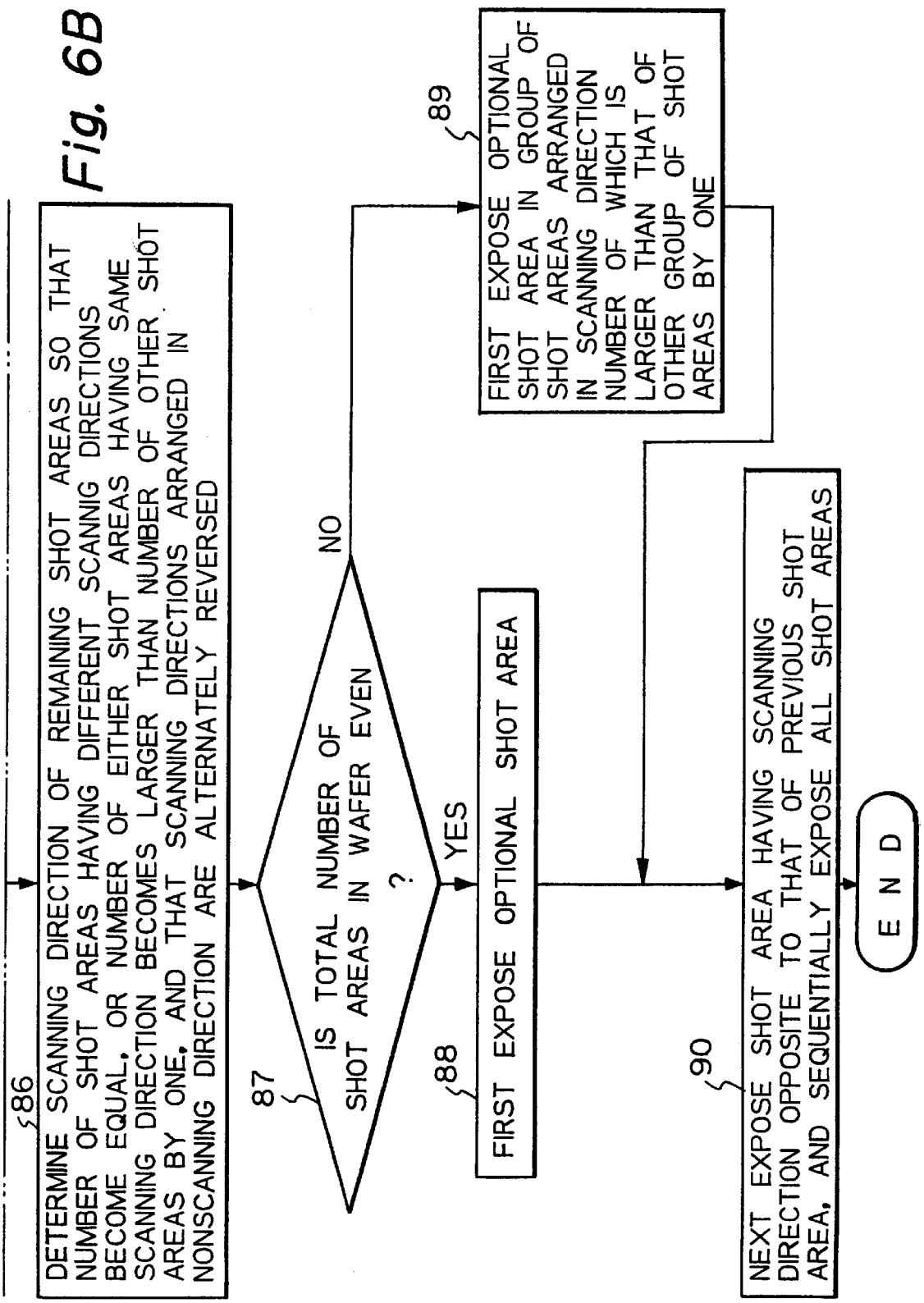

Fig. 25
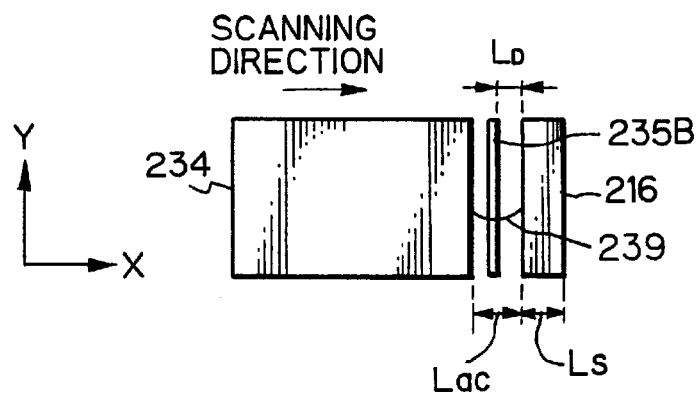
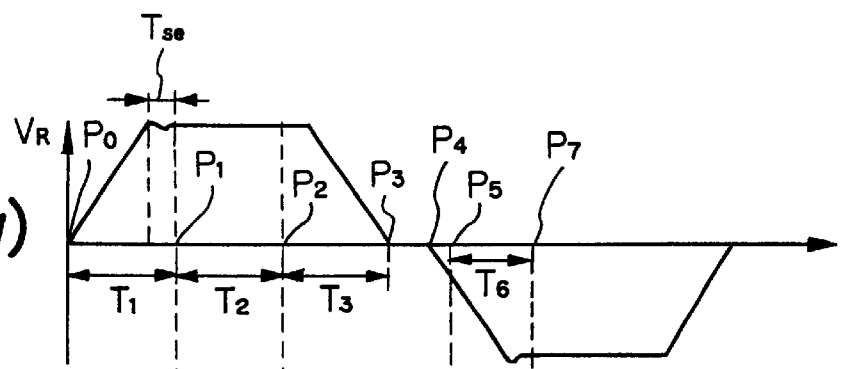
Fig. 26(a)
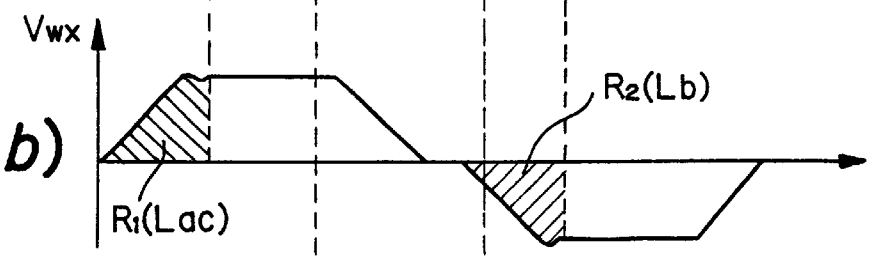
Fig. 26(b)
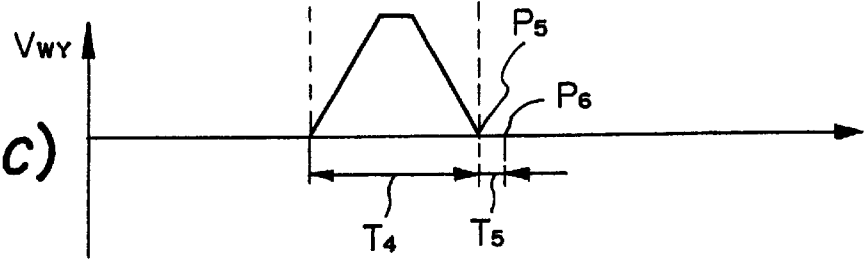
Fig. 26(c)

SCANNING EXPOSURE METHOD

This application is a division of prior application Ser. No. 08/647,325 filed May 9, 1996, U.S. Pat. No. 6,118,515, which is a C-I-P of Ser. No. 08/350,619, abandoned filed Dec. 7, 1994.

BACKGROUND OF THE INVENTION

1. Field of the Invention

This invention relates to a scanning exposure method which sequentially exposes a mask pattern on a photosensitive substrate with, for example, a slit scanning or a step-and-scan type apparatus, and, more particularly, to one suitable when applied to a case where exposure is performed by a scanning exposure in autofocusing and autoleveling.

2. Related Prior Arts

In manufacturing a semiconductor device, a liquid crystal display element, a charge-coupled device (CCD), or a thin film magnetic disk with a photolithography technique, a projection exposure apparatus has been used which transfers a pattern on a reticle (or photomask, etc.) onto a wafer (or glass plate, etc.) to which a photosensitive agent is applied. A conventional projection exposure apparatus frequently used is a reduction projection exposure apparatus of a step-and-repeat type (stepper) which sequentially moves each shot area on a wafer to an exposure field of an optical projection system, and exposes reticle pattern images onto each shot area in a ground.

Such a stepper projection exposure apparatus is provided with an autofocusing mechanism and an autoleveling mechanism, both of which align each shot area on the wafer with the imaging plane of the optical projection system. These autofocusing and autoleveling mechanisms measure a focus position (or inclination) at a predetermined measurement point (or measurement area) in an exposure field of the optical projection system and correct the focus position (or inclination) of the wafer by, for example, a servo system based on the measurement result. In this case, because the wafer stands still during the exposure, there no particular inconvenience is caused even if the autofocusing and autoleveling mechanisms have a low response speed.

However, because patterns have become finer and finer for recent semiconductor devices and the like, it is necessary to increase the resolution of optical projection systems. Approaches for enhancing resolution include shortening the wavelength of the exposure light and increasing the numerical aperture of the optical projection system. In either case, if it is desired to secure an exposure field similar to the prior art, it becomes more and more difficult to maintain the imaging performance (distortion, curvature of field, etc.) at a predetermined accuracy over all of the exposure field. Thus, it is desired to use a projection exposure apparatus of a scanning exposure type apparatus such as a so-called slit scanning system or step-and-scan type system (hereinafter called a "scanning exposure type system").

This projection exposure apparatus of a scanning exposure type exposes the pattern of a reticle onto a wafer while scanning the wafer and the reticle in relative synchronization with respect to a radiation region such as a rectangle, an arc, or a plurality of trapezoids having a two-dimensional form (hereinafter called a "slit-shaped illumination region"). Therefore, in a case where a pattern with the same area as that of the stepper type is exposed onto the wafer, the scanning exposure type apparatus can reduce the illumination region of the optical projection system when compared with the stepper type apparatus so that it is possible to obtain improved imaging performance in the illumination region.

In addition, conventionally, the reticle is six inches in size, and the mainstream of projection magnification by the optical projection system is ⅕ times. However, as the area of the circuit pattern for a semiconductor device and the like becomes larger and larger, a reticle six inches in size becomes insufficient under the magnification ratio of ⅕. Thus, it becomes necessary to design a projection exposure apparatus having an optical projection system with changed magnification such as ¼ times. The scanning exposure type is also advantageous in fulfilling such an increased area of the transferred pattern.

Even such a scanning projection exposure apparatus, however, requires a mechanism which aligns each shot area with the imaging plane during exposure. However, even if, in the scanning exposure type, similar to the stepper type, the focus position (inclination) on the wafer is measured in an actual exposure region and correction is performed based on the result of measurement, there is a disadvantage in that it is difficult to align the actual exposure region with the imaging plane because the wafer is being scanned, and the response of the autofocusing mechanism (or autoleveling mechanism) is at a predetermined value.

A method which is increasingly being provided for detecting a focus position is a so-called read-ahead system which reads in advance the height, inclination, and the like of the wafer at a measurement point in a read-ahead region before the actual exposure region with respect to the scanning direction by taking a response speed into account, and corrects the focus position (or inclination) in the exposure region based on the result obtained by the read-ahead system.

Even when the focus position is detected by such a read-ahead system, if exposure of the wafer is performed for all shot areas in a sequence simply from one end to the other as in the conventional step-and-scan type apparatuses as shown in FIGS. 9(a)–9(c) of Japanese Laid-Open Patent Publication No. 4-196513 (U.S. Ser. No. 068,101 filed by the assignee of this application on May 28, 1993), there arise such problems that, if the shot area contains a periphery of the wafer, the value of the focus position detected in the read-ahead region may vary significantly depending on the scanning direction, and precise position control becomes impossible, that it takes too much time before the inclination of the wafer aligns with that of the imaging plane, or that the amount of correction in the autofocusing mechanism (or autoleveling mechanism) becomes too large, and the actual exposure region cannot follow the imaging plane.

Moreover, for example, if relatively large foreign material such as a scrap of the photoresist is interposed between a wafer and a wafer holder, the height or level of the wafer surface varies. Therefore, there is a problem that if information obtained by the read-ahead system at a region where such a foreign material exists is used as it is, an actual exposure surface cannot be coincide with the imaging plane, since the correction value of the focus position or the inclination becomes too large. Moreover, if the information read ahead at the region where the foreign material exists is used as it is, the focus position or the inclination at a different region greatly deviates from the real value, since the height of the wafer surface greatly and locally varies.

Furthermore, in the step-and-scanning projection exposure apparatus, exposure is performed onto each shot area of a wafer by the scanning exposure type and wafer stepping is performed during exposure onto each shot area. In this case, conventionally, the positioning of the shot area of a wafer to be exposed in a nonscanning direction (a direction perpendicular to the wafer scanning direction) must only have been completed before the exposure onto the shot area to be exposed starts.

As stated above, even in the scanning exposure projection exposure apparatus, it is necessary to continuously carry out autofocusing during scanning exposure. However, in the case of the scanning exposure type, the response speed of the autofocusing mechanism has a predetermined maximum limit if the focusing position is merely measured only in the slit-like exposure region and the height of the wafer is adjusted based on the result of this measurement because the wafer is scanned in a predetermined scanning direction with respect to the projection optical system. There is thus the possibility of the occurrence of follow-up errors between the wafer surface and the imaging surface. Therefore, it is desirable to carry out autofocusing so that follow-up errors will not occur even if the wafer is scanned.

Furthermore, there is an appropriate amount of exposure for the photosensitive materials, such as photoresist, on a wafer. In the scanning exposure type, if the intensity of illumination and the width of the slit exposure region are determined, the scanning speed for obtaining the appropriate amount of exposure will be determined as a predetermined value. Therefore, in carrying out exposure onto a wafer by the scanning exposure type, a predetermined acceleration section (approach run section) is needed before the scanning speed of the wafer reaches a predetermined value. It is desirable that at least autofocusing be conducted before the wafer passes through the acceleration section.

Moreover, in the case of the step-and-scanning projection exposure apparatus, conventionally, there were cases where a wafer moves in the nonscanning direction until immediately before exposure is carried out by the scanning exposure type in a predetermined shot area on a wafer. Thus, there is the possibility of the occurrence of autofocusing follow-up errors if the wafer is moving in the nonscanning direction. Therefore, it is desirable that the arrangement be made so that follow-up errors do not occur.

Moreover, in the step-and-scanning projection exposure apparatus, the speed of wafer movement at the time of stepping is fairly large compared to the speed (scanning speed) of wafer movement at the time of scanning exposure. Therefore, there is a possibility of the occurrence of unstable vibrations in the wafer due to the autofocusing operation at the time of stepping.

SUMMARY OF THE INVENTION

An object of the present invention is to provide a scanning exposure method which has excellent control accuracy for the focus position or inclination even for a shot area in the outer periphery of the wafer when a reticle pattern is exposed onto each shot area on the wafer in the scanning type.

Another object of the present invention is to provide a scanning exposure method which has excellent control accuracy for the focus position or inclination even for a shot area, and also causes no wasted action of the reticle.

Still another object of the present invention is to provide a scanning exposure method for accurately aligning the actual exposure region on a photosensitive substrate such as a wafer with the imaging plane of an optical projection system without lowering the scanning speed when exposure by means of the scanning exposure method is carried out and for not deteriorating the follow-up accuracy of autofocusing or autoleveling as a whole, even if the height or level of the photosensitive substrate surface varies significantly.

Further object of the present invention is to provide a scanning exposure method which make it possible to accurately aligning regions other than a specific region with an imaging plane even if the level or height of the surface of the substrate in the specific region greatly varies in partial, due to, for example, existence of a foreign material behind the substrate.

Further object of the present invention is to provide a projection exposure method which makes it possible to carry out autofocusing with a small follow-up error even if a wafer is being scanned when exposure is performed by the scanning exposure method and activates autofocusing before a wafer passes through the acceleration section.

Further, an object of the present invention is to prevent autofocusing follow-up errors which are caused by the movement of wafer in the nonscanning direction from occurring.

A further object of the present invention is to provide a projection exposure method for preventing the occurrence of unstable vibrations in the wafer due to the autofocusing operation even when the wafer moves in stepping motion at high speed in carrying out exposure by the step-and-scanning type.

The first scanning exposure method according to the present invention comprises the steps of illuminating a predetermined illumination region of a pattern on a mask to project the pattern in said illumination region onto a plurality of shot areas on a substrate through an optical projection system; detecting, by a read-ahead system, the height of said substrate in the direction along the optical axis of said optical projection system at a read-ahead region before said exposure region with respect to the scanning direction for said exposure region while scanning said substrate in a predetermined direction with respect to said exposure region conjugate to said illumination region in synchronization with scanning said mask in the direction opposite to said predetermined direction with respect to said illumination region; and when shot areas at the outer periphery of said substrate are exposed, scanning said substrate in a direction such that said exposure region moves relatively on the outside of said outer periphery from the inside to the outside of said substrate, while correcting the height of said exposure surface in said shot areas based on the height of said exposure surface of the substrate, which is read ahead at said read-ahead region.

In the above scanning exposure method, if the number of the plurality of shot areas on the substrate is an even number, it is desirable to make equal the number of shot areas in which the exposure region is scanned in a same predetermined direction to the number of shot areas in which the exposure region is scanned in the direction opposite to the above predetermined direction, in the plurality of shot areas, to start exposure of any shot area in the plurality of shot areas, and then to perform exposure by alternately reversing the scanning direction for each shot area.

On the other hand, if the number of the plurality of shot areas on the substrate is an odd number, it is desirable to make the number of shot areas in which the exposure region is scanned in a same predetermined direction larger than the number of shot areas in which the exposure region is scanned in the direction opposite to the above predetermined direction by one, in the plurality of shot areas, to start exposure from any shot area in the plurality of shot areas the predetermined direction for which is the scanning direction, and then to perform exposure by alternately reversing the scanning direction for each shot area.

Moreover, it may be possible to set the scanning direction of the exposure region of inner shot areas adjacent to peripheral shot areas of the substrate opposite to the scanning direction for the incomplete shot areas, and to alternately reverse the scanning direction for the exposure region of shot areas which are those other than the peripheral shot areas and inner shot areas and arranged in a direction vertical to the scanning direction of the substrate.

According to such first scanning exposure method of the present invention, when, for example, as shown in FIG. 10, the outer shot areas (S1–S4) on the outer periphery of the substrate are scanned by the scanning exposure system, the substrate is scanned in such a manner that the exposure region moves relatively from the inside to the outside of the substrate while correcting the height with the read-ahead system. Therefore, even if any "sagging" arises at the periphery of the substrate, because the level or height of the substrate is detected from the inside free from the sagging by the read-ahead system, the exposure is performed in a state where the height of the exposure surface of the substrate aligns the projected image of the mask. In addition, even if the exposure region reaches the outer edge of the substrate in the final stage of scanning and exposure, and the height detected by the read-ahead system varies steeply, the height adjustment mechanism follows up with a predetermined period of time, so that the height of the substrate does not vary so steeply and drift of the height is small.

Furthermore, in a case where two shot areas on the substrate are continuously exposed, any idle movement is eliminated and throughput is improved by reciprocally scanning the mask with respect to the slit-shaped exposure region. Its conditions depend on whether the number of all shot areas (S1–S32) on the substrate is even or odd. First, on the one hand, when it is even, it may be done by making equal the number of shot areas wherein the exposure region is scanned in a same predetermined direction and the number of shot areas wherein the exposure region is scanned in the opposite direction, and by alternately reversing the scanning direction by shot area. On the other hand, when the number of all shot areas on the substrate is odd, it may be done by making the number of shot areas wherein the exposure region is scanned in a same predetermined direction and the number of shot areas wherein the exposure region is scanned in the opposite direction different by one, by starting the exposure from the shot area which is in a group of shot areas arranged in the scanning direction, the number of which is greater than that in the other group of shot areas, and then by alternately reversing the scanning direction by one shot area.

Furthermore, in a case where there exist inner shot areas (shot areas scanned along loci U4, U6, U8, and U10) adjacent to the outer shot areas (S1–S4) on the outer periphery of the substrate, the scanning direction for the exposure region of these inner shot areas is set in the opposite direction to the scanning direction (loci U3, U5, U7, and U9) for these outer shot areas. For the shot areas other than these outer shot areas on the outer periphery and these inner shot areas, the scanning direction is alternately reversed for the shot areas (shot areas scanned along loci U2, U16, U15, U14, . . . ) arranged in a direction (Y direction) vertical to the scanning direction of the substrate (X direction). This satisfies the conditions for reciprocally scanning the mask without any wasted movement.

The second scanning exposure method according to the present invention comprises the steps of illuminating a predetermined illumination region of a pattern on a mask to project the pattern in said illumination region onto a plurality of shot areas on a substrate through an optical projection system; detecting, by a read-ahead system, the height of said substrate in the direction along the optical axis of said optical projection system at a read-ahead region before said exposure region with respect to the scanning direction for said exposure region while scanning said substrate in a predetermined direction with respect to said exposure region conjugate to said illumination region in synchronization with scanning said mask in the direction opposite to said predetermined direction with respect to said illumination region; when shot areas at the outer periphery of said substrate are exposed, correcting the height of said exposure surface in said shot areas based on the height of said exposure surface of the substrate, which is detected at said read-ahead region by a read-ahead system; and for incomplete shot areas where said read-ahead region or said exposure region is not fully included in an exposable region in said substrate, scanning said substrate in such a manner that said substrate relative to said incomplete shot areas while correcting the height of said substrate based on the height of an exposure surface detected by said read-ahead system.

In the above second method it may be possible to set the scanning direction for the exposure region of inner shot areas adjacent to incomplete shot areas of the substrate opposite to the scanning direction of the incomplete shot areas, and to alternately reverse the scanning direction for the exposure region of shot areas which are those other than the incomplete shot areas and the inner shot areas and arranged in a direction vertical to the scanning direction of the substrate.

According to the second scanning exposure method of the present invention, for incomplete shot areas such as the shot areas on the outer periphery of the wafer (S1, S4) where the height detection region by the read-ahead system or the slit-shaped exposure region is not fully included, the effect by detected data obtained from the incomplete area can be reduced as in the first scanning exposure method by scanning the substrate in such a manner that the exposure region moves relatively along the loci (U3, U9) from the inside to the outside of the substrate so that the drift of the level or height setting value for the substrate can be reduced as a whole.

The third scanning exposure method according to the present invention comprises the steps of illuminating a predetermined illumination region of a pattern on a mask to project the pattern in said illumination region onto a substrate through an optical projection system; detecting the position of said substrate in the direction along the optical axis of said optical projection system at a measurement point before said exposure region with respect to the scanning direction for said exposure region while scanning said substrate in a predetermined direction with respect to said exposure region conjugate to said illumination region in synchronization with scanning said mask in the direction opposite to said predetermined direction with respect to said illumination region; and fixing the height of said substrate at the height set until then when said height detected by a read-ahead system deviates over a pre-determined allowable range with respect to the imaging plane of said optical projection system, while controlling the height of said substrate in the exposure region based on said height detected at said measurement point by said read-ahead system.

In this case, the inclination of the substrate is also controlled (leveled) based on the height detected by the read-ahead system and, when the height deviates over the predetermined range with respect to the imaging plane of the optical projection system, it is desirable to fix the height and inclination of the substrate at those set until then.

In addition, in the above third method, in parallel with measuring the height or level of the substrate at measurement points arranged in a line in a direction intersecting the scanning direction and before the exposure region with respect to the scanning direction for the exposure region, the height or level of the substrate is also measured at measurement points arranged in a line in a direction intersecting the scanning direction in the exposure region. The height of the substrate is set at the height set until then when the height measured at measurement points before the exposure region with respect to the scanning direction is offset over the predetermined allowable range with respect to the imaging plane of the optical projection system.

Furthermore, the height of the substrate is measured at a plurality of measurement points arranged in a direction intersecting the scanning direction before the exposure region with respect to the scanning direction. When parts of the height thus measured at the measurement points are offset over the predetermined allowable range with respect to the imaging plane of the optical projection system, it is desirable to control the height of the substrate excluding the data for the height over the allowable range.

According to the above third scanning exposure method of the present invention, the height of the substrate is measured at the measurement point before the exposure region with respect to the scanning direction on the substrate when a pattern image of the mask is projected onto the substrate by synchronously scanning the substrate and the reticle or mask. Then, when the region in which the height thereof is measured by the read-ahead system reaches the exposure region of the pattern image of the mask, the height of the region is set based on the height detected by the read-ahead system. This causes the exposure surface of the substrate to substantially accurately align the imaging plane of the optical projection system without lowering the scanning speed even in the scanning exposure system. That is, autofocusing is performed.

In addition, as shown in FIG. 19(a), if the level or height read ahead at the measurement point deviates over the predetermined allowable range with respect to the imaging plane, the measurement result is ignored. That is, by setting the height of the substrate when the measured region reaches the exposure region at the height set until then, it can eliminate the control of autofocusing suddenly becomes large to deteriorate performance as a whole. Moreover, areas where the height changes remarkably on the substrate are frequently parts on the periphery of the substrate not suitable for exposure so that the effect is minimized even if the measurement data at such an area is ignored.

Then, the inclination of the scanning direction on the substrate can be detected by reading ahead the height of the substrate at a predetermined measurement point while scanning the substrate in such a manner. Moreover, if there is a plurality of predetermined measurement points in a direction intersecting the scanning direction, it is possible to detect the inclination in a nonscanning direction on the substrate. Thus, the inclination of the substrate can be also controlled (leveled) based on the detected inclination. In this case also, it can prevent follow-up accuracy in autoleveling from deteriorating as a whole by fixing the inclination of the substrate at the inclination set until when the height detected by the read-ahead system deviates over a predetermined allowable range with respect to the imaging plane of the optical projection system.

In a case where, in parallel to the measurement of the height or level of the substrate at the array of measurement points arranged in a direction intersecting the scanning direction before the exposure region conjugate to the radiation region with respect to the scanning direction, the height of the substrate is also measured at the array of measurement points arranged in a direction intersecting the scanning direction in the exposure region, autofocusing is performed at a higher accuracy by using the measurement data in the exposure region and the measurement data obtained by the read-ahead system. In this case also, if the height or level detected by the read-ahead system is offset over the predetermined allowable range with respect to the optical projection system, the follow-up accuracy in performing the autofocusing is not deteriorated as a whole by fixing the height of the substrate at the height set until then.

Furthermore, if the height of the substrate is measured at a plurality of measurement points (AF21–AF29) arranged in a direction intersecting the scanning direction before the exposure region with respect to the scanning direction, and parts of the height thus measured at the plurality of measurement points (AF21–AF29) deviates over the predetermined allowable range with respect to the optical projection system (for example, an interval $\Delta Y1$, $\Delta Y2$), the measurement data of height offset from the allowable range is data for regions such as those on the edge unsuitable for pattern exposure. Therefore, the follow-up accuracy for autofocusing and autoleveling can be improved for other regions by eliminating such measurement data.

The fourth scanning exposure method according to the present invention comprises the steps of illuminating a predetermined illumination region of a pattern on a mask to project the pattern in said illumination region onto a substrate through an optical projection system; detecting the position of said substrate in the direction along the optical axis of said optical projection system at a measurement point before said exposure region with respect to the scanning direction for said exposure region while scanning said substrate in a predetermined direction with respect to said exposure region conjugate to said illumination region in synchronization with scanning said mask in the direction opposite to said predetermined direction with respect to said illumination region; fixing the height of said substrate at the height set until then when said height detected by a read-ahead system deviates over a pre-determined allowable range with respect to the imaging plane of said optical projection system, while controlling the height of said substrate in the exposure region based on said height detected at said measurement point by said read-ahead system; successively storing the height detected by said read-ahead system in a region which exists in a predetermined memory and is designated by an address determined by a predetermined sampling frequency; and successively reading out the height from the region designated in said predetermined memory by the address determined according to the scanning speed of said substrate and fitting the height of said substrate with an imaging plane of said optical projection system based on the height detected by said read-ahead system when the detected height is within a predetermined allowable range.

In this case, it is desirable to obtain the distribution of the surface height of the substrate based on the height obtained the read-ahead system and to detect, from the distribution of the surface height, existence of a foreign material which is adhered to an upper or lower surface of the substrate.

Moreover, if it is determined that a foreign material greater than a predetermined size is adhered to the upper or lower surface of the substrate, it is desirable not to use information regarding the height read ahead at the position where the foreign material is adhered as a control information for the level or inclination of the substrate.

In the forth scanning exposure method according to the present invention, as explained above, the level or height data detected by the read-ahead system are stored in the regions of the memory designated, for example by addresses which successively continue with predetermined sampling frequency. Therefore, in the case where the height data for controlling the height or inclination of the actual exposure region are read out, if the scanning speed is constant, the height data may be read out from an address separated from the other address, by a predetermined distance, to which the data are being stored. However, in practice, since the scanning speed changes in response to sensitivity of a photosensitive material on the substrate, in order to carry out accurate control of the height or inclination, it is desired to read out the height data from the region designated by the address which is determined by the address, to which the data are being stored, in accordance with the scanning speed of the substrate.

When the distribution of the surface height of the substrate is read out from the height detected by the read-ahead system, if a foreign material is adhered to the upper or lower surface of the substrate the height of the portion at which the foreign material is adhered greatly changes, such as, for example in convex shape with respect to the regions surround that position. Therefore, the region at which a foreign material is adhered can be detected from the distribution of the surface height.

Moreover, if it is determined that a foreign material greater than a predetermined size is adhered to the upper or lower surface of the substrate, information regarding the height detected by the read-ahead system at the position where the foreign material is adhered is not used as a control information for the height or inclination of the substrate. Therefore, the regions surrounding the position where the foreign material is adhered can be accurately aligned with the imaging plane. In this case, it is expected that if a detected foreign material is small and a follow-up control can be carried out by an auto-focusing or auto-leveling mechanism, focusing accuracy is increased by using convex and concave information resulting from the existence of the foreign material. Thus it is possible to prevent the carrying out of an unnecessary focusing operation by setting the maximum size within the range at which the follow-up control is capable, as the predetermined size and neglecting height information for the foreign material which prevents follow-up control.

The fifth scanning exposure method according to the present invention comprises steps of illuminating a pattern on a mask through an optical projection system to project said pattern onto a substrate; scanning said substrate in a second direction associated with a first direction in synchronization with scanning said mask in said first direction perpendicular to the optical axis of said optical projection system, and measuring the position of said substrate in a direction along said optical axis at a read-ahead region before the exposure region of said substrate by said optical projection system with respect to said second direction; and in adjusting said position of said substrate along said optical axis based on the result of said measurement, positioning said read-ahead region between said predetermined shot area and said exposure region by said optical projection system when said substrate is moved to a scanning start position.

In the above fifth method, it is desirable that, after scanning of the substrate starts to expose a mask pattern onto a substrate, the positioning of the substrate in a direction perpendicular to the second direction be completed before the read-ahead region reaches a predetermined shot area.

Moreover, it is desirable that adjustment of the position of the substrate along the optical axis be stopped immediately after exposure onto a predetermined shot area have finished and the substrate be positioned at the next scanning start position in the second direction for exposure onto the next shot area of the substrate and adjustment of the position of the substrate along the optical axis starts after positioning of the substrate in a direction perpendicular to the second direction has finished.

According to the fifth scanning exposure method according to the present invention, the optical axial position (focusing position) of the optical projection system is detected in the read-ahead region before the exposure region on the substrate in the second direction (scanning direction) and, based on the result of this detection, the focusing position of the substrate in the exposure region is adjusted. Therefore, the response speed of the autofocusing mechanism has a predetermined upper limit and highly precise follow-up autofocusing is carried out even if the substrate is being scanned. Moreover, not only autofocusing but also autoleveling can be performed to align the inclination of the surface of the substrate with that of the imaging plane.

Moreover, an acceleration section having a predetermined width, Lac, is necessary as shown in FIG. 25 to accelerate the substrate to a predetermined constant scanning speed. When the read-ahead region is in the acceleration section at the scanning start point, that is, when the read-ahead region lies between the shot area and the exposure region on the substrate, autofocusing is carried out accurately when the shot area passes through the acceleration section and enters the exposure region.

Next, in FIG. 25, for example, even in a state in which a substrate is stepped in a nonscanning direction (the direction perpendicular to the scanning direction, that is Y direction) and the read-ahead region enters the shot area, if the shot area is still moving in the Y direction, autofocusing cannot be carried out accurately because the information on the focusing position obtained in the read-ahead region is no longer the information on the focusing position at a proper measurement point. To avoid this, the positioning (stepping) of the substrate in a nonscanning direction (Y direction) must be completed before the read-ahead region enters the shot area.

Moreover, in a case in which the focusing position adjustment (autofocusing) of the substrate is stopped immediately after the end of exposure onto a predetermined shot area, the substrate will not vibrate unstably even if the substrate steps at a high speed and the amount of fluctuation of the focusing position to be detected increases compared to the case of scanning exposure. Then, the scanning of the substrate in a scanning direction is started and, in the case where autofocusing is started after the end of stepping in the nonscanning direction, since the speed of substrate movement is equal to or slower than the scanning speed at the time of exposure, autofocusing is carried out in a stable manner.

BRIEF DESCRIPTION OF THE DRAWINGS

FIG. 6 is a diagram showing the relation between FIGS. 6A and 6B;

FIGS. 6A and 6B are a flowchart showing the exposure sequence in an embodiment of the scanning exposure method according to the present invention;

FIG. 25 is a plan view showing the positional relationship between the slit-like exposure region 216 and the shot area 234 on a wafer at the start of scanning; and FIGS. 26(a) to 26(c) are a drawing showing the speed of the movement of the XY stage on a wafer and the reticle stage in the case where exposure is performed sequentially by the scanning exposure type onto the adjacent shot area in the nonscanning direction.

DESCRIPTION OF THE PREFERRED EMBODIMENTS

Figure 1:
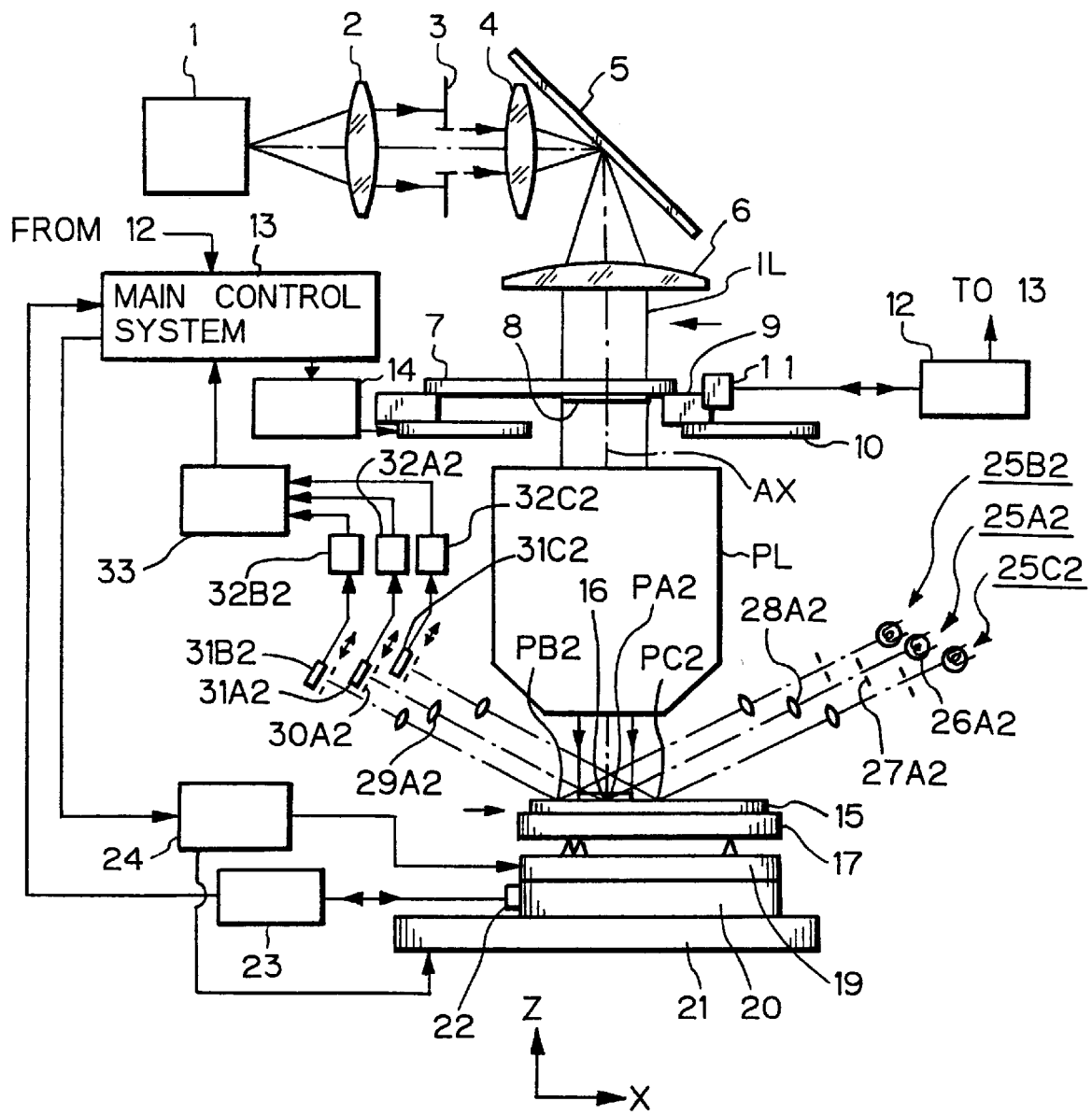
FIG. 1 is an arrangement showing a scanning exposure projection exposure apparatus according to a prior application of the present inventors.

An embodiment of the present invention will be explained by referring to the drawings in the sections that follow. Because this embodiment is an application of the present invention for exposure by a step-and-scanning projection exposure apparatus, first, the principle of operation of the step-and-scanning projection exposure apparatus is explained by referring to FIGS. 1 to 5.

FIG. 1 shows a scanning exposure projection exposure apparatus which the inventors propose in U.S. Ser. No. 08/301,991. In the figure, exposure light IL from a light source system 1 containing a light source, an optical integrator, and the like illuminates a rectangular radiation region 8 on a reticle 7 with uniform illumination through a first relay lens 2, a reticle blind (variable field diaphragm) 3, a second relay lens 4, a mirror 5, and a main condenser lens 6. The mounting surface of the reticle blind 3 is conjugate to the pattern formation surface of the reticle 7, and the position and shape of the radiation region 8 on the reticle 7 are determined by the position and shape of the aperture of the reticle blind 3. The light source used in the light source system 1 includes an extra-high-pressure mercury lamp, an excimer laser source, and a harmonic YAG laser generator.

An image of the pattern of the reticle 7 in the illumination region 8 is projected and exposed through optical projection system PL onto a rectangular exposure region 16 on a wafer 15 to which photoresist has been coated. The Z axis is taken in parallel to the optical axis of optical projection system PL, the X axis in a direction parallel to the plane of the sheet in FIG. 1 on a two-dimensional plane vertical to optical axis AX, and the Y axis in a direction vertical to the plane of the sheet in FIG. 1. In this embodiment, the scanning direction of the reticle 7 and the wafer 15 when exposed with the scanning exposure type is parallel to the X axis.

On the one hand, the reticle 7 is held on a reticle stage 9 which is in turn supported on a reticle base 10 so as to be driven in the X direction at a predetermined speed by, for example, a linear motor. The coordinates of the reticle 7 in the X direction are continuously measured by a movable mirror 11 secured on one end of the reticle stage 9 in the X direction and an external laser interferometer 12, and the measured coordinate information of the reticle 7 is supplied to a main control system 13 for controlling the operation of the entire apparatus. The main control system 13 controls the position and travel speed of the reticle stage 9 through a reticle drive system 14.

On the other hand, the wafer 15 is held on a wafer holder 17 which is in turn installed on a Z leveling stage 19 through a support point consisting of three extendable piezo elements and the like. The Z leveling stage 19 is installed on an XY stage 20 which is supported on a wafer base 21 slidable in two dimensions. The Z leveling stage 19 adjusts the vertical position or the position in Z direction (focus position) of the wafer 15 in fine degrees on the wafer holder 17 through three support points, and adjusts the inclination of the exposure plane of the wafer 15 in fine degrees. In addition, the Z leveling stage 19 adjusts the wafer 15 roughly in the Z direction. Moreover, the XY stage 20 positions the Z leveling stage 19, the wafer holder 17, and the wafer 15 in the X and Y directions, and scans the wafer 15 in parallel to the X axis at a predetermined scanning speed in scanning exposure.

The XY coordinates of the XY stage 20 are continuously monitored by a movable mirror 22 secured on the XY stage 20 and an external interferometer 23, and signals of the detected XY coordinates are supplied to the main control system 13. The main control system 13 controls the operations of the XY stage 20 and the Z leveling stage 19 through the wafer drive system 24. In performing exposure by scanning, the shot area to be exposed on the wafer 15 is positioned at an exposure start position, and then the wafer 15 is scanned in the X direction (or the −X direction) with respect to the exposure region 16 at a speed $V_{eX}$ (=$\beta \cdot V_{RO}$) with magnification $\beta$ of optical projection system PL through the XY stage 20 in synchronization with the scanning of the reticle 7 in the −X direction (or the X direction) with respect to the radiation region 8 at speed $V_{RO}$ through the reticle stage 9. Thus, the pattern image of the reticle 7 is sequentially exposed in that shot area on the wafer 15.

An explanation is made on the operation of the arrangement of a focus position detecting system (hereinafter called an "AF sensor") for detecting the position in the Z direction of the exposure plane of the wafer 15 (focus position). This focus position detecting a system was proposed in U.S. Ser. No. 172,098 filed on Dec. 23, 1993 by the assignee of this application. Although nine AF sensors with the same arrangement are actually installed on the apparatus in FIG. 1, FIG. 1 shows only three of the AF sensors 25A2, 25B2, and 25C2. First, on the AF sensor 25A2 at the center, light which is non-photosensitive to the photoresist emitted from a light source 26A2 radiates a slit pattern in a light transmissive slit plate 27A2, and the image of the slit pattern is projected onto measurement point PA2 on the wafer 15 positioned at the center of the exposure region 16 with an angle to the optical axis AX of optical projection system PL. The reflected light from measurement point PA2 is focused on oscillating plate 30A2 through a condenser lens 29A2 on which the image of the slit pattern projected onto measurement point PA2 is imaged again.

The light passed through the slit in oscillating late 30A2 is photoelectrically converted by photodetector 31A2, and the photoelectrically converted signal is supplied to amplifier 32A2. Amplifier 32A2 synchronously detects the photoelectrically converted signal from photodetector 31A2 with a drive signal of the oscillating slit plate 30A2, and amplifies the resulting signal to generate a focus signal, which varies substantially in line within a predetermined range with respect to the focus position of measurement point PA2, and supplies the focus signal to a plane position calculating system 33. Similarly, another AF sensor 25B2 projects the slit pattern image onto measurement point PB2 in the −X direction with respect to measurement point PA2, photoelectrically converts the light from slit pattern image with the photodetector 31B2, and supplies it to amplifier 32B2. Amplifier 32B2 supplies a focus signal corresponding to the focus position of measurement point PB2 to the plane position calculating system 33. Similarly, AF sensor 25C2 projects the slit pattern image onto measurement point PC2 in the X direction with respect to measurement point PA2, photoelectrically converts the light from the slit pattern image with photodetector 31C2, and supplies it to amplifier 32C2. Amplifier 32C2 supplies a focus signal corresponding to the focus position of measurement point PC2 to the plane position calculating system 33.

In this case, the focus signals obtained by amplifiers 32A2–32C2 from the photoelectrically converted signals from AF sensors 25A2–25C2 are respectively calibrated to be zero when measurement points PA2–PC2 match the imaging planes by optical projection system PL. Therefore, each focus signal corresponds to the drift (defocus) of the focus position of respective measurement points PA2–PC2 from the imaging plane.

Figure 2:
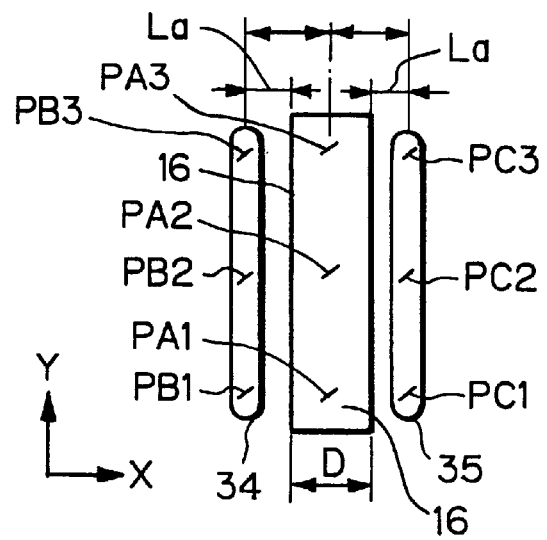
FIG. 2 is a plan view of a slit exposure and a read-ahead region in the projection exposure apparatus shown in FIG. 1.

FIG. 2 shows the distribution of measurement points on the wafer 15 on the apparatus in FIG. 1. In the figure, three measurement points, PA1–PA3, are arranged along a straight line along the Y direction at the center of a rectangular exposure region 16 with width D in the X direction. A read-ahead region 34 consisting of measurement points PB1–PB3 is arranged around a position separated from measurement points PA1–PA3 with distance d in the −X direction, respectively, and a read-ahead region 35 consisting of measurement points PC1–PC3 is arranged around a position separated from measurement points PA1–PA3 with distance d in the X direction, respectively. Measurement point PA2 is positioned at the center of the exposure region 16, and the focus positions of nine measurement points are separately measured by an AF sensor with the same arrangement as AF sensor 25A2 in FIG. 2. Then, the measurement value of the focus signal at the read-ahead region 34 before the exposure region 16 with respect to the scanning direction is used when the wafer 15 is scanned in the X direction, and the measurement value of the focus signal at the read-ahead region 35 before the exposure region 16 with respect to the scanning direction when the wafer 15 is scanned in the −X direction. However, there is also a method using the focus signals obtained at measurement points PA1–PA3 in the exposure region 16 together with the focus signal at the read-ahead region 34 or 35.

Figure 3:
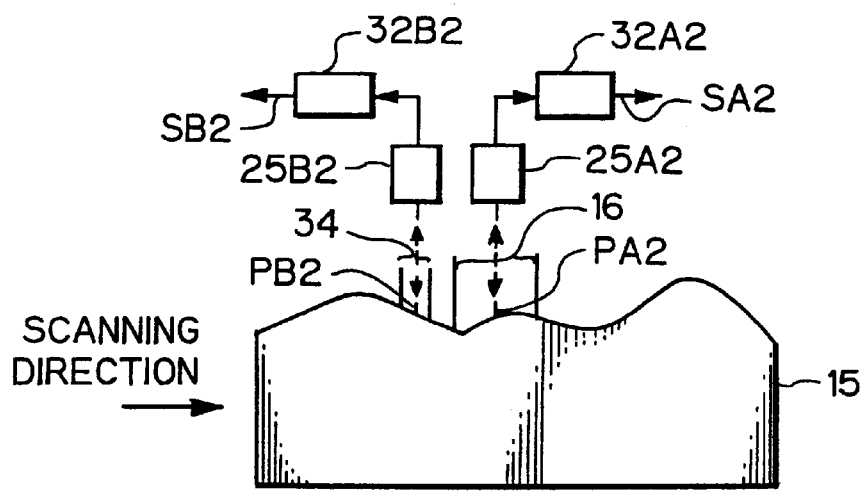
FIG. 3 is a conceptional diagram showing a read-ahead region used in correspondence to the scanning direction of a wafer 15.

Specifically, it is assumed that, for example, as shown in FIG. 3, the wafer 15 is scanned in the X direction, or the reticle 7 is scanned in the −X direction. In this case, the focus positions at the read-ahead region 34 before the exposure region 16 with respect to the scanning direction (X direction) (or the focus positions at the measurement point in the exposure region 16 and at the measurement point at the read-ahead region 34) are respectively measured by the AF sensor, and the focus position at the shot area is corrected based on the measurement result. Then, conventionally, exposure has been made onto all shot areas on the wafer 15 in the sequence explained hereinbelow.

Figure 5:
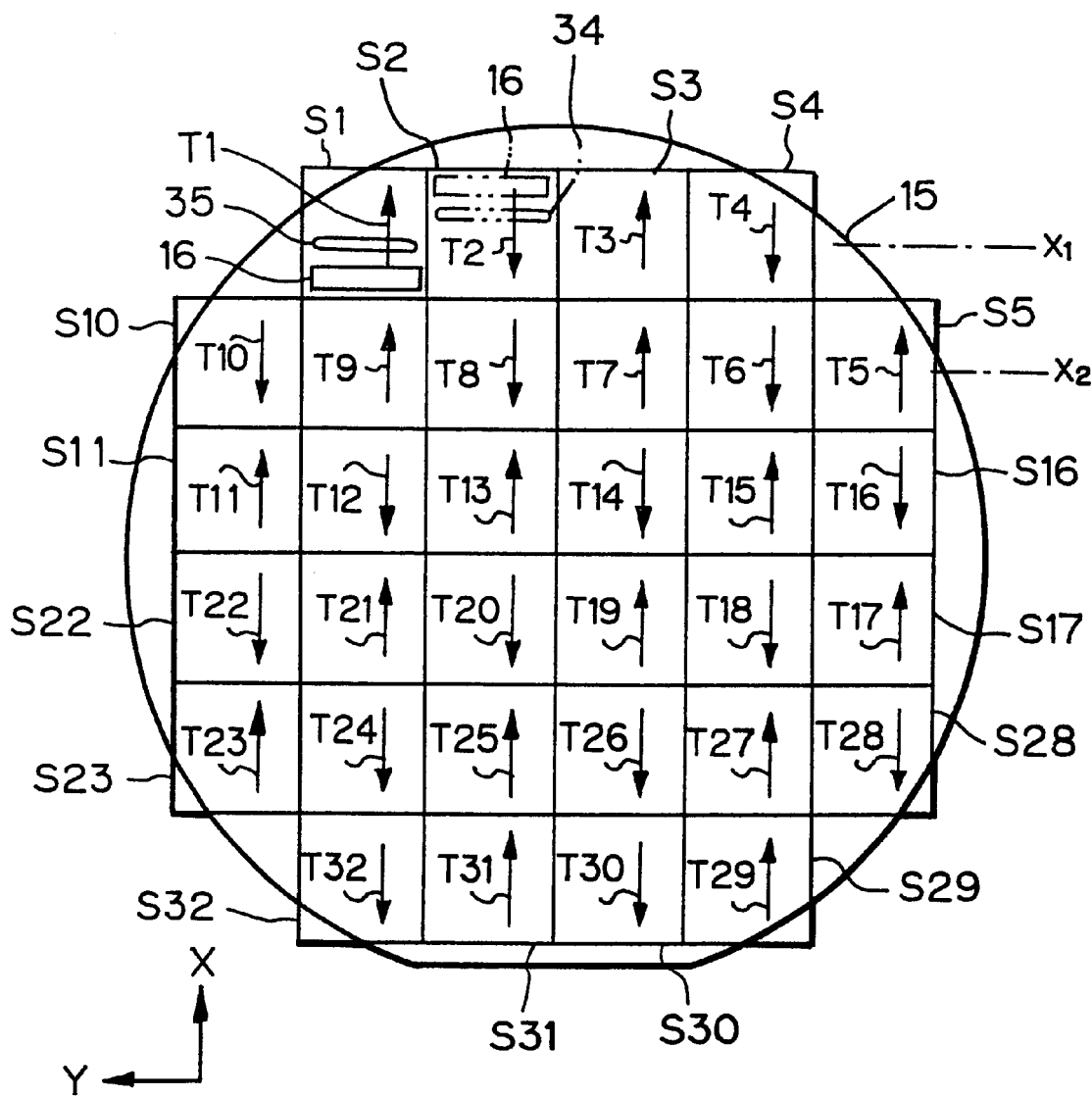
FIG. 5 is a plan view showing a conventional exposure sequence for each shot area on the wafer by the projection exposure apparatus shown in FIG. 1.

FIG. 5 shows an example of exposure sequence by the scanning exposure projection exposure apparatus shown in FIG. 1. As shown in the figure, the exposure plane of the wafer 15 is formed with shot areas S1–S32 with a predetermined pitch in the X and Y directions. When it is intended to expose the second layer or later on the wafer 15, each of shot areas S1–S32 has been formed with the same chip pattern in the previous processes. First, if it is assumed that the exposure is started from shot area S1 at the upper left corner of the wafer 15, the loci of relative scanning for the slit exposure region 16 are in the order of T1, T2, T3, . . . , T32 to the wafer 15 as the reference. Actually, because the wafer 15 is moved, the travel direcion of the wafer 15 is opposite to the arrow for loci T1–T32.

Also, conventionally, because the exposure is started from shot S1, then to S2, S3, . . . , S32 in a sequence, the loci of the relative scanning of the exposure region 16 with respect to each of shot areas S1–S32 are represented by T1–T32. In this case, the scanning is performed in the −X direction for the first shot area Si in first row $x_1$ (seen in FIG. 5) in the outermost periphery at the top of the wafer 15 with respect to the exposure region 16. That is, the wafer 15 is scanned as if the exposure region 16 moves on the wafer 15 along locus T1 toward the X direction. At that moment, the focus position is read ahead at the read-ahead region 35 before the exposure region 16 with respect to the scanning direction, and the focus position and the inclination of the wafer 15 is adjusted based on the resultant focus position. In practice, it may be possible to use a focus position obtained at the measurement point in the exposure region 16, which is applied hereinbelow.

Then, after the second shot area S2 adjacent to shot area S1 in the Y direction is moved to the scanning start position by driving the stage for the wafer step by step, the wafer 15 is scanned as if the exposure region 16 moves on shot area S2 along locus T2 toward the −X direction. At that moment, the focus position is read ahead at the read-ahead region 34 before the exposure region 16 with respect to the scanning direction, and the focus position and the inclination of the wafer 15 are adjusted based on the resultant focus position. Then, the exposure is continued in the scanning exposure system to last shot area S4 in the first row while alternately reversing the scanning direction. Thus, the direction of locus T5 for the exposure region 16 on first shot area S5 in second row $x_2$ is opposite to that of locus T4 for the exposure region 16 on last shot area S4 in the first row $x_1$.

The exposure by the scanning exposure system is performed from shot areas S6–S10 in the second row to the shot areas S29–S32 in the last row by alternately reversing the scanning direction for each adjacent shot area, and also by reversing the scanning direction between the last shot area in each row and the first shot area in the next row.

Figure 4:
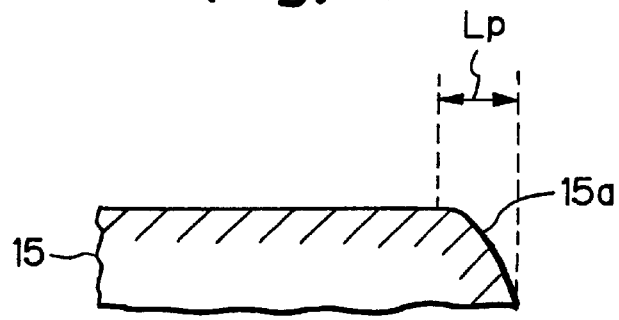
FIG. 4 is a cross sectional view showing the state of "sagging" at the outer periphery of the wafer.

In the scanning exposure sequence as described above, the scanning direction is alternately reversed for exposure region 16 of shot areas S1–S4 at the outer periphery in the uppermost rows on the wafer 15 (that is, the shot areas close to the outer periphery or the shot areas partially overlapping the outer periphery), and the scanning direction is also alternately reversed for shot areas S29–S32 at the outer periphery in the lowest row. However, as shown in FIG. 4, the end 15a of the surface of the wafer 15 is generally thinned in its thickness from the inside to the outside due to sagging. Thus, if the slit exposure region 16 is scanned from the outside to the inside relative to the shot areas such as shot areas S2 and S4 at the outer periphery of the wafer 15 (wafer 15 being scanned from the inside to the outside), the control mechanisms for the focus position detected at the read-ahead region 34 and the inclination tend to not follow the variation of the focus position because it is too large, so there arises a disadvantage such that the exposure plane of the wafer 15 is exposed in a state where it has significantly drifted from the allowable range.

In addition, when the exposure region 16 is scanned from the outside to the inside along locus T29 relative to a shot area such as shot area S29 at the lower right corner in FIG. 5 a part of which is lost by the outer periphery end of the wafer 15, leveling is started in a state affected by the data for the focus position for such lost part. Then, there is a disadvantage such that, immediately after the scanning exposure is started, the exposure plane of the wafer 15 is exposed in a state where it is largely inclined to the imaging plane, and, even after the read-ahead region for the focus position moves to the wafer 15 from the missing region, it takes time until the inclination of the wafer 15 aligns the inclination of the imaging plane because of the response characteristics of the inclination correcting mechanism.

Furthermore, because the scanning direction for the slit-shaped or slit-like illumination region 8 at the reticle 7 is in a predetermined direction or the direction opposite to it, the most efficient movement as the operation sequence at the reticle 7 is that the scanning direction for the reticle 7 is always reversed when the exposure moves from a shot area to the next shot area. This makes it sufficient that, when all shot areas on the wafer 15 are exposed, the reticle 7 only reciprocates with respect to the slit-shaped illumination region 8 so that idle return becomes unnecessary. Therefore, even if an exposure sequence with good control accuracy for the focus position and the inclination is required for shot areas at the outer periphery of the wafer, it is necessary that, in the exposure sequence, the scanning direction is reversed when moving from one shot area to the next area, that is, the scanning direction for the reticle is reversed.

Also, as described in the above, if there is a region where the height of the wafer surface significantly varies at the periphery of the wafer and the like, the amount of correction at the autofocusing mechanism (or the autoleveling mechanism) becomes so large that the actual exposure region may not follow up the imaging plane. To avoid this, it may be sufficient to lower the scanning speed of the wafer, but it deteriorates the throughput of the exposure process.

The first embodiment of the scanning exposure method will be explained next to by referring to the above-mentioned FIGS. 1 to 5, and FIGS. 6 to 11.

In FIG. 2, the distance from the end of the exposure region 16 in the scanning direction to the center of each of the read-ahead regions 34 and 35 is to be La. In this case, it is possible to use the detection data of the focus position detected in the exposure region 16 together, but, in the following, the explanation is given by assuming that the correction is performed based on the focus position detected at the read-ahead region 34 or 35. First, the operations of the reticle stage 9 and the XY stage 20 at the wafer 15 in FIG. 1 are explained by referring to FIGS. 7(a) and 7(b) when exposure is performed in this embodiment.

Figure 7A:
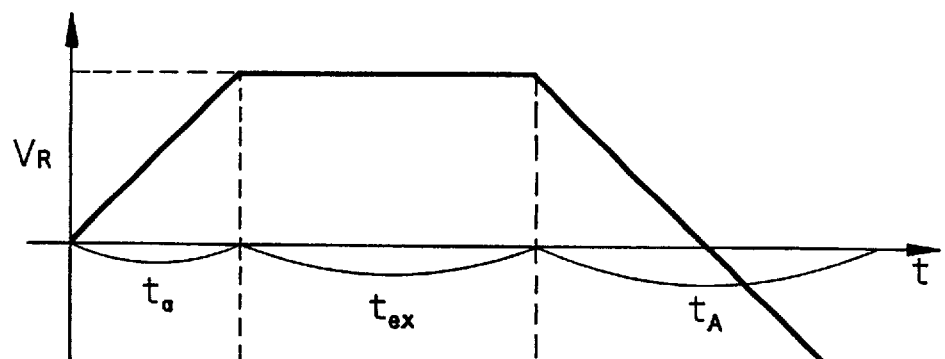
FIGS. 7(a)–7(c) are timing charts showing the travel speed of a reticle stage 9 and an XY stage 20 at the wafer in performing exposure in the scanning exposure type.
Figure 7B:
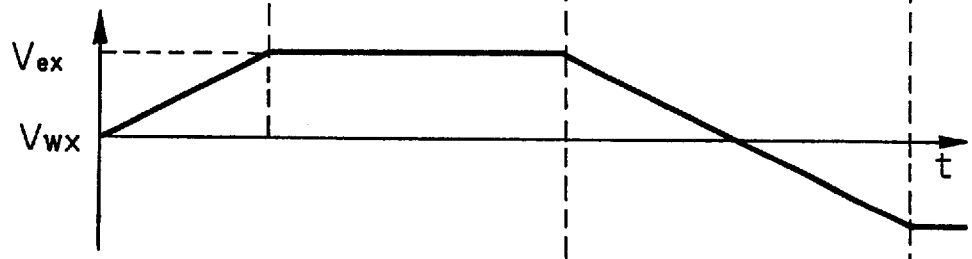
Figure 7C:
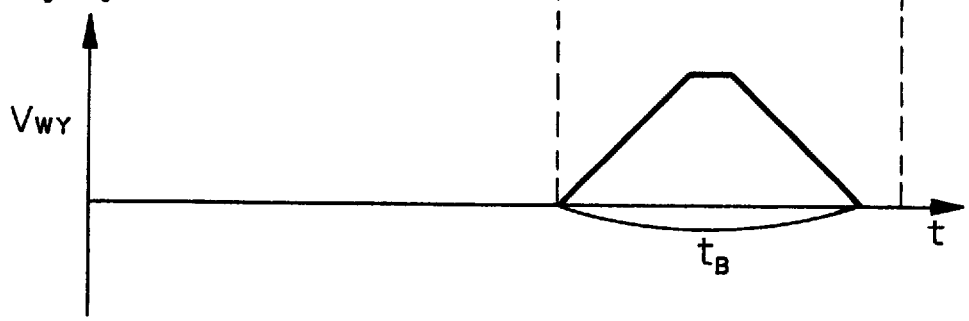

FIG. 7(a) shows change of travel speed $V_R$ of the reticle stage 9 in the X direction which is the scanning direction, FIG. 7(b) shows change of travel speed $V_{WX}$ of the XY stage 20 in the X direction, and FIG. 7(c) shows change of travel speed $V_{WY}$ of the XY stage 20 in the Y direction normal to the scanning direction. The travel speed of the XY stage 20 in the X direction when the pattern image of the mask or reticle 7 is exposed onto the wafer 15 is to be $V_{eX}$. Furthermore, because the projection magnification of optical projection system PL is β from the reticle 7 to the wafer 15, the scanning speed of the reticle stage 9 in the X direction is $V_{eX}/β$ when exposure is performed in the scanning exposure method. Similarly, the acceleration of the reticle 7 (reticle stage 9) to synchronize the reticle 7 with the wafer 15 from the acceleration start position is also 1/β of the acceleration of the XY stage 20 at the wafer 15 in the X direction. That is, in FIG. 7(a), if the acceleration of the reticle stage 9 is $a_r$, then acceleration time $t_a$ is:

$$t_a = (V_{eX}/β)/a_r \tag{1}$$

Figure 8:
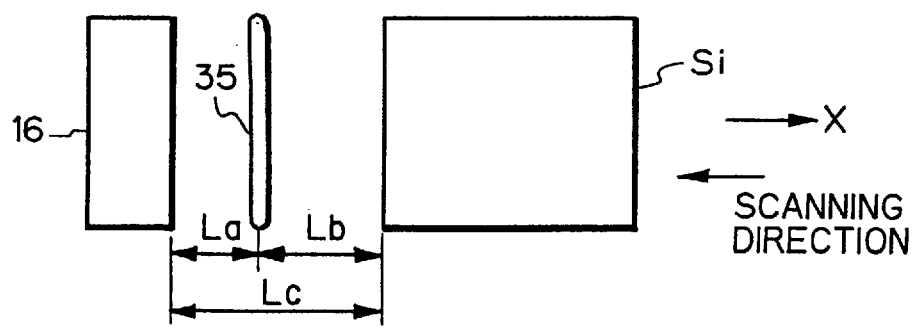
FIG. 8 is a diagram describing a calculation method for acceleration distance Lc.

FIG. 8 shows the positional relationship at the acceleration start time between a shot area Si to be being exposed on the wafer 15 and the slit-shaped or slit-like exposure region 16. In the figure, if it is assumed that shot area Si is scanned in the −X direction with respect to the exposure region 16, spacing Lc from the left edge of shot area Si and the right edge of the exposure region 16 is the acceleration distance on the wafer 15 necessary for the acceleration of the XY stage 20, and the acceleration distance Lc is:

$$Lc = (½) \cdot (a_r \beta) \cdot t_a^2 \quad (2)$$

In the case of FIG. 8, the read-ahead region 35 at the right side of the exposure region 16 is used as the read-ahead region for the focus position. The spacing in the X direction between the right edge of the exposure region 16 and the center of the read-ahead region 35 where light for detecting the position (hereinafter called an "autofocusing beam") is illuminated is La (see FIG. 2). Therefore, spacing Lb at the acceleration start position in FIG. 8 between the center of the read-ahead region 35 and the edge where the exposure of shot area Si is started is:

$$Lb = Lc - La \quad (3)$$

As an example, when scanning speed $V_{eX}$ in the exposure of the wafer is 50 mm/s, magnification $\beta$ of optical projection system PL is ⅕ (reduction projection), the acceleration $a_r$ of the reticle stage 9 at the starting of scanning is 200 mm/sec$^2$, and spacing La to the read-ahead region 35 of FIG. 8 is 10 mm, acceleration time $t_a$, acceleration distance Lc, and spacing Lb are, respectively, from the formulae (1)–(3):

$$ta = 50 \cdot 5/200 = 1.25 \text{ (sec)} \quad (4A)$$

$$Lc = (½) \cdot (200/5) \cdot 1.25^2 = 31.25 \text{ (mm)} \quad (4B)$$

$$Lb = 21.25 \text{ (mm)} \quad (4C)$$

In this case, because, in FIG. 8, at the time of starting acceleration, the read-ahead region 35 is at spacing Lb from the front edge of shot area Si to be exposed, a position at spacing Lb from the front edge of shot area Si is a region where there exists an exposable region on the wafer 15 or the substrate to which photoresist has been applied in order that the read ahead focus position is valid. In this case, the exposable region is simply defined by referencing the peripheral edge of the wafer 15. However, as described by referring to FIG. 4, because there is generally "sagging" with a width of about Lb at the outer periphery of the wafer 15, it may be possible to define a region excluding a ring-like region having a width of $L_p$ from the outer periphery of the wafer 15 as the exposable region. Furthermore, the exposable region may be defined at any other region.

The relationship between the exposable region and the shot region will be explained by referring to FIG. 10.

Figure 10:
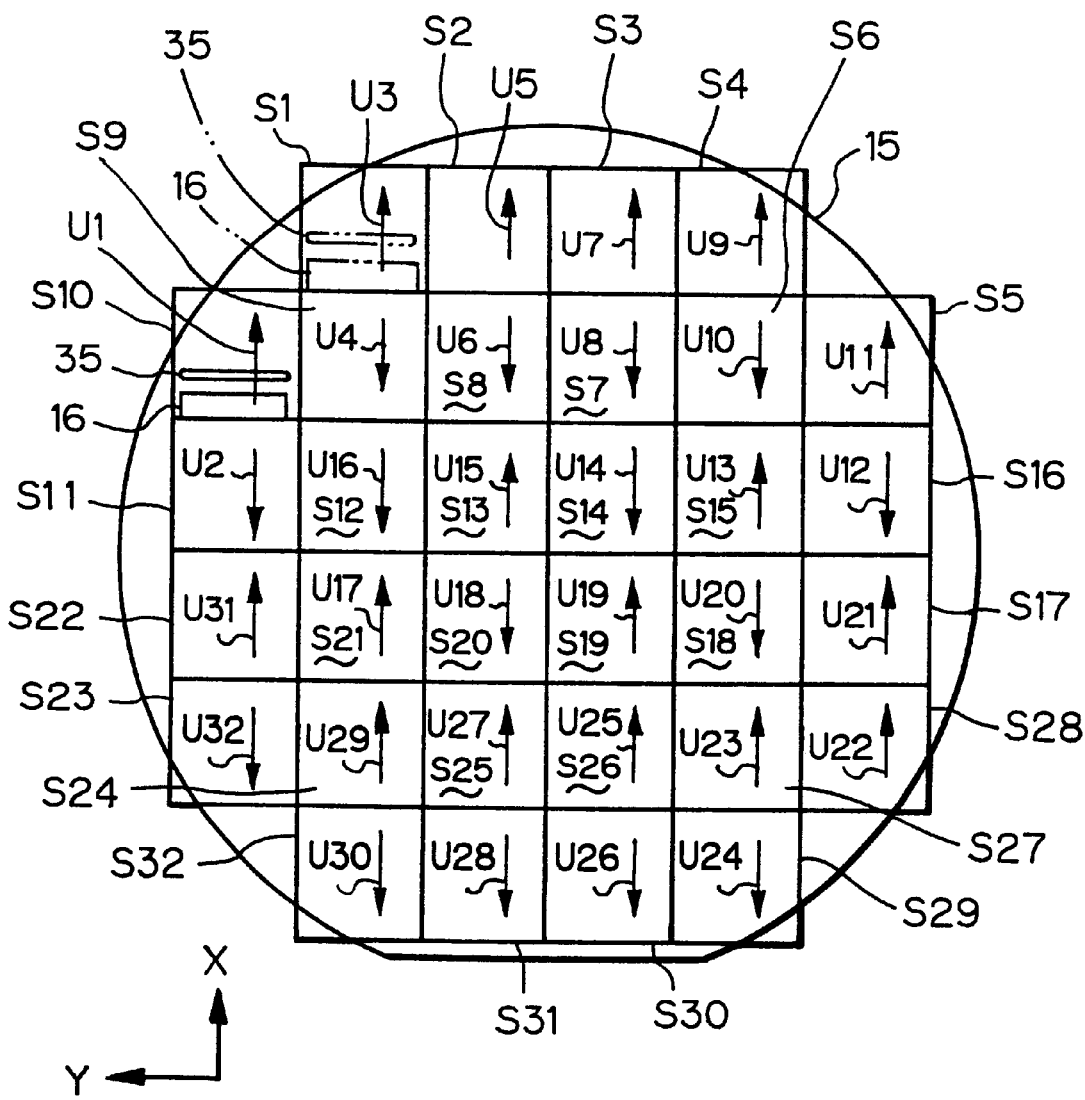
FIG. 10 is a plan view showing an example of exposure sequence for each shot area on the wafer 15 of an embodiment.

FIG. 10 shows an example of the exposure sequence for this embodiment. As shown in the figure, the exposure plane of the wafer 15 is formed with shot areas S1–S32 in a predetermined pitches in the X direction (scanning direction) and the Y direction. If exposure is to be performed for the second layer and later, each of shot areas S1–S32 is formed with the same chip pattern by the previous processes.

As an example, it is assumed that the exposable region is a region from which sagging having width $L_p$ is eliminated from the periphery of the entire exposure plane of the wafer 15. In this case, because shot areas S1, S4, S5, S10, S23, S28, S29, and S32 themselves protrude out of the periphery of the wafer 15, each of them is clearly to be a shot area which is not entirely included in the exposable region (hereinafter called a "missing area"). Also, as described by referring to FIG. 8, it is necessary that the read-ahead region 35 be established at a position at spacing Lb from the front edge of shot area Si, and it is also included in the exposable region.

That is, in an exposable region from which the sagging with width Lp is eliminated at the outer periphery of the wafer 15 shown in FIG. 10, a region further eliminated with a band region with width Lb in the X direction, the scanning direction, from the contour region becomes the substantial exposable region. In this case, since each shot area S2, S3, S30, and S31 on the outer periphery of the wafer 15 in FIG. 10 has a part protruding from the substantial exposable region, shot areas S2, S3, S30, and S31 are also considered as missing shot areas. In this embodiment, when missing shot areas S1–S4, S5, and S10 as well as S23, S28, and S29–S32 on the wafer 15 shown in FIG. 10 are exposed with the scanning exposure system, the wafer 15 is scanned so that the exposure region 16 moves from the inside to the outside relative to the wafer 15.

However, if widths Lp and Lb are narrow, shot areas S2, S3, S30, and S31 may be included in the substantial exposable regions. In such case, the scanning direction for shot areas S2, S3, S30, and S31 may be either in the X direction or the –X direction, but it is desirable to alternately reverse the scanning direction for the adjacent shot areas in the Y direction (nonscanning direction) in order that the reticle be reciprocatory moved. In this case, for example, the scanning direction is opposite for shot areas S2 and S3.

Here, for a shot area the scanning direction for which has been determined so that the exposure region 16 moves, for example, from the outside to the inside relative to the wafer 15, it may be acceptable that the XY stage 20 at the wafer is once stepwise driven to set the front edge of the shot area on the wafer 15 near the read-ahead region 34, and autofocusing is performed from the information on the focus position there. Then, after the wafer 15 is moved to the acceleration start position for scanning exposure while holding the focus position, scanning is started while holding the focus position until the read-ahead region 34 enters in that shot area. With this approach, even in a case where a large sagging partially remains inside the region with width Lp from the periphery of the wafer 15, the focus position for the shot area does not drift significantly.

Then, as shown in FIG. 7(a), at exposure time $t_{eX}$ after acceleration time $t_a$, the exposure is carried out while the travel speeds of the reticle and the wafer are respectively maintained at a constant scanning speed. Then, deceleration of the reticle and acceleration for the next exposure are carried out at acceleration or deceleration time $t_A$ after exposure time $t_{eX}$. However, this is the operation when the scanning direction for the reticle is inverted between the shot areas to be continuously exposed. In addition, as shown in FIG. 7(c), travel speed $V_{WY}$ of the XY stage 20 at the wafer in the Y direction varies within travel time $t_B$ during acceleration or deceleration time $t_A$ as required, to move the wafer 15 stepwise in the nonscanning direction (Y direction). The operations including such acceleration or deceleration of the reticle and the stepping in the nonscanning direction to be performed between the shot areas to be continuously exposed are the following four operations:

(A) Acceleration and deceleration of the reticle 7

(B) Stepping of the wafer 15 in the nonscanning direction (Y direction)

(C) Stepping of the wafer 15 in the scanning direction (X direction)

(D) Idle return of the reticle 7

The idle return of the reticle 7 in the last item means an operation where, when the scanning direction is the same for the shot areas to be continuously exposed, the reticle 7 is scanned once without exposure so as to scan the reticle 7 in the same direction. If the times necessary for the four operations (A)–(D) are $t_A$, $t_B$, $t_C$, and $t_D$, respectively, the relationship between these times is:

$$t_D > t_A > t_B \approx t_C \quad (5)$$

Figure 9A:
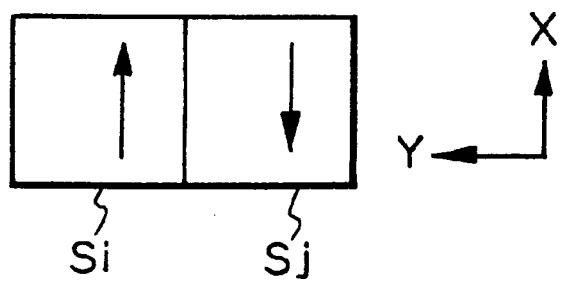
FIGS. 9(a)–9(c) consist of diagrams showing examples of combinations of a shot array and a scanning direction in continuously exposing adjacent shot areas with the scanning exposure type.
Figure 9B:
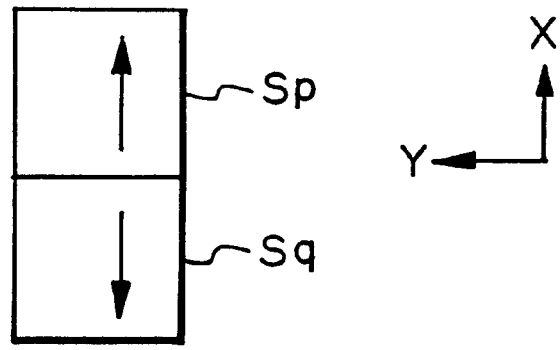
Figure 9C:
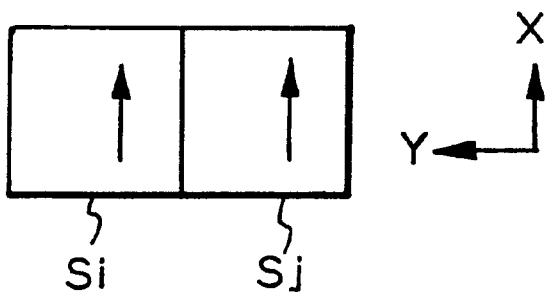

Therefore, the time necessary from the time when the scanning exposure completion time for a shot area on the wafer 15 previously exposed to the time when the exposure is started for the next shot area varies depending on the difference of placement of the shot areas and the difference of scanning directions for the reticles shown in FIGS. 9(a)–9(c). Each case will be explained in the following.

(1) Case where, as shown in FIG. 9(a), the exposure steps from a shot area Si to the adjacent shot area Sj in the nonscanning direction (Y direction), and the scanning direction for the reticle is reversed:

In this case, the above operations of (A) and (B) are performed. Of these, because the stepping in the nonscanning direction of (B) can be started at the same time when scanning exposure is completed, and completed within acceleration time $t_A$, time $T_1$ necessary from the scanning exposure completion time for shot area Si to the exposure start for next shot area Sj is:

$$T_1 = t_A \quad (6)$$

(2) Case where, as shown in FIG. 9(b), the exposure steps from shot area Sp to adjacent shot area Sq in the scanning direction (X direction), and the scanning direction for the reticle is reversed:

In this case, as shown in FIGS. 7(a) and 7(b), the XY stage 20 at the wafer 15 operates in full synchronization with the reticle stage 9, but the wafer 15 may take the following two possible operations: The first operation is to move the wafer 15 to the acceleration start position (scanning start position) for the next shot area at the same time with the completion of scanning exposure for a shot area, while the second operation is to step the wafer 15 only after the travel speed of the wafer 15 becomes zero by decelerating the wafer 15 in synchronization with the reticle 7. Although the former is advantageous for throughput, the latter is discussed here. In this case, time $T_2$ necessary from the completion of scanning exposure for shot area Sp to the starting of exposure for next shot area Sq is:

$$T_2 = t_A + t_C \quad (7)$$

In this case, even if an operation for stepping the wafer 15 in the nonscanning direction is included, because $(t_A+t_C)>t_B$, $T_2 = t_A+t_C$, and time $T_2$ remains same.

(3) Case where, as shown in FIG. 9(c), the scanning exposure is continuously performed in the same scanning direction by idle returning the reticle 7 when stepping from shot area Si to adjacent shot area Sj in the nonscanning direction:

In this case, the above-mentioned operations (A), (C), and (D) are performed. That is, the reticle 7 is decelerated after the completion of scanning exposure, and the reticle 7 is returned to the acceleration start position for the next shot area after travel speed $V_R$ reaches zero. Thus, time $T_3$ necessary from the completion of exposure for previous shot area Si to the starting of exposure for next shot area Sj is:

$$T_3 = t_A + t_D \quad (8)$$

When the relationship of the formula (5) substituted for formulae (6)–(8), there is the following relationship among time $T_1$–time $T_3$ necessary from the completion of exposure for the previous shot area to the starting of exposure for the next shot area in the operations of FIGS. 9(a)–9(c):

$$T_3 > T_2 > T_1 \quad (9)$$

As seen from formula (9), it can be said that the exposure sequence (shot map) stepping in the nonscanning direction and reversing the scanning direction between the adjacent shot areas, as shown in FIG. 9(a), is most advantageous for throughput. The exposure sequence most advantageous for throughput in this principle is the conventional exposure sequence shown in FIG. 5. However, the exposure sequence of FIG. 5 has poor control accuracy for the focus position and the inclination at the outer periphery of the wafer 15, and, therefore, is not employed in this embodiment.

In addition, as shown in FIG. 9(c), in the exposure sequence for scanning the next shot area in the same direction as the previous shot area after idle return of the mask or reticle 7, to idle return the reticle 7, it takes a very long time, substantially the same as the time from the starting of acceleration to the completion of deceleration. Therefore, it is desirable to avoid the idle return operation for the reticle 7. Then, this embodiment provides an exposure sequence which can avoid sagging at the outer periphery of the wafer 15, and does not include the idle return for the reticle 7.

FIGS. 6A and 6B are a flowchart showing an example of method for determining the exposure sequence in this embodiment. Exposure is performed for shot areas S1–S32 on the wafer 15 in FIG. 10 with the scanning exposure system according to this exposure sequence.

Typically, the main control system 13 creates an optimum shot map data corresponding to the outer shape of the wafer based on the outer dimensions of wafer, the size of the shot area, the step pitch, and the like before the first printing (exposure for the first layer). This shot map data represents how to arrange the shot areas in the wafer from the outer shape of wafer, is automatically determined by calculation, and is registered in memory as the stepping coordinates of the XY stage 20. The main control system 13 determines the scanning direction for each shot area based on the determined shot map data, and stored in memory. FIG. 10 shows one example of the shot map data determined in correspondence to the outer shape of wafer.

First, in step 81 in FIG. 6A, it is determined whether or not the scanning directions for shot areas S1–S4, S5, S10, S23, S28, and S29–S32 at the outer periphery of the wafer 15 are defined by using acceleration distance Lc calculated from the formula (2). On the one hand, when the acceleration distance is taken into account, in step 85, shot areas where the read-ahead region 34 (see FIG. 2) is not included in the substantial exposable region are found at the acceleration start position of the wafer 15 with respect to the slit exposure region 16. If acceleration distance Lc is long, such shot areas include all shot areas S1–S4, S5, S10, S23, S28, and S29–S32 in FIG. 10 so that the scanning direction for the wafer 15 is determined so that the exposure region 16 moves from the inside to the outside of the wafer 15. Then, the operation enters in step 84.

On the other hand, when the acceleration distance Lc is not taken into account in step 81, the operation enters in step 82 to determine the scanning direction for the wafer 15 so that the exposure region 16 moves equally from the inside to the outside of the wafer 15 for shot areas S1–S4, S5, S10, S23, S28, and S29–S32 at the outer periphery of the wafer 15 with respect to the scanning direction (X direction). Then, in step 83, the scanning direction for the wafer 15 is determined so that shot areas S9–S6, S16, S11, S22, S17, and S27–S24 inside from shot areas S1–S4, S5, S10, S23, S28, and S29–S32 at the outer periphery with respect to the scanning direction have a scanning direction opposite to the adjacent shot area at the outer periphery, respectively. Then, the operation enters step 84.

In step 84, the total number of shot areas on the wafer 15 (32 in the example of FIG. 10), the number of shot areas for which the scanning directions have been defined (24 after execution of steps 82 and 83), and the number of shot areas for which the scanning directions have not been defined are calculated. After execution of steps 82 and 83 for the example in FIG. 10, the shot areas for which the scanning directions have not been defined are the eight shot areas which are scanned along loci U13–U16 and U17–U20. Then, in step 85, the scanning direction for the wafer 15 is determined for the shot areas for which the scanning directions have not been defined so that the numbers of shot areas with different scanning direction are equal to each other; or the number of shot areas with either scanning direction (X direction or –X direction) becomes larger than for the other by one shot area, and the scanning direction for shot areas arranged in the nonscanning direction (Y direction) is alternately reversed.

After the execution of steps 82 and 83 for the example in FIG. 10, it is sufficient for the eight shot areas which are scanned along loci U13–U16 and U17–U20 to make the scanning direction for four shot areas the X direction and that for the remaining four shot areas the –X direction. It is sufficient that the scanning direction is alternately reversed for the shot areas being scanned along loci U13–U16, and that the scanning direction is also alternately reversed for loci U17–U20.

Then, the operation enters step 87 (FIG. 6B) to count the total number of shot areas on the wafer 15 (32 in FIG. 10), to determine whether they are even or odd, to enter step 88 if they are even as in FIG. 10, and to first expose any shot area (for example, shot area S10) with the scanning exposure system. Then, on the one hand, the operation enters step 90 to exposure shot area S11 with the scanning direction opposite to that for previous shot area S10, and to expose shot areas S1, S9, S3, . . . , S22, and S23 in this order so that the scanning direction is alternately reversed. On the other hand, in step 87, if the total number of shot areas is odd, the operation enters step 89 to first expose any shot area which belongs to the scanning direction for the shot areas in the number larger by one, and to enter in step 90. This completes the exposure for all shot areas S1–S32 on the wafer 15.

In this case, the locus of the travel of the exposure region 16 relative to the wafer 15 in the i-th (i=1–32) scanning exposure is represented by loci U1–U32 of FIG. 10. That is, as indicated by locus U1, the wafer 15 is first scanned so that the exposure region 16 moves in the X direction relative to shot area S10. That is, because the exposure region 16 is actually stationary, the wafer 15 is scanned opposite to the arrow of locus U1 (–X direction). At that moment, the focus position and inclination of the wafer 15 are corrected based on the focus position measured at the read-ahead region 35. Then, after exposure is performed for shot area S11 as indicated by locus U2, the wafer 15 is scanned so that the exposure 16 moves in the X direction relative to shot area S1 at the outer periphery as indicated by locus U3 to expose shot area S11. At that moment also, the focus position and inclination of the wafer 15 are corrected based on the focus position measured at the read-ahead region 35. Thereafter, the exposure is performed in the order of loci U4, U5, . . . , U31, U32.

As described above, according to this embodiment, the wafer 15 is scanned so that the exposure region 16 moves from the inside to the outside of the wafer 15 for each of shot areas S1–S4, S5, S10, S23, S28, S29–S32 at the outer periphery of the wafer 15. Therefore, even if sagging occurs on the outer periphery of the wafer 15, data of the focus position measured at the read-ahead region 34 or 35 does not indicate an erroneous value at the initial stage of the scanning exposure so that the adjustment of focus position of the wafer 15 (autofocusing) and the adjustment of inclination (autoleveling) are accurately performed. In addition, in a case where the operation of step 85 in FIG. 6 is selected, when exposure is performed for missing shot areas in the exposure region 16 and the read-ahead region 34 (or, 35) at least a part of which are not fully included in the exposable regions (or, substantial exposable regions), the wafer 15 is scanned so that the exposure region 16 moves from the inside to the outside of the wafer 15, and thus the autofocusing and autoleveling of the wafer 15 are accurately performed.

In the exposure sequence of FIG. 10, the exposure region 16 relatively moves in the X direction along locus U13 in the shot area S15 because the shot area of locus U13 is exposed next to shot area S16 scanned along locus U12. Actually, because it is sufficient for shot areas S12–S15 and S18–S21 that the condition for alternately reversing the scanning direction is satisfied, the scanning direction for shot area S15 may be arbitrary, and may be the direction along locus U13 or opposite to it. The scanning direction may also be arbitrary for shot area S21, and may be the direction along locus U17 or opposite to it.

Furthermore, although, in FIG. 10, the exposure is started from shot area S10 where the exposure region 16 is moved in the X direction (the wafer 15 being scanned in the –X direction), because the total number of shot areas is even in FIG. 10, the exposure may be started from a shot area where the exposure region 16 is moved in the –X direction (for example, S11), and the order of exposure is also arbitrary, provided that only the condition for alternately reversing the scanning direction is satisfied.

However, as for step 83 in FIG. 6, if, as seen in the example of FIG. 10, there are two or more shot areas in the scanning direction between one group of shot areas S10, S1–S4, and S5 at the outer periphery of the wafer 15 and the other group of shot areas S23, S32–S29, and S28, the scanning direction may be reversed from that for the outer periphery for those inside the shot areas at the outer periphery by applying step 83. However, if there are three rows or ranks of shot areas arranged in the scanning direction on the wafer 15, the step 83 cannot be applied.

Figure 11:
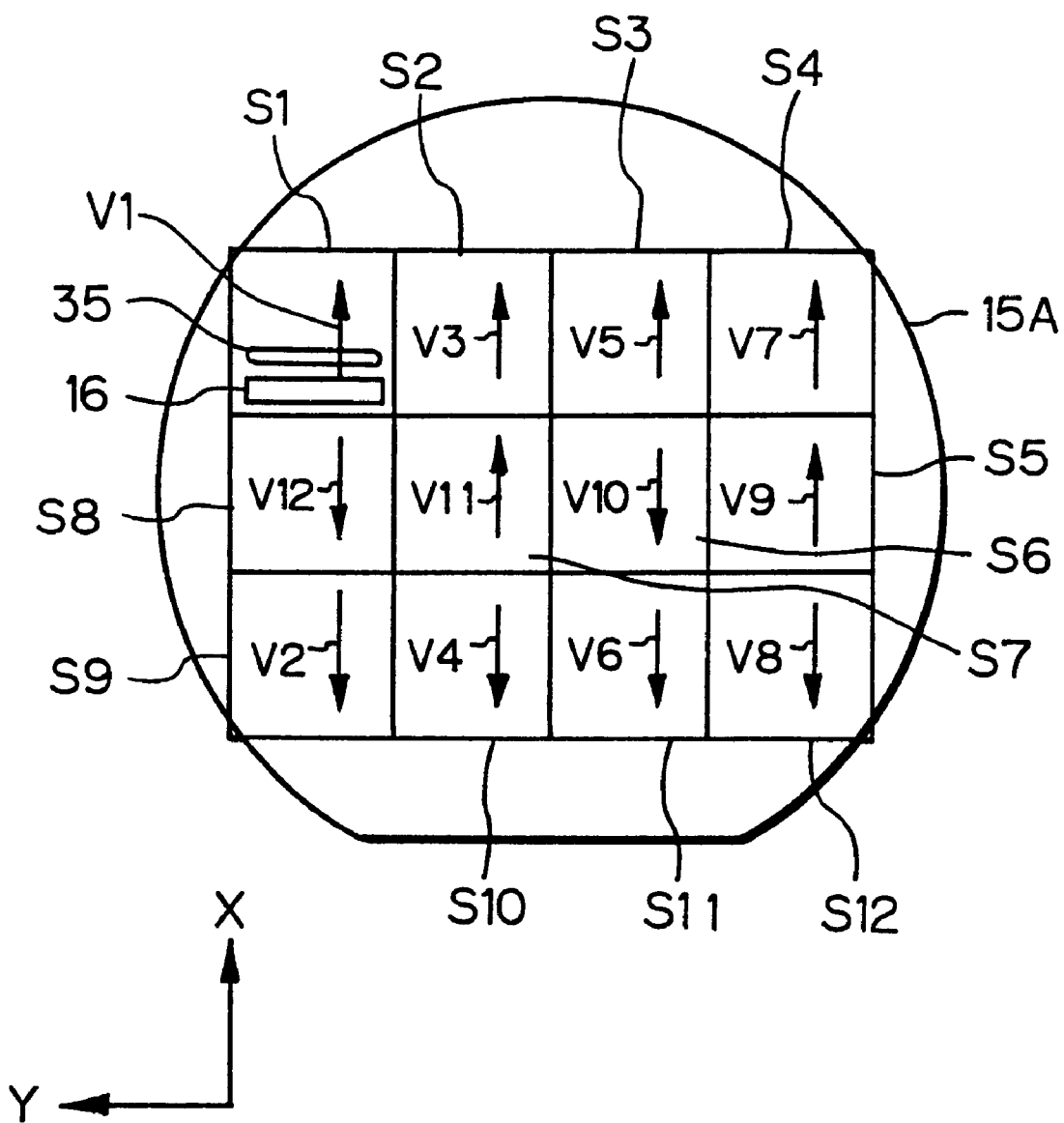
FIG. 11 is a plan view showing an example of exposure sequence for each shot area on the wafer 15A of the embodiment.

FIG. 11 shows a wafer 15A on which three shot areas are arranged in the scanning direction (X direction). In this figure, twelve shot areas S1–S12 are arranged on the wafer 15A in three rows in the X direction (as seen from FIG. 11). In this case, the scanning directions for one group of shot areas S1–S4 at the outer periphery and the other group of shot areas S9–S12 are set in a direction where the exposure region 16 moves from the inside to the outside of the wafer 15A. Then, if it is assumed that the scanning direction for inner shot areas S5–S8 is opposite to that for shot areas S1–S4, the scanning direction for inner shot areas S5–S8 becomes the same as that for shot areas S9–S12. In addition, the number of shot areas in which the scanning direction for the exposure region is in the X direction differs from that of shot areas in which the scanning direction for the exposure region is in the –X direction by two, and it is necessary to idle return the reticle with the result that the throughput is deteriorated.

Then, in a case such as that shown in FIG. 11, because the number of shot areas is twelve (even), the exposure sequence is established to satisfy the conditions that the number of shot areas having scanning directions opposite to each other is equal, and that the shot areas having scanning directions opposite to each other are alternately exposed. As a result, the wafer 15A is first exposed so that the exposure region 16 moves in the X direction relative to the shot area S1 as indicated by the locus V2. At that moment, the focus position and inclination of the wafer 15A are corrected based on the focus position measured at the read-ahead region 35. Then, the exposure is performed by scanning the exposure region 16 relative to shot area S9 as indicated by locus V2. Thereafter, the exposure is performed in the order of loci V3, V4, . . . , V11, V12 by alternately reversing the scanning direction. Therefore, the exposure is performed for inner shot areas S5–S8 in such a manner that the scanning direction is alternately reversed.

In a case where there are shot areas only in one row on the wafer, there is a possibility of the autofocusing and the autoleveling not being able to follow up, but it may be sufficient to scan in an arbitrary direction not to deviate the control error.

It is a matter of course that the present invention is not limited to the above embodiment, but may take various arrangements not departing from the spirit of the present invention.

Figure 12:
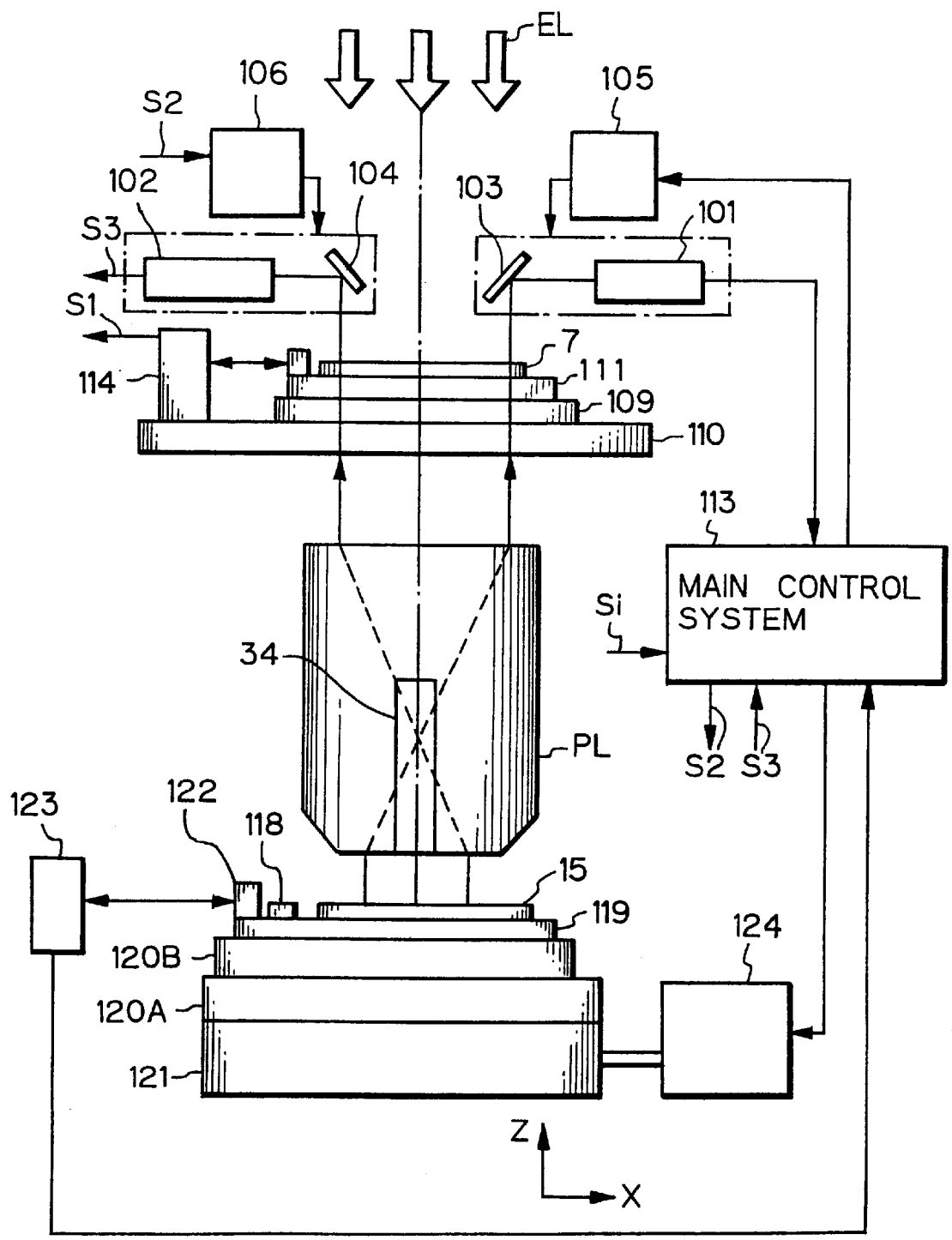
FIG. 12 is an arrangement of a projection exposure apparatus to which an embodiment of the scanning exposure method according to the present invention is applied.

FIG. 12 shows a projection exposure apparatus used by the second embodiment of the present invention. In the figure, a pattern on the reticle 7 is radiated by a rectangular illumination region (hereinafter called a "slit-shaped or slit-like illumination region") by exposure light EL from a illumination optical system (not shown in the figure), and the image of the pattern is projected and exposed onto the wafer 15 through optical projection system PL. In this case, if the Y axis is taken in a direction normal to the sheet in FIG. 12, the wafer 15 is scanned at a constant speed V·β (β is the magnification of the optical projection system 8) in the −Y direction (or, +Y direction) in synchronization with the scanning of the reticle 7 in the +Y direction (or, −Y direction) at constant speed V with respect to the slit-shaped or slit-like illumination region of exposure light EL. The magnification of projection is, for example, ¼ or ⅕.

The drive system for the reticle 7 and the wafer 15 is described. A reticle Y axis drive stage 109 is installed on a reticle support or base 110 movable in the Y axis direction. Mounted on the reticle Y axis drive stage 109 is a reticle fine drive stage 111 on which the reticle 7 is held by a vacuum chuck and the like. The reticle fine driving stage 111 controls the position of the reticle 7 by a minimal amount and at high accuracy in the X direction, the Y direction, and the direction of rotation (θ direction) in the plane normal to the optical axis of optical projection system PL and parallel to the sheet shown in FIG. 12. A movable mirror 112 is placed on the reticle fine drive stage 111, and an interferometer 114 placed on the reticle support 110 continuously monitors the positions of the reticle fine drive stage 111 in the X direction, the Y direction, and the θ direction. Positional information S1 obtained from the interferometer 114 is supplied to the main control system 113A.

Furthermore, installed on the wafer support or base 121 is a wafer Y axis drive stage 120A movable in the Y axis direction on which a wafer X axis driving stage 120B is installed movable in the X axis direction on which a Z leveling stage 119 is installed. The wafer 15 is held on the Z leveling stage 119 by vacuum suction. A movable mirror 122 is also secured on the Z leveling stage. An interferometer 123 positioned externally monitors the positions of the Z leveling stage 119 in the X direction, the Y direction, and the θ direction. The positional information obtained from the interferometer 123 is also supplied to the main control system 113. The main control system 113 controls positioning of the wafer Y axis drive stage 120A, the wafer X axis drive stage 120B, and the Z leveling stage 119 through a wafer drive device 124 and the like, and controls the operation of the entire apparatus.

Furthermore, a reference mark plate 118 is secured near the wafer 15 on the Z leveling stage 119 so as to correlate the wafer coordinate system defined by the coordinates measured by the interferometer 123 for the wafer and the reticle coordinate system defined by the coordinates measured by the interferometer 114 for the reticle. Various reference marks are formed on the reference mark plate 118. The reference marks include a reference mark back-lighted by illumination light guided to the Z leveling stage 119, that is, a light emitting reference mark.

Reticle alignment microscopes 101 and 102 are installed above the reticle 7 of this embodiment for simultaneously observing the reference marks on the reference mark plate 118 and marks on the reticle 7. In this case, deflection mirrors 103 and 104 are movably positioned for guiding the detection light from the reticle 7 to each of the reticle alignment microscopes 101 and 102. Once the exposure sequence is started, the deflection mirrors 103 and 104 are evacuated from the path of exposure light EL by mirror drive devices 105 and 106 under a command from the main control system 113.

The scanning exposure projection exposure apparatus of FIG. 12 is equipped with a multipoint focus position detection system of an oblique incidence type. The multi-point focus position detection system of this embodiment is proposed by U.S. Ser. No. 172,098 filed on Dec. 23, 1994 by the assignee of this application and is of a read-ahead type detecting the focus position of the wafer (position in the direction of optical axis of optical projection system PL) in the exposure region, and before the exposure region with respect to the scanning direction, respectively.

Figure 13:
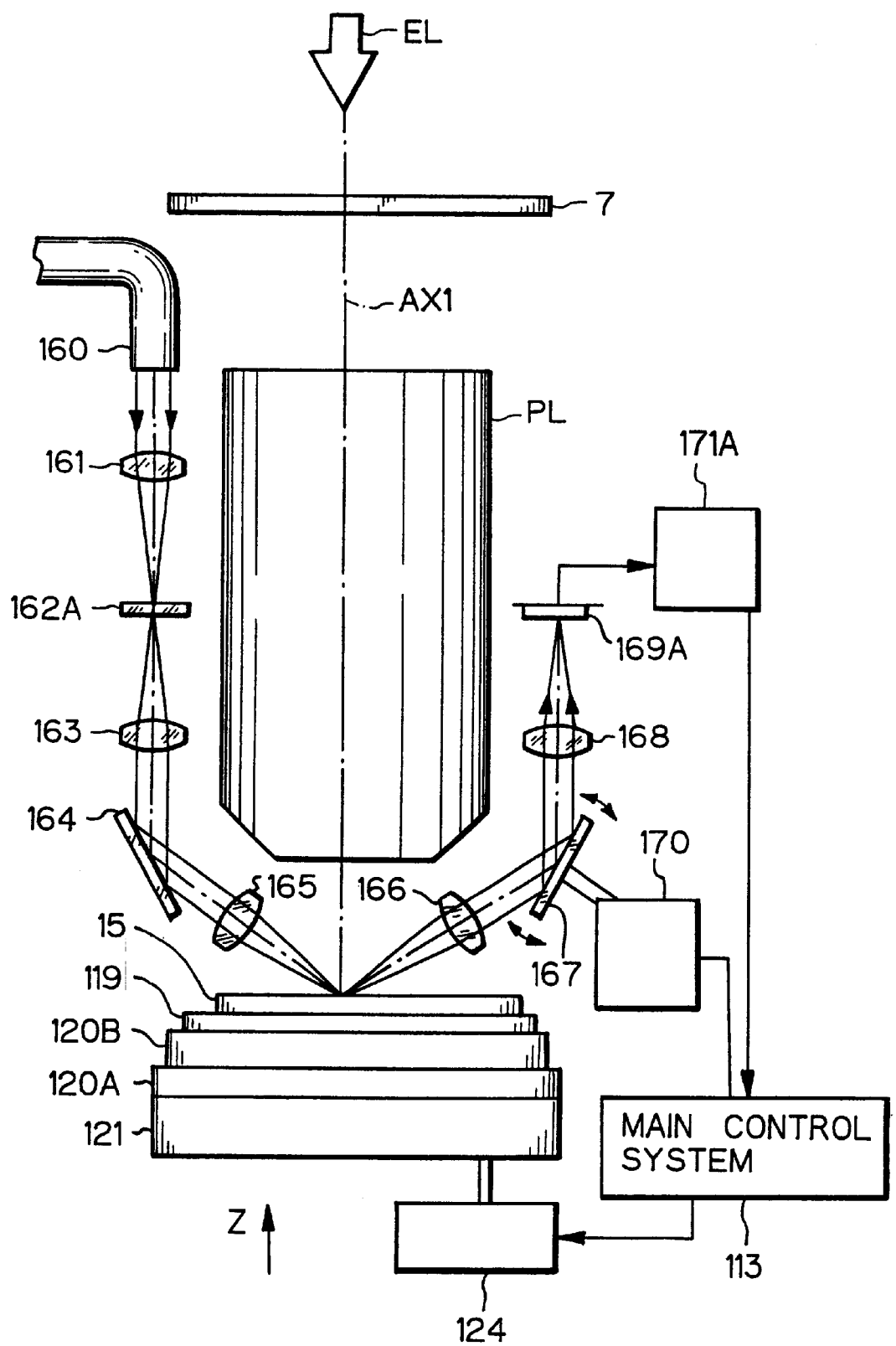
FIG. 13 is an arrangement showing the optical system of a multipoint focus position detection system of the projection exposure apparatus shown in FIG. 12.

FIG. 13 shows the optical system of the multipoint focus position detection system of this embodiment. In this figure, the pattern formation plane (reticle plane) on the reticle 7 has to be conjugate to the exposure plane of the wafer 15 with respect to the optical projection system PL, but the reticle plane is not varied so much. Thus, whether or not the exposure plane of the wafer 15 matches the imaging plane of optical projection system PL within the depth of focus (whether it is focused) is only detected by the oblique incidence type multipoint focus position detection system, and the focus position and inclination of the exposure plane of the wafer 15 are controlled based on the detection result.

In the multipoint position detection system, illumination light unlike exposure light EL not photo-sensitive to the photoresist on the wafer 15 is guided from the illumination light source through an optical fiber bundle 160. The illumination light emitted from the optical fiber bundle 160 radiates a pattern formation plate 162A through a condenser lens 161. The illumination light passed through the pattern formation plate 162A is projected onto the exposure plane of the wafer 15 through a lens 163, a mirror 164, and an illumination object lens 165. The image of pattern on the pattern formation plate 162A is projected and imaged onto the exposure plane of the wafer 15 with inclination with respect to optical axis AX1 of optical projection system PL. The illumination light reflected on the wafer 15 is reprojected onto the light receiving plane of the light receiving device 169A through a condenser object lens 166, a rotational direction oscillating plate 167, and the imaging lens 168, while the image of pattern on the pattern formation plate 162A is reimaged on the light receiving plane of the light receiving device 169A. In this case, the main control system 113 provides oscillation described later for the rotational direction oscillating plate 167 through an oscillator 170, and detection signals from a number of light receiving elements of the light receiving device 169A are supplied to a signal processor 171A. The signal processor 171A supplies to the main control system 113 a number of focus signals obtained by synchronous detection of each detection signal with the drive signal from the oscillator 170.

Figure 14A:
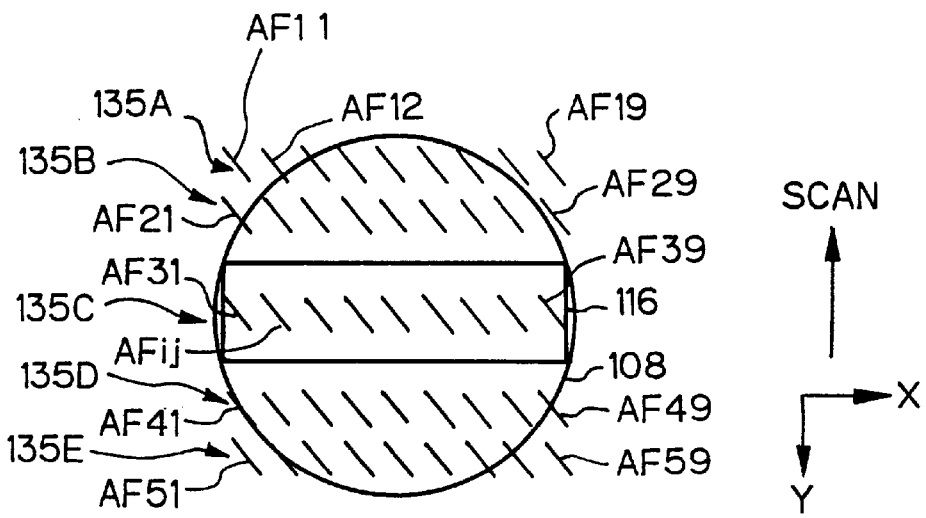
FIG. 14(a) is a plan view showing slit-shaped aperture pattern images projected in a two-dimensional array onto an area including an exposure field by the optical projection system in the embodiment.
Figure 14B:
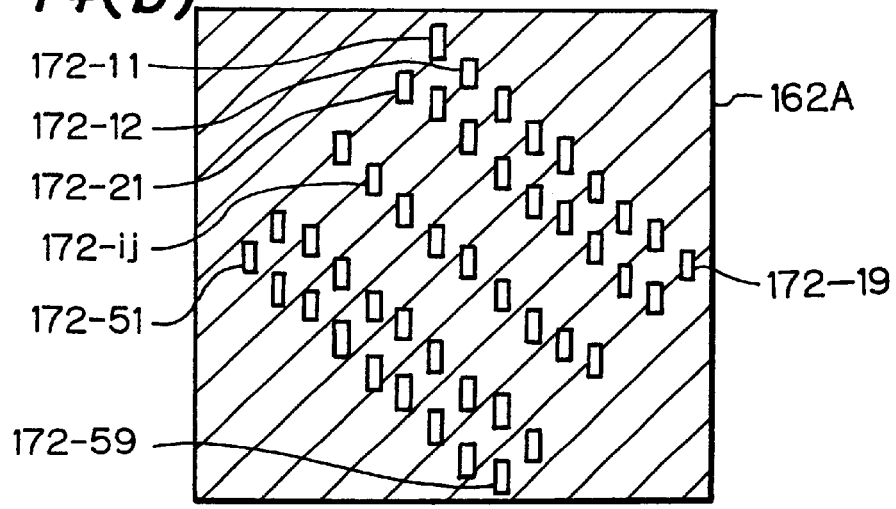
FIG. 14(b) is a view showing an aperture pattern on a pattern formation plate of the multipoint focus position detection system.

FIG. 14(b) shows the pattern formation plate 162A of this embodiment of FIG. 13. As shown in the figure, the first row of the pattern formation plate 162A is formed with nine slit-like aperture patterns 172-11–172-19, and the second to fifth rows with nine aperture patterns 172-21–172-59, respectively. That is, the pattern formation plate 162A is formed with 45 slit aperture patterns in total, and the images of these slit-like aperture patterns are projected onto the exposure plane of the wafer 15 shown in FIG. 13 with inclination to the X and Y axes.

FIG. 14(a) shows the exposure plane of the wafer 15 below optical projection system PL of this embodiment. In the figure, the pattern of the reticle 7 shown in FIG. 13 is exposed in a rectangular exposure field or region 116 longer in the X direction and inscribing a circular illumination field of optical projection system PL. The wafer 15 is scanned in the Y direction with respect to the exposure field 116. The multipoint focus position detection system of this embodiment projects the image of the slit-like aperture pattern onto a read-ahead region 135A consisting of nine measurement points AF11–AF19 on the first row extending in the X direction in the upper area of the exposure field 116 in the Y direction, a read-ahead region 135B consisting of measurement points AF21–AF29 on the second row in the exposure field 116, a measurement region 135C consisting of measurement points AF31–AF39 on the third row in the exposure field 116, a read-ahead region 135D consisting of measurement points AF41–AF49 on the fourth row in the lower area of the exposure field 116 in the Y direction, and a read-ahead region 135E consisting of measurement points AF51–AF59 on the fifth row.

Figure 14C:
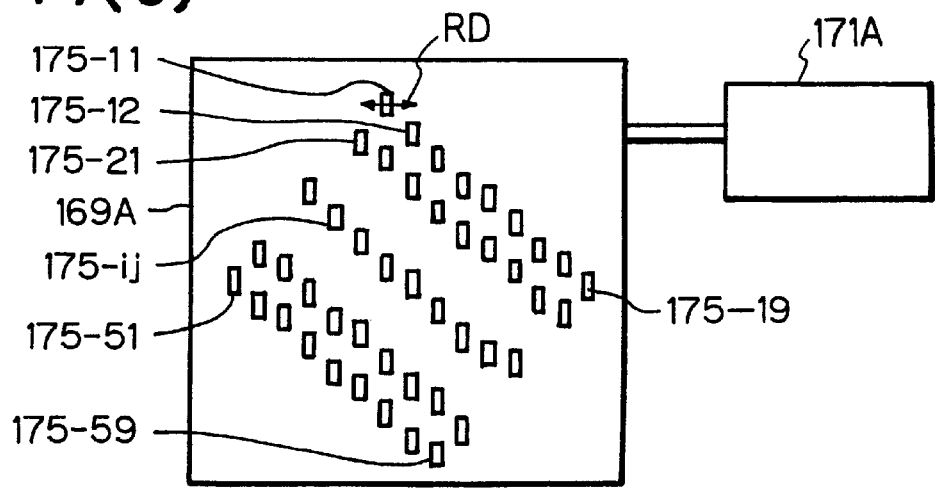
FIG. 14(c) is a view showing the array of light receiving elements on the light receiving device.

FIG. 14(c) shows the light receiving device 169A of the multipoint focus position detection system of this embodiment. Nine light receiving elements 175-11–175-19 are arranged on the first row of the light receiving device 169A, and light receiving elements 175-21–175-59 are arranged on the second to the fifth rows with nine elements for each row. That is, 45 light receiving elements in total are arranged on the light receiving device 169A, and a slit-like diaphragm (not shown) is arranged on each light receiving element. The images of slit-like aperture patterns projected on measurement points AF11–AF59 shown in FIG. 14(a) are reimaged on light receiving elements 175-11–175-59, respectively. The detection signal from each of light receiving elements 175-11–175-59 is supplied to the signal processor 171A. The position of each reimaged image is oscillated on the light receiving device 169A in an RD direction, which is the width of the diaphragm, by oscillating the light reflected on the exposure plane of the wafer 15 by the rotational direction oscillating plate 167 of FIG. 13.

In addition, the image of slit aperture on each of measurement points AF11–AF59 shown in FIG. 14(a) is projected with inclination with respect to the optical axis of the optical projection system PL. Thus, when the focus position of the exposure plane of the wafer 15 varies, the reimaging position of these projected images on the light receiving device 169A changes in the RD direction. Therefore, in the signal processor 171A, 45 focus signals corresponding to the focus positions of the measurement points AF11–AF59, respectively, can be obtained by synchronously detecting the detection signal from each of light receiving elements 175-11–175-59 with the oscillating signal from the direction of the rotation oscillation plate 167. The inclination (leveling angle) and average focus position of the wafer are calculated from predetermined focus signals of these 45 focus signals in a manner described later. The measured leveling angle and focus position are supplied to the main control system 113 shown in FIG. 12. The main control system 113 sets the leveling angle and focus position of the wafer 15 base on the supplied leveling angle and focus position through the drive device 124 and the Z leveling stage 119.

Figures 15A, 15B:
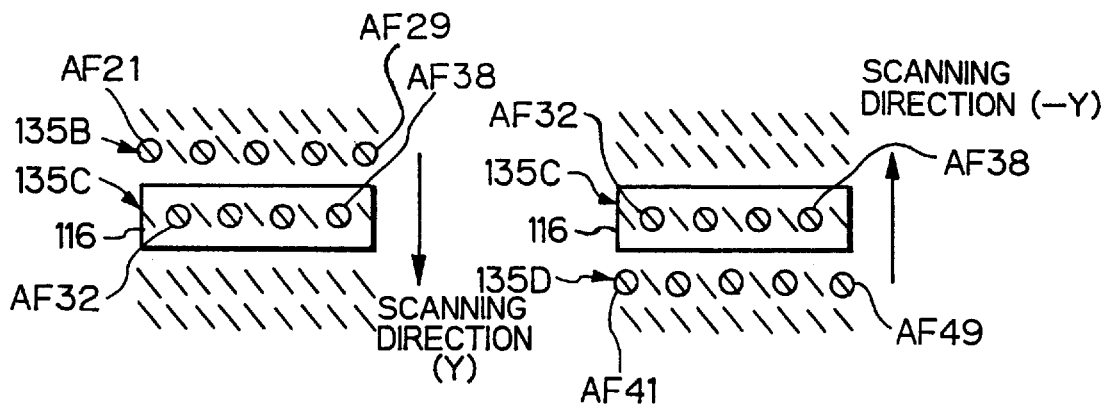
FIG. 15(a) is a view showing sampling points in performing additional read-ahead in the embodiment.
FIG. 15(b) is a view showing sampling points in scanning in the opposite direction and in performing division and read-ahead.

Therefore, in this embodiment, it is possible to measure the focus positions for all of 45 measurement points AF11–AF59 shown in FIG. 14(a). However, in this embodiment, as shown in FIGS. 15(a) and 15(b), the position of a point actually measuring the focus position among the 45 measurement points (hereinafter called "sampling points") is changed depending on the scanning direction for the wafer. In addition, this embodiment includes a read-ahead mode, which reads ahead to the focus position only with a read-ahead region 135A or 135B (or, 135E or 135D), and an additional and read-ahead mode, which measures the focus position also with the measurement region 135C in the exposure field 116 in addition to these read-ahead regions. First, in the simple read-ahead mode, measurement is performed by using all measurement points AF41–AF49 in the read-ahead region 135D as the sample points when, for example, the wafer is scanned in the −Y direction. Contrarily, when the wafer is scanned in the +Y direction, the measurement points in the read-ahead region 135B (or, 135A) becomes the sampling points. If the read-ahead region 135D (or, 135B) is too close to the exposure field 116 because the exposure field 116 is wide in the Y direction, or if the scanning speed for the wafer is high, the measurement points in the read-ahead region 135E (or, 135A) before the read-ahead region 135D (or, 135B) with respect to the scanning direction is sometimes used as sampling points. This is also true for the additional read-ahead mode in the following.

Next, in additional read-ahead mode, as shown in FIG. 15(a), when the wafer is scanned in the +Y direction with respect to the exposure field 116, odd-numbered measurement points AF21, AF23, . . . , AF29 in the read-ahead region 135B, and even-numbered measurement points AF32, AF34, . . . , AF38 in the measurement region 135C within the exposure field 116 become the sampling points. Contrarily, as shown in FIG. 15(b), when the wafer is scanned in the −Y direction with respect to the exposure field 116, odd-numbered measurement points AF41, AF43, . . . , AF49 in the read-ahead region 135D, and even-numbered measurement points AF32, AF34, . . . , AF38 in the measurement region 135C within the exposure region 116 become the sampling points.

Furthermore, either in the read-ahead mode or the additional read-ahead mode, the measurement results of the focus position during the scanning exposure successively change according to the transition coordinates of the stage at the wafer. The measurement results of the focus position are stored in storage in the main control system 113 in FIG. 12 as a two-dimensional map consisting of coordinates in the scanning direction of the stage (Y direction) and coordinate of the measurement points in the nonscanning direction (X direction). The focus position and leveling angle of the wafer during exposure are calculated by using the thus-stored measurement results. Then, when the focus position and leveling angle of the wafer is actually established by driving the Z leveling stage 119 shown in FIG. 12, the operation of the Z leveling stage 119 is controlled by open loop control according the measurement results.

The scanning speed of the reticle and wafer is not constant but is changed according to sensitivity of the photoresist on the wafer. In the case where the scanning speed is changed it is desirable to carry out data-processing as will be explained below. At first either in the read-ahead mode or in the additional read-ahead mode, the measurement results (measured data) at the focus position at the time of scanning exposure are successively stored in the addresses in the buffer memory within the main control system 113 with the predetermined sampling frequency in synchronization with movement of the stage for the wafer. Information regarding the scanning speed $V_W$ of the stage for the wafer and the distance $G_{SC}$ in the scanning direction between the center of the read-ahead region and the center of the exposure field is supplied to the main control system shown in FIG. 12. In the main control system, when the Z-leveling stage shown in FIG. 12 is actually moved to set the focusing position and the leveling angle of the exposure surface of the wafer after the scanning exposure is initiated, the measurement results stored beforehand by the time designated by (distance $G_{SC}$/scanning speed $V_W$) with respect to the address to which the present data obtained by the read-ahead system are stored in the buffer memory. Operation of the Z-leveling stage 119 is controlled using the results read ahead with an open loop control method. With this procedure accurate focusing of the wafer is carried out even if the scanning speed changes.

Figures 16A, 16B:
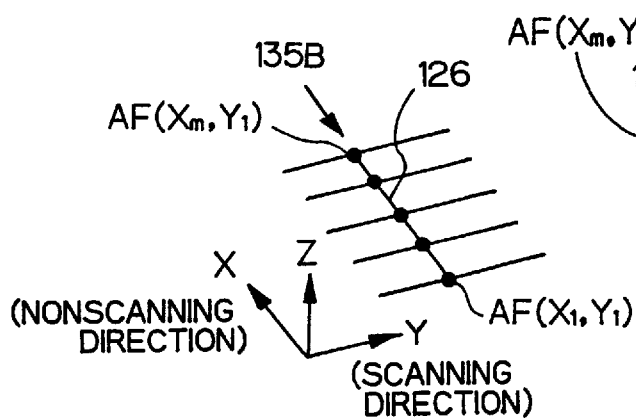
FIGS. 16(a) and 16(b) are views explaining exposure using the read-ahead focus position.

In this case, in the read-ahead mode, exposure in the exposure field 116 is performed based on the previously measured results. That is, on the other hand, as shown in FIG. 16(a), when, for example, the wafer is scanned in the +Y direction, the focus position for the region 126 on the wafer is measured at the predetermined sampling points in the read-ahead region 135B on the second row. Then, when the region 126 on the wafer enters the exposure field 126, as shown in FIG. 16(b), the focusing and leveling for the region 116 on the wafer are controlled based on the measurement result in FIG. 16(a). On the other hand, in the additional read-ahead mode, when the focusing and leveling are controlled for the region 126, as shown in FIGS. 15(a) and 15(b), the sampling points in the measurement region 135C within the exposure field 116, that is, data of the focus position to be measured in the region 126 during the exposure are used together. In this additional read-ahead mode, the measurement data in the measurement region 135C within the exposure field 116 is used for correction of follow-up error (difference of attitude between the exposure plane of the wafer and the imaging plane of the optical projection system).

Figure 17:
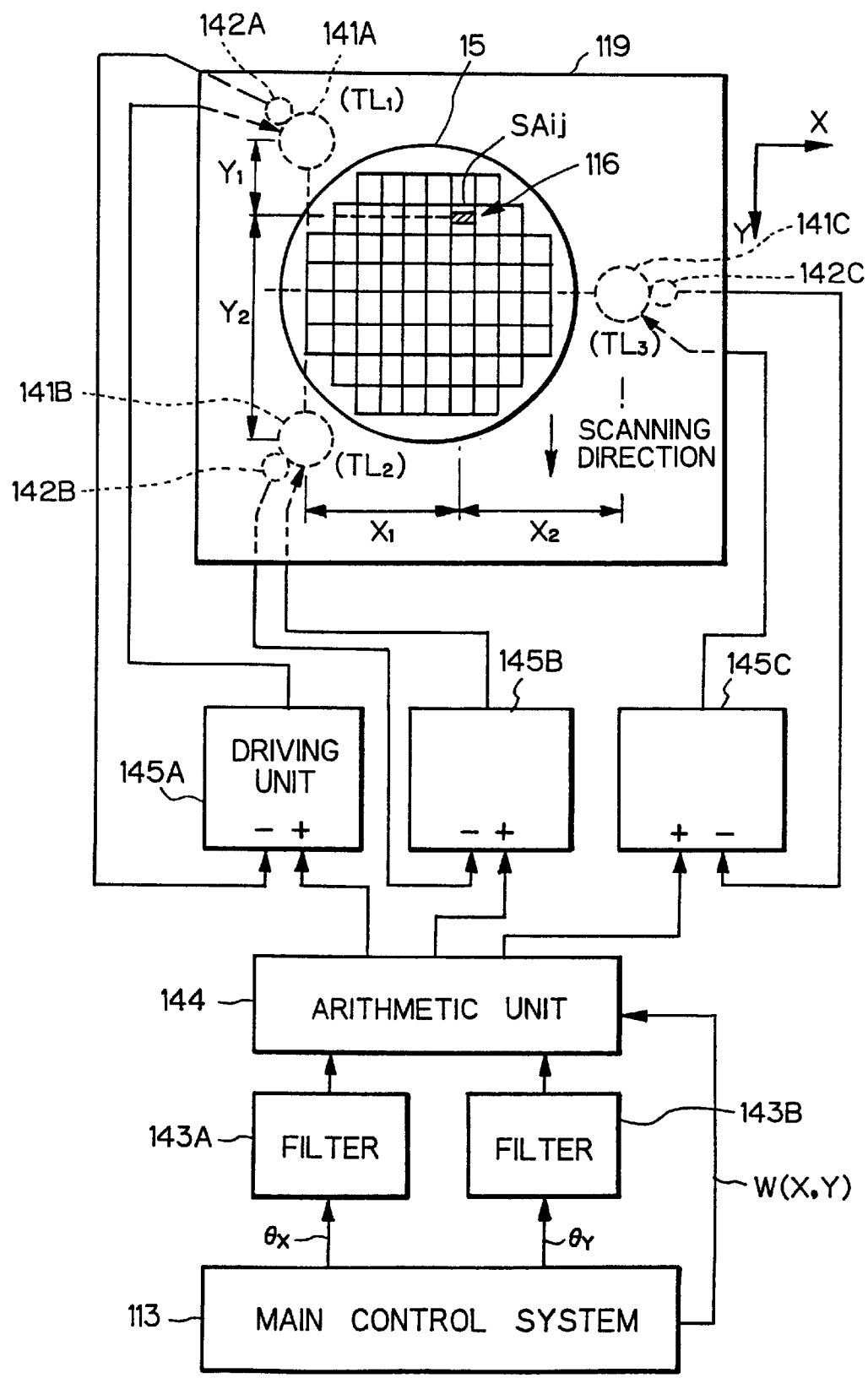
FIG. 17 is an arrangement showing mechanisms for autofocusing and autoleveling, and their control.

FIG. 17 shows the Z leveling stage 119 of this embodiment and its control system. In this figure, the upper member of the Z leveling stage 119 is supported on the lower member through three support points 141A–141C which are extendable in the focusing direction (Z direction). Adjustment of each of the support points 141A–141C enables it to set at a desired value the focus position of the exposure plane of the wafer 15 on the Z leveling stage 119, the inclination $\theta_Y$ in the scanning direction, and the inclination $\theta_X$ in the nonscanning direction. Installed near each of support points 141A–141C are each of height or level sensors 142A–142C which can measure the displacement of each support point in the focusing direction with a resolution of, for example, 0.01 μm. It may be possible to provide a high-accuracy mechanism with a longer stroke as a positioning mechanism in the focusing direction (Z direction).

To control the leveling of the Z leveling stage 119, the main control system 113 supplies inclination $\theta_X$ to filters 143A and 143B in the nonscanning direction to be established and inclination $\theta_Y$ in the scanning direction to be established which vary each moment. The filters 142A and 142B supply inclinations, which are obtained by filtering with different filter characteristics, to an arithmetic unit 144, and the main control system 113 supplies to the arithmetic unit 144 the coordinates W (X, Y) of a region to be exposed on the wafer 15. In addition, the main control system 113 also supplies to the arithmetic unit 144 the information on the focus position of the exposure plane of the wafer to be established. The arithmetic unit 144 supplies to driving units 145A–145C the information on displacement to be established based on the coordinates W (X, Y), the focus position, and two inclinations. The height sensors 142A–142C supply the information on the current height of the support points 141A–141C to the driving units 145A–145C, respectively, which set the height of the support points 141A–141C at the height established by the arithmetic unit 144.

Thus, the inclinations of the exposure plane of the wafer 15 in the scanning direction and in the nonscanning direction are set at the desired values, respectively.

In addition, if the locations where the support points 141A, 141B, and 141C are positioned are called drive points TL1, TL2, and TL3, then drive points TL1 and TL2 are positioned on a straight line parallel to the Y axis, and drive point TL3 is positioned on a vertical bisector between drive points TL1 and TL2. Furthermore, if the slit-like exposure region 116 exposed by the optical projection system is positioned on shot area $SA_{ij}$ on the wafer 15, in this embodiment, the focus position of shot area $SA_{ij}$ does not change when the leveling of the wafer 15 is controlled through the support points 141A–141C. Therefore, the leveling and focusing are controlled separately. In addition, the focus position of the exposure plane of the wafer 15 is set by displacing the three support points 141A–141C by the same amount.

The leveling and focusing in this embodiment will be described in detail in the sections that follow. First, the calculation methods for the inclination for leveling and the inclination for focusing are described.

(A) Calculation of Inclination

As shown in FIGS. 16(a) and 16(b), in each row of measurement points, the X coordinate of the m-th sampling point in the nonscanning direction is represented as $X_m$, the Y coordinate of the n-th sampling point in the scanning direction as $Y_n$, the value of a focus position measured at a sampling point with X coordinate $X_m$ and Y coordinate $Y_n$ as AF $(X_m, Y_n)$. Moreover, the following calculation is performed, assuming that the number of samples in the nonscanning direction is M, and the number of samples in the scanning direction is N. In the calculation, the $\Sigma_m$ indicates the sum of 1–M for script m:

$$SX = \Sigma_m X_m, \; SX2 = \Sigma_m X_m^2, \; SMZ = \Sigma_m AF(X_m, Y_n), \; SXZ = \Sigma_m (AF(X_m, Y_n) \cdot X_m) \quad (10)$$

Similarly, the following calculation is performed by assuming that sum $\Sigma_n$ indicates a sum of 1–N for script n:

$$SY = \Sigma_n Y_n, \; SY2 = \Sigma_n Y_n^2, \; SNZ = \Sigma_n AF(X_m, Y_n), \; SYZ = \Sigma_n (AF(X_m, Y_n) \cdot X_n) \quad (11)$$

Then, the following calculation is performed by using the formulae (10) and (11):

$$An=(SX \cdot SMZ-M \cdot SXZ)/(SX^2-M \cdot SX2) \qquad (12)$$

$$Am=(SY \cdot SNZ-N \cdot SYZ)/(SY^2-N \cdot SY2) \qquad (13)$$

Then, inclination AL $(Y_n)$ in the nonscanning direction (X direction) at the n-th sampling point is found from each An by the least squares approximation, and inclination AL $(X_m)$ in the scanning direction (Y direction) at the m-th sampling point is found from each Am by the least squares approximation. Then, inclination $\theta_X$ in the nonscanning direction and inclination $\theta_Y$ in the scanning direction are found by the averaging process as follows:

$$\theta_X=(\Sigma_n AL(Y_n))/N \qquad (14)$$

$$\theta_Y=(\Sigma_m AL(X_m))/M \qquad (15)$$

(B) Calculation of focus position

The calculation of the focus position includes the averaging process method and the maximum-minimum detection method. In this embodiment, the focus position is detected by the maximum-minimum detection method. For reference, the averaging process method uses the above-mentioned value of focus position AF $(X_m, Y_n)$ to calculate the focus position <AF> for the exposure plane of the wafer 15 as a whole from the following formula:

$$<AF>=(\Sigma_n \Sigma_m AF(X_m,Y_n))/(M \cdot N) \qquad (16)$$

Then, in the maximum-minimum detection method, focus position AF' for the exposure plane of the wafer 15 as a whole from the following formula by assuming that the functions representing the maximum value and the minimum value are Max ( ) and Min ( ).

$$AF'=(\text{Max}(AF(X_m,Y_n))+\text{Min}(AF(X_m,Y_n)) \qquad (17)$$

Then, as shown in FIG. 16(b), when the measured region 126 reaches the exposure field 116, three support points 141A–141C of FIG. 17 are driven in an open loop with the measurement results of the height or level sensors 142A–142C, respectively as the reference, respectively, based on detection results $\theta_X$, $\theta_Y$ and AF' of the formulae (14), (15), and (17). Specifically, the autofocusing control is performed by simultaneously driving the three support points 141A–141C. Autoleveling control is performed so that the focus position in the exposure field 116 shown in FIG. 17 is not changed.

That is, in FIG. 17, by assuming that the spacing between the center of the exposure region 116, and the support points 141A and 141B in the X direction is $X_1$, the spacing between the center of the exposure region 116, and the support point 141C in the X direction is $X_2$, the spacing between the center of exposure region 116, and the support point 141A in the Y direction is $Y_1$, and the spacing between the center of exposure region 116, and the support point 141B in the Y direction is $Y_2$, the support points 141A, 141B, and 141C are given a displacement at a ratio of $X_1:X_2$ in the opposite direction, respectively, based on the result of inclination $\theta_X$ in the nonscanning direction, and the support points 141A, and 141B are given a displacement at a ratio of $Y_1:Y_2$ in the opposite direction, respectively, based on the result of inclination $\theta_Y$ in the scanning direction.

Figure 18:
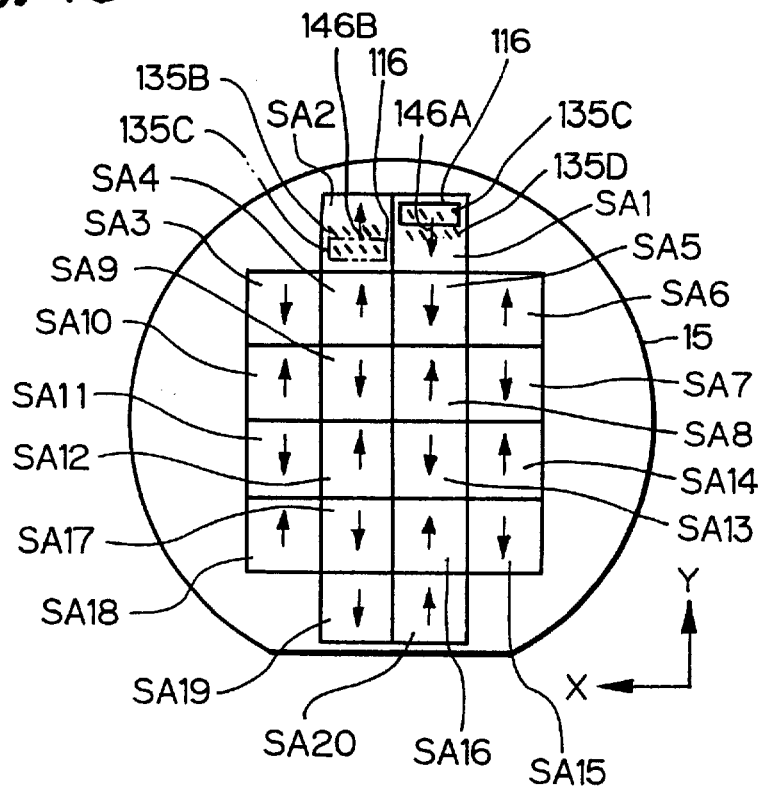
FIG. 18 is a plan view showing an example of array of shot areas on the wafer.

An example of the exposure operation in this embodiment is described by referring to FIGS. 18–20 as follows. First, FIG. 18 shows an arrangement of shots on the wafer 15 of this embodiment. In this figure, shot areas SA1, SA2, . . . , SA20 are arranged on the wafer 15 in a predetermined pitch in the X and Y directions. When the first layer is exposed, shot areas SA1–SA20 are imaginary, while, when the second layer is exposed, shot areas SA1–SA20 are already formed with the same or different circuit patterns.

Figure 19A:
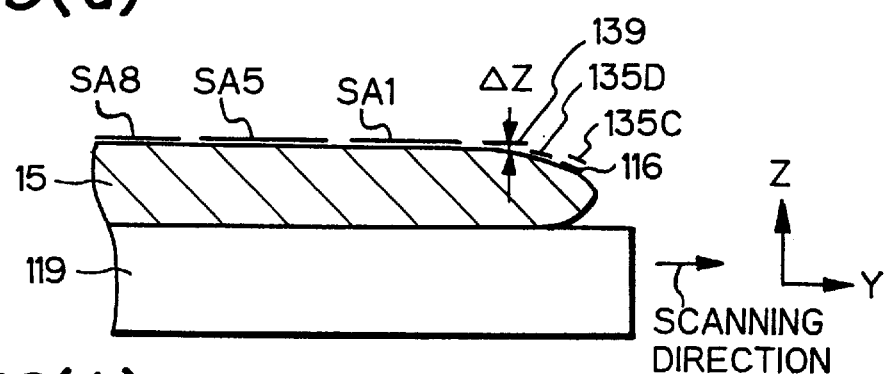
FIGS. 19(a) and 19(b) are enlarged cross sectional views of essential parts for explaining the operation in exposing shot area SA1 with the additional read-ahead system.

First, when first shot area SA1 is exposed, the exposure region or exposure field 116 is scanned in the Y direction, and the reticle 7 (see FIG. 12) is scanned in the -Y direction in synchronization therewith. Thus, the exposure field 116 moves along locus 146A relative to the wafer 15. In this case, in the additional read-ahead mode, the focus position is measured at a predetermined measurement point in the read-ahead region 135D and at a predetermined measurement point in the measurement region 135C within the exposure field 116, and the focusing and leveling of the wafer 15 are performed based on the result of measurement. However, because shot area SA1 is on the periphery of the wafer 15, if the data of actually measured focus position is used as is, the correction for the focus position and leveling angle becomes too much, and the follow-up accuracy is deteriorated. Thus, the data is arranged to be ignored as follows if the data of actually measured focus position is out of a predetermined allowable value:

That is, FIG. 19(a) shows the state immediately after the start of scanning of the wafer 15 in the Y direction to start exposure on shot area SA1. In this figure, the exposure field 116 and the read-ahead region 135D are positioned at a thinned region on the periphery of the wafer 15 (the peripheral region where the thickness of the photoresist layer applied on the wafer 15 is remarkably changed). Furthermore, in the multipoint focus position detection system, it is assumed that calibration is performed to make the detected focus position zero when the imaginary reference plane previously matches the imaging plane of optical projection system PL at the measurement point, that is, the exposure plane (for example, the surface) of the wafer 15 matches the imaging plane of optical projection system PL. In this case, focus position $\Delta Z$ measured at the read-ahead region 135D (the surface of wafer 15) represents by itself the difference of the imaging plane 139 from the focus position, and focus position $\Delta Z$ becomes a considerably large value. Thus, this embodiment previously defines allowable value $\Delta$max, and ignores focus position $\Delta Z$ when the absolute value of measured focus position $\Delta Z$ exceeds the allowable value $\Delta$max. Specifically, before exposure is performed on shot area SA1, the focus position is measured at, for example, the center of shot area SA1. If the absolute value of measured focus position $\Delta Z$ exceeds allowable value $\Delta$max in the state shown in FIG. 19(a), the focus position and leveling angle of the Z leveling stage 119 are controlled based on the data of the previously measured focus position in the state shown in FIG. 19(a).

Figure 19B:
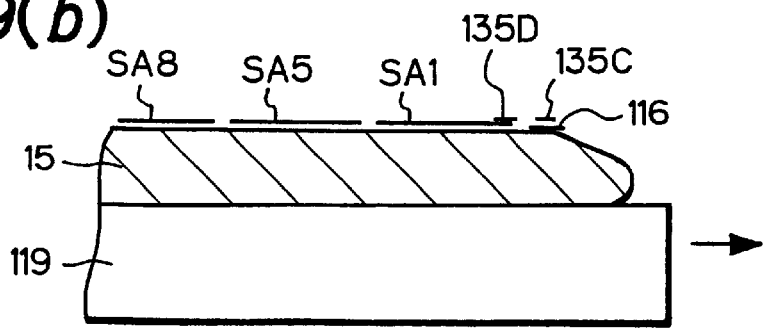

Thereafter, because, when the read-ahead region 135D reaches shot area SA1, as shown in FIG. 19(b), by further scanning the wafer 15 in the +Y direction, the absolute value of focus position being measured becomes below allowable value $\Delta$max, the focus position and leveling angle of the Z leveling stage 119 is controlled based on the actually measured focus position. Thus, the focus position and leveling angle (inclination) of the wafer 15 does not significantly vary in the course of transition from the state of FIG. 19(a) to the state of FIG. 19(b) so that the exposure plane is accurately aligned with the imaging plane when starting the exposure onto shot area SA1 from the state in FIG. 19(b). Therefore, the pattern of the reticle is exposed on entire shot area SA1 with good follow-up accuracy of the autofocusing and autoleveling without lowering the scanning speed of the wafer 15.

Figure 20A:
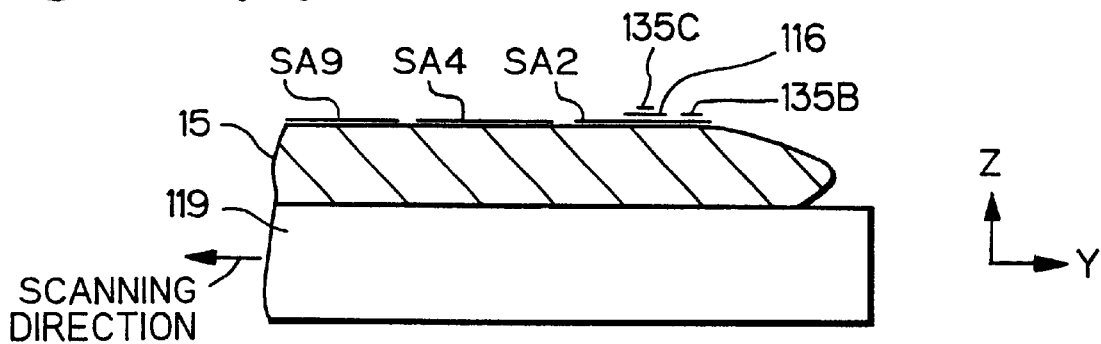
FIGS. 20(a) and 20(b) are enlarged cross sectional views of essential parts for explaining the operation in exposing shot area SA2 with the additional read-ahead system.

Then, in FIG. 18, when shot area SA2 adjacent to shot area SA1 is exposed after completion of the exposure on shot area SA1, the wafer 15 is stepped in the −X direction through the wafer X axis drive stage 120B of FIG. 12. This causes the exposure field 116 to move in the +X direction with respect to the wafer 15, and to reach the scanning start position for shot area SA2. From that state, the wafer 15 is scanned in the −Y direction with respect to the exposure field 116, and the reticle 7 (see FIG. 12) is scanned in the +Y direction in synchronization therewith. As a result, the exposure field 116 moves along locus 146B relative to the wafer 15. In this case, in the additional read-ahead mode, the focus position is measured at the predetermined measurement point in the read-ahead region 135B, and in the measurement region 135C within the exposure field 116, and the focusing and leveling of the wafer 15 are performed based on the measurement results. However, because shot area SA2 is also on the peripheral region of the wafer 15, if the data of actually measured focus position are used as they are, the correction for the focus position and the leveling angle becomes excessive and follow-up accuracy may be deteriorated. Thus, the following measure is taken:

FIG. 20(a) shows a state where the center of shot area SA2 is being exposed. In this figure, because the measurement result of the focus position in the read-ahead region 135B has drifted from the imaging plane within the allowable value, the autofocusing and autoleveling are performed based on the measurement result.

Figure 20B:
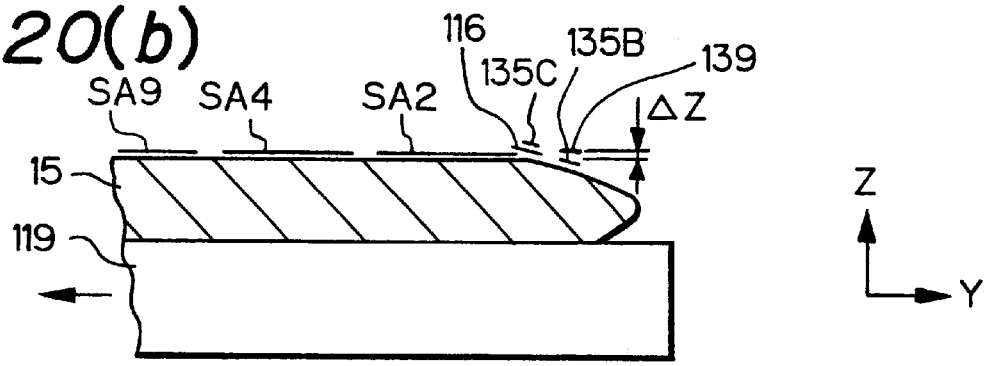

However, if the wafer 15 is further scanned in the −Y direction, and, as shown in FIG. 20(b), the read-ahead region 135B moves to the thinner region on the periphery of the wafer 15, the absolute value of focus position ΔZ (that is, the drift from the imaging plane) measured in the read-ahead region 135B exceeds the above-mentioned allowable value Δmax. Then, if the absolute value of focus position ΔZ measured in the read-ahead region 135B exceeds allowable value Δmax, the exposure is performed by maintaining the focus position and leveling angle of the Z leveling stage 119 at the value set until then while ignoring the data of focus position ΔZ.

However, because, in the state in FIG. 20(b), the absolute value of focus position ΔZ measured in the read-ahead region 135B exceeds allowable value Δmax at the peripheral region of the wafer 15 where the circuit pattern is not exposed, and there is a delay in time until the read-ahead data are actually used, there is little influence on the exposure on shot area SA2 even if such data the absolute value of which exceeds allowable value Δmax is ignored. However, such ignoring of the data the absolute value of which exceeds allowable value Δmax eliminates significant changes in the focus position and leveling angle of the Z leveling stage 119 from the state shown in FIG. 20(b). That is, there is an advantage in that the waste operation of the Z leveling stage 119 is eliminated and the stability of the control system is improved.

Returning to FIG. 18, the scanning exposure is similarly performed for shot areas SA3–SA20 on the wafer 15. The relative scanning direction of the exposure field 116 to each of shot areas SA3–SA20 is indicated by an arrow. In this case, while the autofocusing and autoleveling are performed for shot areas SA3–SA18 at the center by using the measurement data at the read-ahead region as they are, the measurement data at the read-ahead region are partially ignored for shot areas SA19 and SA20 at the peripheral region. This enables it to efficiently perform exposure with the scanning exposure system in a state in which each shot area on the wafer 15 is aligned with the respective imaging plane, and without needless movement of the Z leveling stage 119.

For FIG. 18, a description is given for a case in which the exposure is performed onto the shot area at the peripheral region with respect to the scanning direction on the wafer. A case in which exposure is performed on the shot areas at the peripheral region with respect to the nonscanning direction (X direction) on the wafer is described by referring to FIG. 21.

Figure 21:
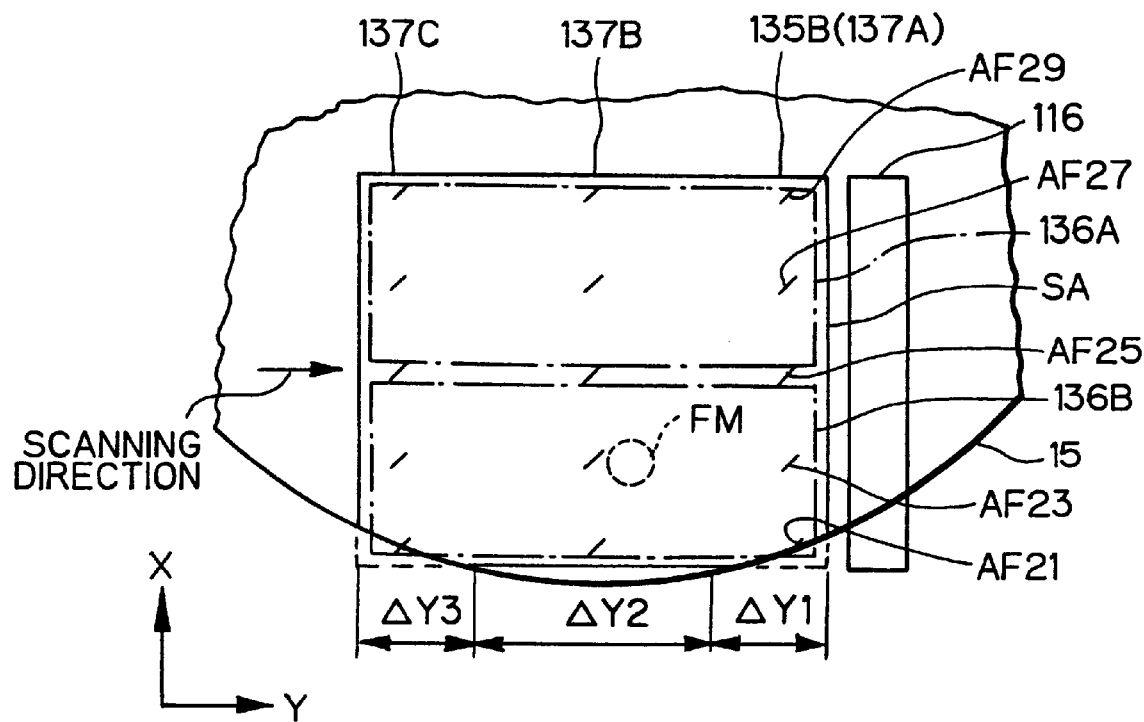
FIG. 21 is a partial enlarged plan view of the wafer for explaining the exposure of a shot area near the edge in a nonscanning direction on the wafer.

FIG. 21 shows shot area SA positioned close to an edge of the wafer 15 in the X direction. In the FIG. 21, the exposure is performed for shot area SA by scanning shot area SA in the +Y direction (to the right on the sheet) with respect to the exposure field 116. Therefore, the additional read-ahead mode uses the data for the focus position measured at measurement points AF21, AF23, . . . , AF29 in the read-ahead region 135B before the exposure field 116 with respect to the scanning direction, and the data for focus position measured at the measurement points in the measurement region within the exposure field 116.

In addition, in FIG. 21, it is assumed that each end shot area SA in the scanning direction protrudes from the wafer 15. Even in such a case, if, for example, two of the same circuit patterns 136A and 136B are formed in shot area SA, at least the area of circuit pattern 147A is normally exposed so that entire shot area SA is not wasted. However, when shot area SA is scanned in the +Y direction with respect to the exposure field 116, the absolute value of the focus position at measurement point AF21 at the end in the read-ahead region 135B exceeds allowable value Δmax at the initial position 137A, then is within allowable Δmax at the intermediate position 137B, and again exceeds allowable value Δmax at the position 137C near the end of scanning. That is, the absolute value of the focus position at measurement point AF21 exceeds allowable Δmax in sections ΔY1 and ΔY3 at each end of the scanning direction Y, and is within allowable value Δmax in the center section ΔY2.

Then, in such a case, when the measurement data in sections ΔY1 and ΔY3 are used, the measurement data at measurement point AF21 are ignored, and, when the measurement data in section ΔY2 are used, the measurement data at measurement point AF21 are also used. This prevents the focus position and inclination of shot area SA from being erroneously set by the measurement data for the region at the periphery of the wafer 15 not suitable for exposure, and the pattern of the reticle is exposed on at least the circuit pattern 136A with a height resolution.

Moreover, besides the case where a measured value at the measurement point in the read-ahead region exceeds an allowable value Δmax in the incomplete shot areas (in FIG. 21 the shot areas such as SA) which exist in the peripheral portion of the wafer, the allowable value (threshold) can be set for the measured value with respect to the inner region of the wafer Specifically, there is a case that the exposure region includes a process irregularity or stepped portion (created in the manufacturing process of the substrate) which results from existence of a foreign material on the lower or back surface of the wafer and make it impossible to be followed by the Z-leveling stage 119, in addition to difference in level formed in manufacturing process. In such a case, a part of measured values obtained from detecting the read-ahead region appears as a large variation peculiar to a focus position. For example, if a foreign material FM is adhered to the back surface of the shot area SA as shown in FIG. 21, the measured value for the measurement point AF23 in the read-ahead region 135B varies greatly in the section ΔY1. If the measured value is used as it is regions adjacent to the region wherein the foreign material FM is adhered to the wafer cannot be focused since it is impossible to follow variation by the Z-leveling stage. Therefore, in this embodiment when measured values of the focus position at one or more measurement points within the read-ahead region inside the periphery of the wafer exceeds the predetermined allowable value, it is determined that a foreign material larger than the predetermined size exists on the back surface of the wafer. At the same time, the coordinate of the position on the wafer at which the foreign material exists (or the position of the shot area at which the foreign material exists) and a value of variation, at that time, of the focus position are stored in the buffer memory in the main control system 113.

Displacement only in the Z direction may be used as the value of variation of the focus position. However, the value of variation of the focus position due to movement of the wafer stage may also be used.

In the case where the value of variation of the focus position is a local variation, the measured value of the focus position at the position in which the foreign material exist is excluded from control information regarding the height and inclination. It is most preferable for local variation to be determined from a follow-up performance of the Z leveling stage 119 and only the value of variation of focusing which exceeds a follow-up response of the Z leveling stage 119 is omitted.

Moreover, information regarding the foreign material which is stored in the main control system 113 may be indicated as a foreign material map on an auxiliary CTR display when exposure of the wafer has finished. It may be possible to transfer information regarding the foreign material to an on-line host computer and control the information by means of the host computer.

In the above embodiment, a multipoint focus position detection system which projects the slit-like aperture pattern arranged in two dimensions onto the wafer is used to measure the focus position at multiple point on the exposure plane of the wafer. Instead, it may be possible to use a focus position detection system which projects an image of pattern forming an elongated slit in the nonscanning direction onto, for example, a read-ahead region in one row on the wafer, and measures the entire focus position in such a nonscanning direction. In addition, even when the two-dimensional distribution of focus positions on the exposure plane of the wafer is measured by using a focus position detection system of an image processing type which projects a shading pattern, and detects the lateral drift of the pattern image, the focusing and leveling are accurately performed by applying additional read-ahead system similar to the above embodiment.

The further embodiment of the present invention is described with reference to FIGS. 22 to 26. In this embodiment, the present invention is applied to an exposure method in a step-and-scanning projection exposure apparatus.

Figure 22:
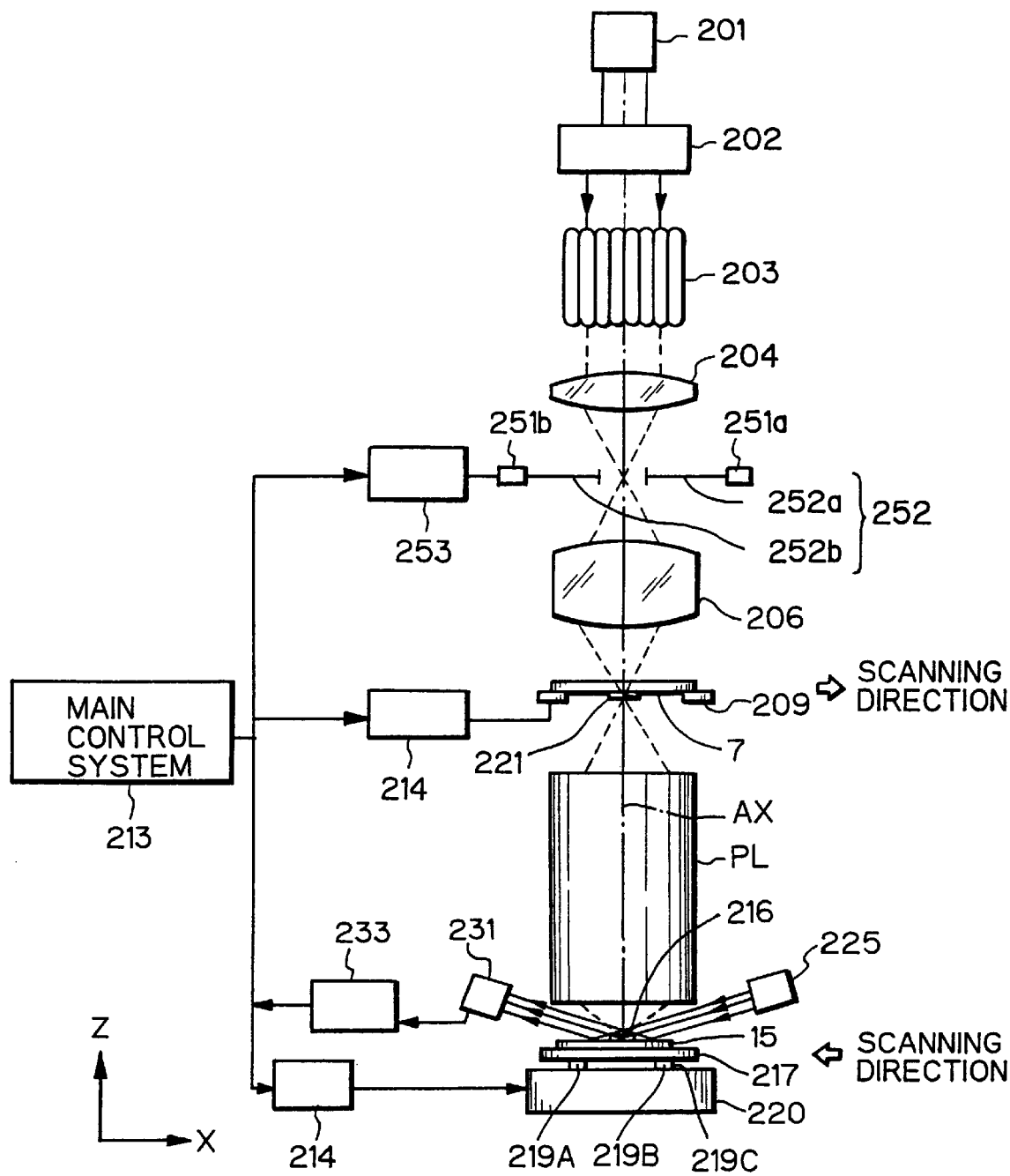
FIG. 22 is an optical projection apparatus implementing an embodiment of a projection exposure method according to the fourth embodiment of the present invention.

FIG. 22 shows a projection exposure apparatus used in this embodiment. In FIG. 22, reticle 7 is illuminated from a rectangular slit-like illumination region 221 by a light source 201 and an optical illumination system consisting of an optical illumination light-shaping system 202 to relay lens 206 with the uniform intensity of illumination. The circuit pattern image of reticle 7 in the slit-like illumination region 221 is transferred onto a wafer (15) through an optical projection system PL. An excimer laser light source, such as an ArF excimer laser light source or KrF excimer laser, or a metal vapor laser light source, or a pulse light source for the harmonic YAG laser generator, or a configuration combining a mercury lamp and an oval reflector can be used as a light source 201.

In the case of a pulse light source, light exposure is switched on and off by control of the power supply from the power supply unit for the pulse light source. In the case of a continuous light source, exposure to light is switched on and off by the shutter in the optical illumination light-shaping system 202. Since, however, a movable blind (variable field diaphragm) 252 is provided in this embodiment as described later, exposure to light may be switched on and off by the switching of the movable blind 252.

In FIG. 22, the illumination light from the light source 201 reaches a fly-eye lens 203 with the diameter of the light flux set at a predetermined size by the optical illumination light shaping-system 202. A number of two-dimensional light sources is formed on an exit surface of the fly-eye lens 203. The illumination light from these two-dimensional light sources is collected by a condenser lens 204 and reaches the movable blind (variable field diaphragm) 252. The light flux which passes through the opening of the movable blind 252 becomes a light flux having a rectangular slit-like cross section and enters the relay lens system 206. The relay lens system 206 is a lens system conjugating the movable blind 252 and the pattern formation surface of reticle 7. The movable blind 252 consists of two blades (light blocking panels) 252a and 252b which regulate the width of the scanning direction (X direction) described later and two blades (not illustrated) which regulate the width in the nonscanning direction perpendicular to the scanning direction. The blades 252a and 252b regulating the width in the scanning direction are supported so that they can be moved in the scanning direction independently by the drive sections 251a and 251b, respectively. The two blades (not shown) which regulate the width in the nonscanning direction are also supported so that they can be moved independently. The relay lens system 206 is a double telecentric optical system and telecentric properties are maintained in the slit-like illumination region 221 on reticle 7.

Reticle 7 according to this embodiment is absorbed and held on a reticle stage 209. The circuit pattern image in the slit-like illumination region 221 on reticle 7 is projected and exposed onto wafer 15 through the optical projection system PL. It is assumed that a region on a wafer 15 which is conjugate to a slit-like illumination region 221 is a slit-like exposure region (exposure illumination field) 216. Moreover, it is assumed that the scanning direction (a direction parallel to the paper surface in FIG. 22) of reticle 7 with respect to the illumination region 221 in the two-dimensional plane perpendicular to the optical axis AX of the optical projection system PL is the +X direction (or −X direction) and the direction parallel to the optical axis AX is the Z direction. Moreover, it is assumed that the nonscanning direction perpendicular to the paper surface in FIG. 1 and perpendicular to the X axis is the Y direction.

In this case, the reticle stage 209 is driven by a reticle stage drive section 214 and scans reticle 7 in the scanning direction (+X direction or −X direction). The operation of the drive sections 251a and 251b of the movable blinds 252 and the operation of the drive section in the nonscanning direction are controlled by a movable blind control section 253. The operations of the reticle stage drive section 214 and the movable blind control section 253 are controlled by a main control system 213 which controls the operation of the whole device. On the other hand, wafer 15 is absorbed and held on a Z leveling stage 217. The Z leveling stage 217 is placed on an XY stage 220 through three fulcrums 219A–219C which are flexible in the Z direction. The position of the Z leveling stage 217 is adjusted by adjusting the amount of flexibility in the three fulcrums 219A–219C in parallel. The adjustment (leveling) of the inclination of the Z leveling stage 217 is made by individually adjusting the amount of flexibility in the three fulcrums 219A–219C. The XY stage 220 conducts the positioning of a wafer 15 in the X direction and the Y direction in a surface perpendicular to optical axis AX and scans wafer 15 at a predetermined scanning speed in the +X direction (or –X direction).

Moreover, a multipoint focus position detection system (hereafter referred to as a multi AF sensor) consisting of a light emission system 225 and a light receiving system 231 is arranged on the side of the optical projection system PL. In the multi AF sensor, a slit image, for example, is projected diagonally from the light emission system 225 to light axis AX on a plurality of predetermined measurement points on a wafer. The reflected light from this plurality of slit images enters the light receiving system 231 and the plurality of slit images is imaged again in the light receiving system 231. The detection light which is emitted from the light emission system 225 is the light of a wavelength band with a weak photosensitivity for photoresist on wafer 15. When the position of the surface of wafer 15 is changed in the Z direction, the position of the slit image which is imaged again in the light receiving system 231 is displaced laterally. Therefore, the light receiving system 231 generates a plurality of focus signals corresponding to the amount of lateral displacement and supplies them to a signal processing system 233. The signal processing system 233 calculates the position (focus position) of each of the measurement points in the Z direction corresponding to the focus signal supplied and transmits the calculated focus position to the main control system 213. In this case, a plurality of focus signals output by the light receiving system 231 is calibrated so that it becomes "0" when the surface of wafer 15 is matched with an imaging position in advance by the optical projection system PL.

The main control system 213 performs stepping and scanning for wafer 15 by controlling the operation of the XY stage 220 through the wafer stage drive device 214. The main control system 213 also matches the Z coordinate in the exposure region 216 of wafer 15 which is held on the Z leveling stage 217 and the inclination with the imaging surface by controlling the amount of flexibility in the three fulcrums 219A–219C through the wafer stage drive device 214 at the same time in parallel based on the information on the focus position supplied by the signal processing system 233. Autofocusing and autoleveling are thus conducted in this way.

Figure 23:
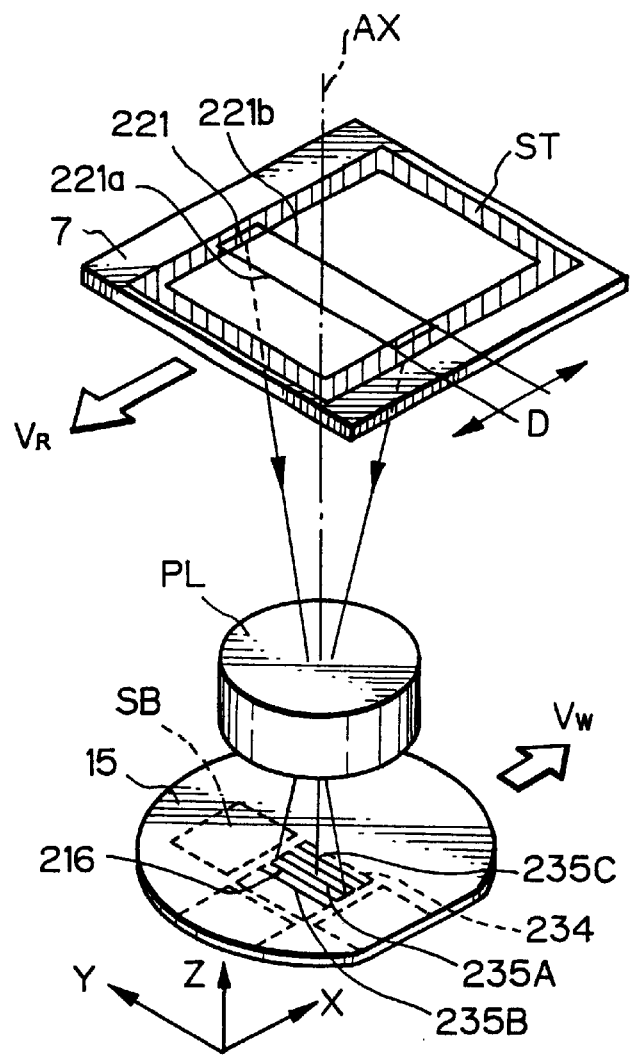
FIG. 23 is a schematic perspective view provided for the explanation of a scanning exposure operation by the projection exposure apparatus shown in FIG. 22.

As shown in FIG. 23, in exposing a pattern image on reticle 7 onto the shot area 234 on wafer 15 through the optical exposure system PL by the scanning exposure method, reticle 7 is scanned at a speed of $V_1$ in the –X direction (or +X direction) to the illumination region 221 with a width of D to be set by the movable blind 252 in FIG. 22. Moreover, it is assumed that the projection magnification of the optical projection system PL is β (β is ¼ or ⅕, for example). Wafer 15 is scanned at a speed of $V_2$ (=β·$V_1$) in the +X direction (or –X direction) to the exposure region 216 in synchronization with the scanning of reticle 7. In this way, the circuit pattern image of reticle 7 is sequentially transferred to the shot area 234. In this embodiment, since the positions of the edges 221a and 221b in the scanning direction of the illumination region 221 can be moved into the scanning direction, respectively, by operating the blades 252a and 252b in FIG. 22, the exposure of unnecessary patterns around the light blocking zone ST on reticle 7 onto wafer 15 can be prevented.

In this case, in this embodiment, slit images are projected at a plurality of measurement points in the linear two-row read-ahead regions 235B and 235C which are arranged so that they sandwich the linear measurement region 235A at the center of the exposure region 216 on wafer 15 and the exposure region 216 in the X direction from the light emission system 225 of the multi AF sensors in FIG. 22.

Figure 24:
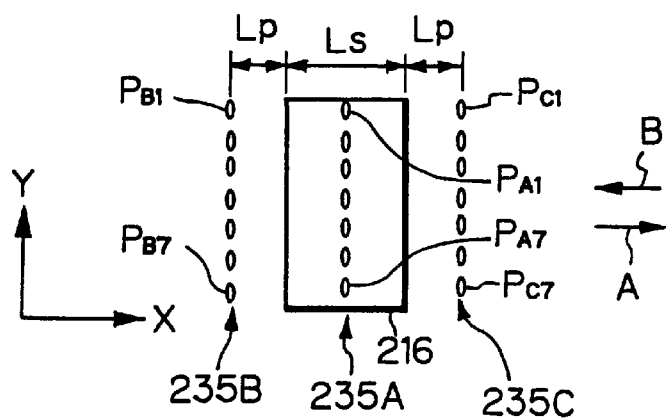
FIG. 24 is a plan view showing the positional relationship between the measurement points by the multi-AF sensors and the slit-like exposure region 216 of the embodiment.

FIG. 24 shows the relationship between the slit-like exposure region 216 on a wafer and the measurement point by the multi AF sensors. In FIG. 24, slit images are projected at seven measurement points, $P_{A1}$ to $P_{A7}$, respectively, in the measurement region 235A which crosses the center portion of the exposure region 216 in the Y direction. Moreover, slit images are projected at seven measurement points, $P_{B1}$ to $P_{B7}$, respectively, in the read-ahead region 235B in the –X direction to the exposure region 216. Similarly, slit images are projected at seven measurement points, $P_{C1}$ to $P_{C7}$ in the read-ahead region 235C in the +X direction to the exposure region 216. In this embodiment, when a wafer is scanned in the +X direction indicated by arrow A, auto-focusing and autoleveling are performed by using information on the focus positions at the 14 measurement points in total in the read-ahead region 235B in the –X direction to the measurement region 235A and the exposure region 216.

Specifically, when the focus position which is obtained when a certain point, Q, on a wafer is in the read-ahead region 235B at a certain point, $t_Q$, is lower by δZ compared to the focus position of the imaging plane, the position of the Z leveling stage 217 in the Z direction in FIG. 22 must be raised by δZ from the position at point $t_Q$ when point Q reaches the center of the exposure region 216. Furthermore, since the information on the focus position around point Q is obtained, leveling can also be performed based on this information. Moreover, if the focus position obtained in the measurement region 235A when point Q reaches the center of the exposure region 216 is, for example, lower than the value of the imaging plane, the Z leveling stage 217 must be moved only for that portion in the Z direction. That is, on the one hand, the information on the focus position obtained in the measurement region 235A in the exposure region 216 is used to correct the follow-up error which remains in a case in which the Z coordinate and inclination are controlled based on the focus position obtained in the read-ahead region 235B.

On the other hand, when a wafer is scanned in the –X direction indicated by arrow B, autofocusing and autoleveling are performed by using the information on the focus position at the 14 measurement points in total in the read-ahead region 235C in the +X direction to the measurement region 235A and the exposure region 216.

Here, as shown in FIG. 24, it is assumed that the width of the scanning direction (X direction) of the exposure region 216 is Ls and the distance from the edge of the exposure region 216 in the –X direction to the read-ahead region 235B and the distance from the edge of the exposure region 216 in the +X direction to the read-ahead region 235C are Lp.

Moreover, FIG. 25 shows the state in which a wafer is set at the scanning start position to the exposure region 216 to perform the exposure of a wafer onto the shot area 234. In FIG. 25, it is assumed that the scanning direction of a wafer is the +X direction. The shot area 234 is separated from the exposure region 216 in the –X direction by a width, Lac, for the acceleration section 239. Width Lac of the acceleration section 239 in the scanning direction is determined by the acceleration performance of the reticle stage 209 and setting time for setting the speed in FIG. 22. This is because magnification β of the optical projection system PL is a contraction magnification, in general, and the reticle stage 209 is scanned at a higher speed than the XY stage 220 on the wafer.

Next, as shown in FIG. 23 in the embodiment, an example of the sequence in the case where exposure is performed continuously for the shot areas 234 and SB which are arranged adjacent to each other on a wafer in the nonscanning direction is described with reference to FIG. 26. FIG. 26(a) shows speed of movement $V_R$ of the reticle stage 209 in the scanning direction (−X direction) in that case. FIG. 26(b) shows speed of movement $V_{WX}$ of the XY stage 220 on the wafer in the scanning direction (+X direction). FIG. 26(c) shows speed of movement $V_{WY}$ of the XY stage 220 in the nonscanning direction (−Y direction).

First, as shown in FIG. 25, it is assumed that the shot area 234 is set at the scanning start position at point $P_0$. The reticle stage 209 and the XY stage 220 on the wafer start acceleration synchronously in the scanning direction from point $P_0$. The acceleration ratio of the reticle stage 209 and the XY stage 220 is the same as projection magnification β of the optical projection system PL. The scanning exposure starts from point $P_1$ where both stages reach their predetermined scanning speeds, and settling time $T_{se}$ for the stabilization of the speed passes. It is assumed that the time needed for this is $T_1$, that is, the distance the XY stage 220 moves during time $T_1$ corresponding to the shaded portion $R_1$ in FIG. 26(b) is Lac. This distance Lac is the same as for the acceleration section 239 in FIG. 25.

At this time, the reticle stage 209 and the XY stage 220 need not be always synchronized at the time of acceleration because they must be synchronized only at the time of the exposure start time (point $P_1$). That is, the acceleration ratio of the reticle stage 209 and the XY stage 220 in the X direction need not be always matched with projection magnification β of the optical projection system.

The scanning exposure will end at point $P_2$ where the scanning exposure time only for $T_2$ has passed. As shown in FIG. 26(c), the XY stage 220 starts stepping in the nonscanning direction at the same time when the scanning exposure ends. The speed of the reticle stage 209 is reduced in time $T_3$ in time $T_4$ which is required for this stepping. The XY stage 220 on the wafer in the scanning direction is reduced in speed and moved to the next scanning start position of the shot area SB in parallel to the operation above.

As shown in FIG. 26(c), the stepping operation in the nonscanning direction ends at point $P_5$ where time $T_4$ has passed. The shot area SB and the exposure region 216 in FIG. 23 almost overlap in the Y direction. However, as shown in FIGS. 26(a) and 26(b), the acceleration of the reticle stage 209 and the XY stage 220 on the wafer in the scanning direction can be started from point $P_4$ which is before point $P_5$. The scanning exposure onto the shot area SB is then started from point $P_7$ where time $T_6$ has passed in the state where autofocusing (including autoleveling) using the focusing position in the read-ahead region 235C on the right side in FIG. 24 is performed. At this time, it is assumed that the distance the XY stage 220 on the wafer advances in the scanning direction, that is, the distance the XY stage 220 advances in the scanning direction to the shaded portion $R_2$ in FIG. 26(b) is Lb.

In this case, as shown in FIG. 26(c), although the positioning of the XY stage 220 on the wafer in the nonscanning direction is conducted in positioning time $T_5$ from point $P_5$ to point $P_6$, time $T_5$ need not be taken into account in particular. This is because the position of each of the measurement points, such as $P_{A1}$, is not changed essentially since the amount of vibration at the time of the positioning of the XY stage 220 in the nonscanning direction is small compared with the width of light flux of the detection light forming slit images projected at each of the measurement points, such as $P_{A1}$, in FIG. 24. However, it can also be assumed that the distance the XY stage 220 advances in the X direction after point $P_5$ where the positioning operation in the nonscanning direction has been completed also is Lb.

In the above sequence, it is assumed that the width, Lac, of the acceleration section 239 shown in FIG. 25 is shorter than the distance, Lp, between the exposure region 216 and the read-ahead region 235B (Lac<Lp). In this case, the information on the focus position at the edge of the shot area 234 cannot be obtained because the read-ahead region 235B is in the shot area 234 at the time of the scanning start point. Therefore, there is the possibility of the occurrence of autofocusing follow-up errors when the edge of the shot region 234 enters the exposure region 216. On the contrary, the read-ahead region 235B must be in the exposure region 216, not in the shot area 234, at the scanning start position to perform highly accurate autofocusing in the overall shot area 234. This can be expressed in an equation as follows:

$$Lac \geq Lp \tag{18}$$

In the case where the distance, Lb, the XY stage 220 advances in the nonscanning direction from the stepping end point $P_5$ to the exposure start point $P_7$ is shorter than the distance, Lp, between the exposure region 216 and the read-ahead region 235C (Lb<Lp), each of the measurement points in the read-ahead region 235C advances diagonally at the edge of the shot region SB since the wafer is also moved in the nonscanning direction. In this case, because the focus position measured in the read-ahead region 235C is displaced laterally to the Y direction, it is difficult to perform autofocusing accurately at exposure by the result of the measurement. Therefore, the condition for performing autofocusing accurately without being affected by the stepping operation in the nonscanning direction is that the distance, Lb, is longer than the distance, Lp, as shown in the following equation:

$$Lb \geq Lp \tag{19}$$

The condition in equation (19) must also be satisfied in this case.

Furthermore, in the embodiment, there is the possibility that the speed of the XY stage 220 movement is fast during the stepping operation of the XY stage 220 on the wafer and the response speed of the autofocusing system fails to follow it. It is desirable that the operation of the autofocusing mechanism be turned off during the stepping operation. Specifically, in the sequence in FIG. 26, scanning exposure is performed in the opposite direction by locking the posture of the Z leveling stage 217 in FIG. 22 and turning off autofocusing control at end point, $P_2$, of scanning exposure and by turning on autofocusing control at the stepping end point $P_5$ (or point $P_6$ in some cases). In this way, unstable operation of the autofocusing mechanism can be prevented.

Furthermore, the above embodiment shows a sequence of a case in which the shot areas 234 and SB are arranged in line in the nonscanning direction on the wafer, but in the case where the shot areas are arranged in line in the scanning direction on the wafer, for example, all operations in FIG. 26 are the same except the stepping operation of the XY stage 220 in the scanning direction on the wafer done before acceleration start point $P_4$.

In addition, the above embodiment shows a sequence in which the stage for scanning is started acceleration in the nonscanning direction from point $P_4$ prior to the stepping end point $P_5$ (or $P_6$), but, of course, a sequence to start acceleration for scanning exposure after the end of stepping in the nonscanning direction can be used.

It is a matter of course that the present invention is not limited to the above embodiment, but may take various arrangements without departing from the spirit of the present invention.

Of course, the present invention is not limited to the above embodiments, and may have various arrangements within a scope not departing from the spirit ,of the present invention.

According to the first scanning exposure method of the present invention, when the pattern of a mask (reticle) is projected onto each shot area on the substrate (wafer) by the scanning exposure system, the shot areas at the outer periphery are scanned so that the exposure region moves relatively from the inside to the outside of the substrate. Therefore, there is the advantage that good control accuracy can be obtained for the focus position and the inclination even for the shot areas at the outer periphery of the wafer because the scanning is affected little by sagging on the periphery of the substrate even if the level or height is corrected with the read-ahead mode.

Furthermore, it becomes no longer necessary to perform an idle return at the wafer, when the total number of shot areas on the wafer is even, by making equal the number of shot areas in opposite directions, and performing exposure while reversing the scanning direction for each shot area, or, when the total number of shot areas is odd, by making one the difference between the number of shot areas in opposite directions, starting the scanning from the direction with the larger number of shot areas, and performing while reversing the scanning direction for each shot area so that idle return at the mask is eliminated thereby improving throughput.

Furthermore, when the scanning direction for inner shot areas contacting the shot areas on the outer periphery of the substrate is reversed to that for these shot areas on the outer periphery, and, for the shot areas other than the shot areas on the outer periphery and the inner shot areas, the scanning direction for the shot areas arranged in a direction vertical to the scanning direction for the substrate is alternately reversed, the useless movement (idle return) at the mask is eliminated, and stepping at the substrate is reduced so that throughput is improved.

Furthermore, according to the second embodiment of the present invention, when the pattern of the mask is exposed on each shot area on the substrate by the scanning exposure system, it is arranged to scan missing shot areas where the height detection region or exposure region cannot be completely included in a exposable region so that the exposure region moves from the inside to the outside relative to the substrate. Therefore, there is an advantage in that good control accuracy can be obtained for the focus position and the inclination even for the missing shot areas at the outer periphery of the wafer or the like because the scanning is little affected by the missing areas at the outer periphery of the substrate and the like even if the height is corrected by the read-ahead system.

According to the third embodiment of the present invention, because the height is controlled by reading ahead toward the height of the substrate, and using the result obtained by the read-ahead system, when the exposure is performed by the scanning exposure system, it is possible to accurately align the height of the actual exposure region on a photosensitive substrate such as a wafer with the height of the imaging plane of the optical projection system without reducing the scanning speed. In addition, because, if the level or height detected by the read-ahead system slips out of a predetermined allowable range, the height of the substrate is fixed at the height set until then, the follow-up accuracy of autofocusing is not deteriorated as a whole even when the height of the substrate surface changes significantly.

In addition, with such a method, by fixing the height of the substrate at the height set until when the read-ahead height slips out of a predetermined allowable range, good follow-up accuracy can be obtained even when setting the scanning direction for the exposure region at the peripheral region of the substrate in any scanning direction.

Furthermore, there is an advantage in that the follow-up accuracy of leveling is not deteriorated as a whole by also controlling the inclination of the substrate by using the read-ahead height, and by fixing the inclination of the substrate at the inclination set until when the read-ahead height exceeds and slips out of a predetermined allowable range with respect to the imaging plane of the optical projection system.

According to the fourth scanning exposure method it is possible to accurately detect a foreign material existing on the back surface of the wafer.

Furthermore, when the height of the substrate is measured at an array of measurement points arranged in a direction intersecting the scanning direction in the exposure region in parallel to the measurement of the height of the substrate at an array of measurement points arranged in a direction intersecting the scanning direction before the exposure region conjugate to the radiation region with respect to the scanning direction, it is possible to more accurately perform autofocusing and autoleveling by using the read-ahead height and an actual height. Even in this case, the follow-up accuracy of autofocusing and auto-leveling will not be deteriorated as a whole by fixing the height and inclination of the substrate at the values set until then when the height measured at the array of measurement points arranged before the exposure region with respect to the scanning direction exceeds the predetermined allowable range.

Furthermore, even in a case where the height of the substrate is measured at a plurality of measurement points arranged in a direction intersecting the scanning direction before the exposure region with respect to the scanning direction, and, when a part of the measured height at the plurality of measurement points exceeds and slips out of a predetermined allowable range with respect to the imaging plane of the optical projection system, the height of the substrate is controlled by excluding the data of height slipping out of the allowable range, for example, even in a case where the exposure is performed on the exposure region at the peripheral region on the substrate in the nonscanning direction, the exposure can be performed by aligning a flat area in the exposure region with the imaging plane.

Moreover, the heights or levels detected by the read-ahead system are successively stored in regions in the predetermined memory, which are designated by addresses which are determined by the predetermined sampling frequencies and read out from the region in the memory, which is designated by the address determined in accordance with the scanning speed of the substrate. If the height read out from the region is in an allowable range, the height of the substrate accurately fit with the imaging plane of the optical projection system on the basis of the height read out from the address even if the scanning speed is changed.

Next, when a distribution of the surface level or height of the substrate is obtained from the height detected by the read-ahead system and the existence of a foreign material adhered to the upper or bottom surface of the substrate is detected from the distribution of the height, it is possible to accurately detect presence of a foreign material by effectively using data which are read ahead.

Moreover, when it is determined that there is a large foreign material which is lager than a predetermined size and is adhered to the upper or bottom surface of the substrate, if information regarding the height read ahead in the position at which the foreign material adhere is not used as control information for the level and inclination, regions around the region wherein the foreign material is adhered do not displace with respect to the imaging plane. Consequently, highly accurate focusing is attained.

According to the fifth embodiment, the position (focus position) of the optical projection system in the optical axis is detected in the read-ahead region which lies before the exposure region with respect to the scanning direction on a wafer and autofocusing is performed with the result of this detection. Therefore, autofocusing can be performed with a small follow-up error even in the case where the substrate is being scanned. Moreover, the focus position at the edge of the shot area is detected in the read-ahead region when a substrate is being moved in the acceleration section because the read-ahead region is between the predetermined shot area and the exposure region when the substrate is moved to the scanning start position. Therefore, the advantage arises in that autofocusing can be performed with a small follow-up error over the entire surface of the shot area.

Moreover, in the case where the positioning (stepping) of a substrate in a direction (nonscanning direction) perpendicular to a second direction has been completed before the read-ahead region reaches a pre-determined shot area after the scanning of a substrate is started to expose a mask pattern onto the substrate, the read-ahead region is moved in parallel to the scanning direction in the shot area. Therefore, highly accurate autofocusing can be performed over the entire surface of the shot area.

Moreover, in the case where the positioning adjustment of a substrate in the optical axis direction is started after the stopping of the positioning, adjustment of the substrate in the optical axis direction immediately after the end of exposure onto a predetermined shot area, the positioning to the next scanning start position of the substrate in a second direction for the exposure of the substrate onto the next shot area, and the end of the positioning of the substrate in a direction perpendicular to the second direction, autofocusing is turned off in a period where the substrate is being moved at a high speed by the stepping operation. Therefore, the substrate will not perform unstable operation even if the focus position detected by the read-ahead region is moved at a high speed.

What is claimed is:

1. A projection exposure method in which an image of a pattern on a mask which is illuminated by an exposure beam is projected onto a substrate through a projection system and a shot area on said substrate is exposed with use of the pattern on said mask, by scanning said substrate in a second direction corresponding to a first direction in synchronization with scanning said mask in said first direction which is substantially perpendicular to an optical axis of said projection system, said method comprising:

moving said substrate in a predetermined direction after exposure of a preceding shot area just before said shot area is finished; and starting exposure of said shot area after said movement of said substrate in said predetermined direction is completed;

wherein a measurement area for measuring positional information of said substrate in the direction along said optical axis of said projection system is defined at a position which is separated in a direction opposite to said second direction with respect to the exposure region which is illuminated by said exposure beam through said projection system, and the distance that said substrate moves in said second direction from the time when said movement of said substrate in said substrate in said predetermined direction is completed by the time when exposure of said shot area starts is equal or more than the space between said exposure region and said measurement region along said second direction.

2. The method according to claim 1 further comprising:

moving said substrate in the direction opposite to said second direction during exposure of said preceding shot area; and moving said substrate with decelerated movement in the direction opposite to said second direction after the exposure of said preceding shot area is finished, wherein said predetermined direction along which said substrate is moved during the decelerated movement thereof includes a direction crossing said second direction.

3. The method according to claim 1 further comprising:

starting accelerated movement of said substrate in said second direction to expose said shot area before said movement of said substrate in said predetermined direction is completed, said predetermined direction including a direction crossing said second direction.

4. The method according to claim 1, wherein autofocusing control which performs measurement of said positional information of said substrate along with optical axis and adjustment of position of said substrate relative to the direction along said optical axis based on the result of said measurement, is stopped, during said movement of said substrate in said predetermined direction.

5. A method for manufacturing a device, said method comprising a lithography step which exposes a plurality of shot areas on a substrate using the method set forth in claim 1.

6. A projection exposure method in which an image of a pattern on a mask which is illuminated by an exposure beam is projected onto a substrate through a projection system and a shot area on said substrate is exposed with use of the pattern on said mask, by scanning said substrate in a second direction corresponding to a first direction in synchronization with scanning said mask in said first direction which is substantially perpendicular to an optical axis of said projection system, said method comprising:

stopping autofocusing control which performs measurement of positional information of said substrate in the direction along said optical axis and adjustment of position of said substrate relative to the direction along said optical axis based on the result of said measurement, after exposure of said shot area is finished;

starting stepping movement of said substrate in a predetermined direction to expose the next shot area on said substrate, after the exposure of said shot area is finished and during decelerated movement of said substrate in said second direction; and starting exposure of said next shot area after the stepping movement of said substrate is finished.

7. The method according to claim 6, further comprising:

starting accelerated movement of said substrate in a direction opposite to said second direction to expose said next shot area before the stepping movement of said substrate in said predetermined direction is finished.

8. The method according to claim 6, further comprising:
starting said autofocusing control after said stepping movement of said substrate is finished.

9. A method for manufacturing a device, said method comprising a lithography step which exposes a plurality of shot areas on a substrate using the method set forth in claim 6.

10. A projection exposure method in which an image of a pattern on a mask which is illuminated by an exposure beam is projected onto a substrate through a projection system and a shot area on said substrate is exposed with use of the pattern on said mask, by scanning said substrate in a second direction corresponding to a first direction in synchronization with scanning said mask in said first direction which is substantially perpendicular to an optical axis of said projection system, said method comprising:

stopping autofocusing control which performs measurement of positional information of said substrate in the direction along said optical axis and adjustment of position of said substrate relative to the direction along said optical axis based on the result of said measurement, after exposure of said shot area is finished;

starting stepping movement of said substrate in a predetermined direction to expose the next shot area on said substrate, after the exposure of said shot area is finished;

starting accelerated movement of said substrate in a direction opposite to said second direction to expose said next shot area, during said stepping movement of said substrate in the predetermined direction; and starting exposure of said next shot area after said stepping movement of said substrate is finished.

11. The method according to claim 10, further comprising:
starting said autofocusing control after said stepping movement of said substrate is finished.

12. A method for manufacturing a device, said method comprising a lithography step which exposes a plurality of shot areas on a substrate using the method set forth in claim 10.

13. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:

detecting positional information of said substrate in a direction along the optical axis of said optical projection system, before said exposure region, relative to a direction of movement of said substrate, during movement of said substrate for said exposure; and adjusting a positional relation between an image plane of said optical projection system and said substrate based on the detected positional information, during said movement of said substrate for said exposure, wherein said substrate is moved so that said exposure region is moved from an inside to an outside of said substrate when a specific shot area on a peripheral portion of said substrate among a plurality of shot areas on said substrate is exposed, and wherein in said specific shot area, a better control accuracy of positional alignment between an exposure surface of said substrate and said image plane of said optical projection system based on said detected positional information is obtainable by moving said substrate so that said exposure region is moved from the inside to the outside, than by moving said substrate so that said exposure region is moved from the outside to the inside.

14. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:

detecting positional information of said substrate in a direction along the optical axis of said optical projection system, before said exposure region, relative to a direction of movement of said substrate, during movement of said substrate for said exposure; and adjusting a positional relation between an image plane of said optical projection system and said substrate based on the detected positional information, during said movement of said substrate for said exposure, wherein said substrate is moved so that said exposure region is moved from an inside to an outside of said substrate when a specific shot area on a peripheral portion of said substrate among a plurality of shot areas on said substrate is exposed, and wherein in said specific shot area, if exposure is performed by moving said substrate so that said exposure region is moved from the outside portion toward the inside portion, at least a part of said exposure region is not included in a substantial exposable region on said substrate, at an acceleration start position of said substrate.

15. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:

detecting positional information of said substrate in a direction along the optical axis of said optical projection system, before said exposure region, relative to a direction of movement of said substrate, during movement of said substrate for said exposure; and adjusting a positional relation between an image plane of said optical projection system and said substrate based on the detected positional information, during said movement of said substrate for said exposure, wherein said substrate is moved so that said exposure region is moved from an inside to an outside of said substrate when a specific shot area on a peripheral portion of said substrate among a plurality of shot areas on said substrate is exposed, and wherein in said specific shot area, if exposure is performed by moving said substrate so that exposure region is moved from the outside portion toward the inside portion, at least a part of a detection region for detecting said positional information is not included in a substantial exposable region on said substrate, at an acceleration start position of said substrate.

16. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:

detecting positional information of said substrate in a direction along the optical axis of said optical projection system, during movement of said substrate for said exposure;

adjusting a positional relation between an image plane of said optical projection system and said substrate based on the detected positional information, during said movement of said substrate for said exposure;

controlling movement of said substrate so that said exposure region moves from an inside to an outside of said substrate when a specific shot area on a peripheral portion of said substrate among a plurality of shot areas on said substrate is exposed; and exposing, in sequence, a plurality of shot areas on said substrate by alternately moving said substrate in said predetermined direction and in a direction opposite to said predetermined direction.

17. The method according to claim 16, wherein in said specific shot area, a better control accuracy of positional alignment between an exposure surface of said substrate and said image plane of said optical projection system based on said detected positional information is obtainable by moving said substrate so that said exposure region is moved from the inside to the outside, than by moving said substrate so that said exposure region is moved from the outside to the inside.

18. A projection exposure method in which an image of a pattern on a mask which is illuminated by an exposure beam is projected onto a substrate through a projection system and a shot area on said substrate is exposed with use of the pattern on said mask, by scanning said substrate in a second direction corresponding to a first direction in synchronization with scanning said mask in said first direction which is substantially perpendicular to an optical axis of said projection system, said method comprising:

moving said substrate in a predetermined direction after exposure of a preceding shot area just before said shot area is fininshed; and starting exposure of said shot area after said movement of said substrate in said predetermined direction is completed;

wherein a measurement area for measuring positional information of said substrate in the direction along said optical axis of said projection system is defined at a position which is 19. The method according to claim 16, wherein in said specific shot area, if exposure is performed by moving said substrate so that said exposure region is moved from the outside portion toward the inside portion, at least a part of a detection region for detecting said positional information is not included in a substantial exposable region on said substrate, at an acceleration start position of said substrate.

20. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:

detecting positional information of said substrate in a direction along the optical axis of said optical projection system, during movement of said substrate for said exposure;

adjusting a positional relation between an image plane of said optical projection system and said substrate based on the detected positional information, during said movement of said substrate for said exposure;

moving said substrate so that said exposure region moves from an inside to an outside of said substrate when a specific shot area on a peripheral portion of said substrate among a plurality of shot areas on said substrate is exposed;

moving said substrate in a predetermined direction during exposure of one of the shot areas on said substrate; and moving said substrate in a direction perpendicular to said predetermined direction so as to expose the next shot area during decelerated movement of said substrate in said predetermined direction, after the exposure of said one shot area is finished.

21. The method according to claim 20, wherein in said specific shot area, a better control accuracy of positional alignment between an exposure surface of said substrate and said image plane of said optical projection system based on said detected positional information is obtainable by moving said substrate so that said exposure region is moved from the inside to the outside, than by moving said substrate so that said exposure region is moved from the outside to the inside.

22. The method according to claim 20, wherein in said specific shot area, if exposure is performed by moving said substrate so that said exposure region is moved from the outside portion toward the inside portion, at least a part of said exposure region is not included in a substantial exposable region on said substrate, at an acceleration start position of said substrate.

23. The method according to claim 20, wherein in said specific shot area, if exposure is performed by moving said substrate so that said exposure region is moved from the outside portion toward the inside portion, at least a part of a detection region for detecting said positional information is not included in a substantial exposable region on said substrate, at an acceleration start position of said substrate.

24. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:

detecting positional information of said substrate in a direction along the optical axis of said optical projection system, during movement of said substrate for said exposure;

adjusting a positional relation between an image plane of said optical projection system and said substrate based on the detected positional information, during said movement of said substrate for said exposure;

moving said substrate so that said exposure region moves from an inside to an outside of said substrate when a specific shot area on a peripheral portion of said substrate among a plurality of shot areas on said substrate is exposed;

moving said substrate in a predetermined direction during exposure of one of the shot areas on said substrate;

moving said substrate in a direction perpendicular to said predetermined direction so as to expose the next shot area, after the exposure of said one shot area is finished; and starting accelerated movement of said substrate in a direction opposite to said predetermined direction to expose said next shot area, during the movement of said substrate in said direction perpendicular to said predetermined direction.

25. The method according to claim 24, wherein in said specific shot area, a better control accuracy of positional alignment between an exposure surface of said substrate and said image plane of said optical projection system based on said detected positional information is obtainable by moving said substrate so that said exposure region is moved from the inside to the outside, than by moving said substrate so that said exposure region is moved from the outside to the inside.

26. The method according to claim 24, wherein in said specific shot area, if exposure is performed by moving said substrate so that said exposure region is moved from the outside portion toward the inside portion, at least a part of said exposure region is not included in a substantial exposable region on said substrate, at an acceleration start position of said substrate.

27. The method according to claim 24, wherein in said specific shot area, if exposure is performed by moving said substrate so that said exposure region is moved from the outside portion toward the inside portion, at least a part of a detection region for detecting said positional information is not included in a substantial exposable region on said substrate, at an acceleration start position of said substrate.

28. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising;
   detecting positional information of said substrate in a direction along the optical axis of said optical projection system, during movement of said substrate for said exposure;
   adjusting a positional relation between an image plane of said optical projection system and said substrate based on the detected positional information, during said movement of said substrate for said exposure; and
   moving said substrate so that said exposure region moves from an inside to an outside of said substrate when a specific shot area on a peripheral portion of said substrate among a plurality of shot areas on said substrate is exposed, wherein the number of said shot areas among the plurality of shot areas on said substrate, which are exposed while moving said substrate in a predetermined direction, is equal to the number of shot areas which are exposed while moving said substrate in a direction opposite to said predetermined direction.

29. The method according to claim 28, wherein in said specific shot area, a better control accuracy of positional alignment between an exposure surface of said substrate and said image plane of said optical projection system based on said detected positional information is obtainable by moving said substrate so that said exposure region is moved from the inside to the outside, than by moving said substrate so that said exposure region is moved from the outside to the inside.

30. The method according to claim 28, wherein in said specific shot area, if exposure is performed by moving said substrate so that said exposure region is moved from the outside portion toward the inside portion, at least a part of said exposure region is not included in a substantial exposable region on said substrate, at an acceleration start position of said substrate.

31. The method according to claim 28, wherein in said specific shot area, if exposure is performed by moving said substrate so that said exposure region is moved from the outside portion toward the inside portion, at least a part of a detection region for detecting said positional information is not included in a substantial exposable region on said substrate, at an acceleration start position of said substrate.

32. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:
   detecting positional information of said substrate in a direction along the optical axis of said optical projection system, during movement of said substrate for said exposure;
   adjusting a positional relation between an image plane of said optical projection system and said substrate based oni the detected positional information, during said movement of said substrate for said exposure;
   moving said substrate so that said exposure region moves from an inside to an outside of said substrate when a specific shot area on a peripheral portion of said substrate among a plurality of shot areas on said substrate is exposed, wherein the number of said shot areas among the plurality of shot areas on said substrate, which are exposed while moving said substrate in a predetermined direction, is greater by one than the number of shot areas which are exposed while moving said substrate in a direction opposite to said predetermined direction.

33. The method according to claim 32, wherein exposure of said plurality of shot areas on said substrate is started from the exposure of one of the shot areas which are exposed while moving said substrate in said predetermined direction.

34. The method according to claim 32, wherein in said specific shot area, a better control accuracy of positional alignment between an exposure surface of said substrate and said image plane of said optical projection system based on said detected positional information is obtainable by moving said substrate so that said exposure region is moved from the inside to the outside, than by moving said substrate so that said exposure region is moved from the outside to the inside.

35. The method according to claim 32, wherein in said specific shot area, if exposure is performed by moving said substrate so that said exposure region is moved from the outside portion toward the inside portion, at least a part of said exposure region is not included in a substantial exposable region on said substrate, at an acceleration start position of said substrate.

36. The method according to claim 32, wherein in said specific shot area, if exposure is performed by moving said substrate so that said exposure region is moved from the outside portion toward the inside portion, at least a part of a detection region for detecting said positional information is not included in a substantial exposable region on said substrate, at an acceleration start position of said substrate.

37. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:
   detecting positional information of said substrate in a direction along the optical axis of said optical projection system, during movement of said substrate for said exposure;
   adjusting a positional relation between an image plane of said optical projection system and said substrate based on the detected position information, during said movement of said substrate for said exposure;
   moving said substrate so that said exposure region moves from an inside to an outside of said substrate when a specific shot area on a peripheral portion of said substrate among a plurality of shot areas on said substrate is exposed, wherein a shot area among the plurality of shot areas on said substrate, which is adjacent to said specific shot area at the inside of said substrate, is exposed while moving said substrate in a direction opposite to the direction of movement of said substrate when said specific shot area is exposed.

38. The method according to claim 37, wherein in said specific shot area, a better control accuracy of positional alignment between an exposure surface of said substrate and said image plane of said optical projection system based on said detected position information is obtainable by moving said substrate so that said exposure region is moved from the inside to the outside, than by moving said substrate so that said exposure region is moved from the outside to the inside.

39. The method according to claim 37, wherein in said specific shot area, if exposure is performed by moving said substrate so that said exposure region is moved from the outside portion toward the inside portion, at least a part of said exposure region is not included in a substantial exposable region on said substrate, at an acceleration start position of said substrate.

40. The method according to claim 37, wherein in said specific shot area, if exposure is performed by moving said substrate so that said exposure region is moved from the outside portion toward the inside portion, at least a part of a detection region for detecting said positional information is not included in a substantial exposable region on said substrate, at an acceleration start position of said substrate.

41. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:
   determining a specific shot area in a peripheral portion on said substrate among a plurality of shot areas of said substrate, which is exposed by moving said substrate so that said exposure region is moved from an inside to the outside of said substrate; and
   determining respectively directions of movement of said substrate when remaining shot areas of said plurality of shot areas are exposed.

42. The method according to claim 41, wherein in said specific shot area, if exposure is performed by moving said substrate so that said exposure region is moved from the outside portion toward the inside portion, at least a part of said exposure region is not included in a substantial exposable region on said substrate, at an acceleration start position of said substrate.

43. The method according claim 41, wherein in said specific shot area, if exposure is performed by moving said substrate so that said exposure region is moved from the outside portion toward the inside portion, at least a part of a detection region for detecting said positional information is not included in a substantial exposable region on said substrate, at an acceleration start position of said substrate.

44. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:
   determining respectively directions of movement of said substrate when a plurality of shot areas on said substrate are exposed on the basis to the position of a plurality of shot areas on said substrate; and
   exposing each of said plurality of shot areas while moving said substrate in said determined direction of movement.

45. The method according to claim 44, wherein the shot areas positioned in the peripheral portion on said substrate among said plurality of shot areas are exposed while moving said substrate so that said exposure region is moved from the inside to the outside of said substrate.

46. An exposure method comprising:
   emitting illumination light; and
   exposing a substrate with the use of a pattern on a mask by moving said substrate relative to an exposure region illuminated by said illumination light which has passed through an optical projection system in synchronization with moving said mask relative to an illumination region illuminated by said illumination light, wherein the number of shot areas which are exposed while moving said substrate in a predetermined direction among a plurality of shot areas on said substrate is greater by one than the number of shot areas which are exposed while moving said substrate in a direction opposite to said predetermined direction.

47. The method according to claim 46, wherein exposure of said plurality of shot areas is started from one of the shot areas which are exposed while moving said substrate in said predetermined direction.

48. An exposure method comprising:
   emitting illumination light; and
   exposing a substrate with the use of a pattern on a mask by moving said substrate relative to an exposure region illuminated by said illumination light which has passed through an optical projection system in synchronization with moving said mask relative to an illumination region illuminated by said illumination light, wherein the direction of movement of said substrate when a shot area among a plurality of shot areas on said substrate is exposed, is determined depending on the distance which is required for acceleration of said substrate for exposure of the shot area.

49. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:
   detecting positional information of said substrate in a direction along said the optical axis of said optical projection system, during movement of said substrate for said exposure; and
   changing over an operation which adjusts the position of a surface of said substrate based on the detected positional information and an operation which does not adjust the position of the surface of said substrate based on the detected positional information, during movement of said substrate for exposure of one shot area on said substrate.

50. The method according to claim 49, wherein said shot area is a shot area in a peripheral portion on said substrate, and a changeover from the operation which does not adjust the position of the surface of said substrate based on the detected positional information to the operation which adjusts the position of the surface of said substrate based on the detected positional information is performed, while said substrate is moving so that said exposure area moves from an outside to an inside of said substrate.

51. The method according to claim 49, wherein said shot area is a shot area in a peripheral portion on said substrate, and a changeover from the operation which adjusts the position of a surface of said substrate based on the detected positional information to the operation which does not adjust the position of the surface of said substrate based on the detected positional information is performed, while said substrate is moving so that said exposure area moves from an inside to an outside of said substrate.

52. The method according to claim 51, wherein after the changeover to an operation which does not adjust the position of the surface of said substrate based on the detected positional information is performed, the position of the surface of said substrate which was set before the changeover is maintained.

53. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:

during movement of said substrate for exposure, adjusting the position of a surface of said substrate based on detected positional information for adjusting a positional relation between an image plane of said optical projection system and said substrate, and setting the position of the surface of said substrate without using detected positional information if it exceeds an allowable range.

54. The method according to claim 53, wherein the position of the surface of said substrate is fixed at the previously set condition when the detected positional information exceeds said allowable range.

55. An exposure method in which a substrate is exposed with the use of a pattern on a mask by moving said substrate relative to an exposure region illuminated by illumination light which has passed through an optical projection system in synchronization with moving said mask relative to an illumination region illuminated by said illumination light, the method comprising:

during movement of said substrate for exposure, detecting positional information of said substrate in the direction along said the optical axis of said optical projection system; and during movement of said substrate for exposure, setting the position of the surface of said substrate without using a detecting point among a plurality of detecting points, which exists in a region unsuitable for exposure on said substrate, when the position of a surface of said substrate is adjusted based on said detected positional information for adjusting a positional relation between an image plane of said optical projection system and said substrate.

56. The exposure method according to claim 46, wherein the shot areas on the substrate are sequentially exposed by alternately moving said substrate in said predetermined direction and in the direction opposite to said predetermined direction.

57. The exposure method according to claim 46, further comprising:

exposing one of the shot areas while moving the substrate in the predetermined direction; and starting stepping movement of the substrate in a direction perpendicular to the predetermined direction, during decelerated movement of the substrate in the predetermined direction.

58. The exposure method according to claim 46, further comprising:

exposing one of the shot areas while moving the substrate in the predetermined direction;

performing stepping movement of the substrate in a direction perpendicular to the predetermined direction after the exposure of the one shot area is finished; and starting accelerated movement of the substrate in the direction opposite to the predetermined direction to expose a next shot area, during the stepping movement of the substrate.

59. The exposure method according to claim 46, further comprising:

during movement of the substrate for exposure of one shot area, changing over an operation which uses an auto-adjustment control and an operation which does not use said auto-adjustment control, wherein said auto-adjustment control includes measurement of positional information of the substrate in a direction along the optical axis of said optical projection system and an adjustment of a surface position of said substrate based on the measured positional information.

60. The exposure method according to claim 46, further comprising:

during movement of the substrate for exposure of one shot area, detecting positional information of said substrate in a direction along the optical axis of said optical projectional system in order to adjust a surface position of the substrate; and during the movement of the substrate for the exposure of the one shot area, adjusting the surface position of the substrate without using the detected positional information if the detected positional information exceeds an allowable range.

61. The exposure method according to claim 46, further comprising:

during movement of the substrate for exposure of one shot area, adjusting a surface position of the substrate based on positional information in a direction along the optical axis of said optical projection system, that is detected with a plurality of detecting points which do not include an unusable detecting point in an unsuitable region.

62. A method for manufacturing a device, said method comprising a lithography step which exposes a plurality of shot areas on a substrate using the method set forth in claim 63.

63. An exposure method in which a substrate is exposed with the use of a pattern of a mask while moving said substrate relative to an exposure region illuminated by illumination light which has passed through a projection system in synchronization with moving said mask relative to an illumination region illumination light, the method comprising:

moving the substrate to expose one of a plurality of shot areas on the substrate; and during the movement of the substrate for the exposure of the one shot area, changing over a first operation which uses an auto-adjustment control and a second operation which does not use said auto-adjustment control, wherein said auto-adjustment control includes measurement of positional information of the substrate ina direction along the optical axis of said projection system and a adjustment of a surface position of said substrate based on the measured positional information.

64. The method according to claim 63, wherein the one shot area is a shot area in a peripheral portion on the substrate, and a changeover from the second operation to the first operation is performed while said substrate is moved so that said exposure area moves from an outside to an inside of the substrate.

65. The method according to claim 63, wherein the one shot area is a shot area in a peripheral portion on the substrate, and a changeover from the first operation to the second operation is performed while said substrate is moved so that said exposure area moves from an inside to an outside of the substrate.

66. The method according to claim 65, wherein after the changeover to the second operation is performed, the surface position of the substrate which was set just before the changeover is maintained.

67. The exposure according to claim 63, wherein the substrate is moved so that said exposure region is moved from an inside to an outside of the substrate when a specific shot area on a peripheral portion of said substrate is exposed, wherein in said specific shot area, a better control accuracy of positional alignment between an exposure surface of the substrate and an image surface of the projection system based on the detected positional information is obtainable by moving said substrate so that said exposure region is moved from the inside to the outside of the substrate, than by moving the substrate so that said exposure region is moved from the outside to inside of the substrate.

68. The exposure method according to claim 63, wherein the plurality of shot areas on the substrate are sequentially exposed by alternately moving said substrate in a predetermined direction and in a direction opposite to said predetermined direction.

69. The exposure method according to claim 63, further comprising:
    exposing one of the plurality of shot areas while moving the substrate in a predetermined direction; and
    starting stepping movement of the substrate in a direction perpendicular to the predetermined direction during decelerated movement of the substrate in the predetermined direction.

70. The exposure method according to claim 63, further comprising:
    exposing one of the plurality of shot areas while moving the substrate in a predetermined direction;
    performin stepping movement of the substrate in a direction perpendicular to the predetermined direction after the exposure of the one shot area is finished; and
    starting accelerated movement of the substrate in a direction opposite to the predetermined direction to expose a next shot area during the stepping movement of the substrate.

71. A method for manufacturing a device, said method comprising a lithography step which exposes a plurality of shot areas on a substrate using the method set forth in claim 63.

72. An exposure method in which a substrate is exposed with the use of a pattern of a mask while moving said substrate relative to an exposure region illuminated by illumination light which has passed through a projection system in synchronization with moving said mask relative to an illumination region illuminated by said illumination light, the method comprising:
    during movement of the substrate for exposure of one of a plurality of shot areas on the substrate, detecting positional information of said substrate in a direction along an optical axis of said projection system in order to adjust a surface position of the substrate; and
    during the movement of the substrate for the exposure of the one shot area, adjusting the surface position of the substrate based on the detected positinal information, wherein the adjustment is performed without using the detected positional information which exceeds an allowable range.

73. The exposure method according to claim 72, wherein the substrate is moved so that said exposure region is moved from an inside to an outside of the substrate when a specific shot area on a peripheral portion of said substrate is exposed, wherein in said specific shot area, a better control accuracy of positional alignment between an exposure surface of the substrate and an image surface of the projection system based on the detected positional information is obtainable by moving said substrate so that said exposure region is moved from the inside to the outside of the substrate, than by moving the substrate so that said exposure region is moved from the outside to inside of the substrate.

74. The exposure method according to claim 72, wherein the plurality of shot areas on the substrate are sequentially exposed by alternately moving said substrate in a predetermined direction and in a direction opposite to said predetermined direction.

75. The exposure method according to claim 72, further comprising:
    exposing one of the plurality of shot areas while moving the substrate in a predetermined direction; and
    starting stepping movement of the substrate in a direction perpendicular to the predetermined direction, during decelerated movement of the substrate in the predetermined direction.

76. The exposure method according to claim 72, further comprising:
    exposing one of the plurality of shot areas while moving the substrate in a predetermined direction;
    performing stepping movement of the substrate in a direction perpendicular to the predetermined direction after the exposure of the one shot area is finished; and
    starting accelerated movement of the substrate in a direction opposite to the predetermined direction to expose a next shot area, during the stepping movement of the substrate.

77. A method for manufacturing a device, said method comprising a lithography step which exposes a plurality of shot areas on a substrate using the method set forth in claim 72.

78. An exposure method in which a substrate is exposed with the use of a pattern of a mask while moving said substrate relative to an exposure region illuminated by illumination light which has passed through a projection system in synchronization with moving said mask relative to an illumination region illuminated by said illumination light, the method comprising:
    during movement of the substrate for exposure, detecting positional information of the substrate in a direction along an optical axis of the projection system by using a detection system which has a plurality of detecting points; and
    during the movement of the substrate for the exposure, adjusting a surface position of the substrate based on the detected positional information, wherein the surface position is adjusted without using an unusable detecting point among the plurality of detecting points which exists outside of a suitable region on the substrate.

79. The exposure method according to claim 78, wherein the substrate is moved so that said exposure region is moved from an inside to an outside of the substrate when a specific shot area on a peripheral portion of said substrate is exposed, wherein in said specific shot area, a better control accurancy of positional alignment between an exposure surface of the substrate and an image surface of the projection system based on the detected positional infomation is obtainable by moving said substrate so that said exposure region is moved from the inside to the outside of the substrate, than by moving the substrate so that said exposure region is moved from the outside to inside of the substrate.

80. The exposure method according to claim 78, wherein a plurality of shot areas on the substrate are sequentially exposed by alternately moving said substrate in a predetermined direction and in a direction opposite to said predetermined direction.

81. The exposure method according to claim 78, further comprising:

exposing one of a plurality of the shot areas while moving the substrate in a predetermined direction; and starting stepping movement of the substrate in a direction perpendicular to the predetermined direction, during decelerated movement of the substrate in the predetermined direction.

82. The exposure method according to claim 78, further comprising:

exposing one of a plurality of the shot areas while moving the substrate in a predetermined direction;

performing stepping movement of the substrate in a direction perpendicular to the predetermined direction after the exposure of the one shot area is finished; and starting accelerated movement of the substrate in a direction opposite to the predetermined direction to expose a next shot area, during the stepping movement of the substrate.

83. A method for manufacturing a device, said method comprising a lithography step which exposes a plurality of shot areas on a substrate using the method set forth in claim 78.

* * * * *